United States Patent
Araki et al.

(10) Patent No.: US 9,690,197 B2
(45) Date of Patent: *Jun. 27, 2017

(54) NEGATIVE-TYPE PHOTOSENSITIVE WHITE COMPOSITION FOR TOUCH PANEL, TOUCH PANEL AND TOUCH PANEL PRODUCTION METHOD

(71) Applicant: TORAY INDUSTRIES, INC., Tokyo (JP)

(72) Inventors: Hitoshi Araki, Otsu (JP); Mitsuhito Suwa, Otsu (JP); Hiroko Mitsui, Otsu (JP); Toru Okazawa, Otsu (JP)

(73) Assignee: TORAY INDUSTRIES, INC., Tokyo (JP)

(*) Notice: Subject to any disclaimer, the term of this patent is extended or adjusted under 35 U.S.C. 154(b) by 0 days.

This patent is subject to a terminal disclaimer.

(21) Appl. No.: 14/907,137

(22) PCT Filed: Jul. 18, 2014

(86) PCT No.: PCT/JP2014/069221
§ 371 (c)(1),
(2) Date: Jan. 22, 2016

(87) PCT Pub. No.: WO2015/012228
PCT Pub. Date: Jan. 29, 2015

(65) Prior Publication Data
US 2016/0161847 A1    Jun. 9, 2016

(30) Foreign Application Priority Data

Jul. 25, 2013  (JP) ................................. 2013-154333

(51) Int. Cl.
*G03F 7/075*    (2006.01)
*G03F 7/027*    (2006.01)
(Continued)

(52) U.S. Cl.
CPC .......... *G03F 7/0757* (2013.01); *G03F 7/0007* (2013.01); *G03F 7/0035* (2013.01);
(Continued)

(58) Field of Classification Search
CPC ........... G06F 3/044; G06F 2203/04103; G06F 2203/0411; G06F 2203/04112;
(Continued)

(56) References Cited

U.S. PATENT DOCUMENTS 5,811,219 A * 9/1998 No .......................... G02B 5/201
430/281.1
2006/0041053 A1* 2/2006 Kamata ................ G03F 7/0007
524/556
(Continued)

FOREIGN PATENT DOCUMENTS

CN    102621811 A  *  8/2012
JP    2004287227        10/2004
(Continued)

OTHER PUBLICATIONS

Computer-generated translation of WO 2013/031753 (Mar. 2013).*
(Continued)

*Primary Examiner* — John A McPherson
(74) *Attorney, Agent, or Firm* — Ratnerprestia

(57) ABSTRACT

The present invention provides a negative-type photosensitive white composition for a touch panel, the composition including: (A) a white pigment; (B) an alkali-soluble resin; (C) a polyfunctional monomer; and (D) a photopolymerization initiator.

16 Claims, 4 Drawing Sheets

(51) Int. Cl.
   *G03F 7/029* (2006.01)
   *G06F 3/044* (2006.01)
   *G03F 7/00* (2006.01)
   *G03F 7/032* (2006.01)
   *G03F 7/033* (2006.01)
   *G03F 7/105* (2006.01)
   *G06F 3/041* (2006.01)

(52) U.S. Cl.
   CPC .............. *G03F 7/027* (2013.01); *G03F 7/029* (2013.01); *G03F 7/032* (2013.01); *G03F 7/033* (2013.01); *G03F 7/0755* (2013.01); *G03F 7/105* (2013.01); *G06F 3/041* (2013.01); *G06F 3/044* (2013.01); *G06F 2203/04103* (2013.01); *G06F 2203/04111* (2013.01); *G06F 2203/04112* (2013.01)

(58) Field of Classification Search
   CPC .......... G03F 7/004; G03F 7/027; G03F 7/029; G03F 7/038; G03F 7/075; G03F 7/031; G03F 7/032; G03F 7/033; G03F 7/105; G03F 7/0751; G03F 7/0757
   USPC ............ 430/280.1, 288.1, 321; 345/173, 174
   See application file for complete search history.

(56) References Cited

U.S. PATENT DOCUMENTS

| | | | |
|---|---|---|---|
| 2006/0229376 | A1 | 10/2006 | Hayashi |
| 2011/0230584 | A1* | 9/2011 | Araki ................. C08F 290/148 522/99 |
| 2012/0098551 | A1 | 4/2012 | Tsukamoto |
| 2012/0170283 | A1 | 7/2012 | Kobayashi |
| 2014/0145973 | A1* | 5/2014 | Jeon ........................ G06F 3/041 345/173 |
| 2014/0176823 | A1 | 6/2014 | Jeon |
| 2014/0375912 | A1 | 12/2014 | Gotoh |
| 2015/0111009 | A1* | 4/2015 | Choi ....................... G03F 7/032 428/194 |
| 2015/0378258 | A1* | 12/2015 | Araki ..................... G03F 7/027 430/18 |

FOREIGN PATENT DOCUMENTS

| | | | |
|---|---|---|---|
| JP | 2008-065319 A | * | 3/2008 |
| JP | 2010276916 | | 12/2010 |
| JP | 2011095716 | | 5/2011 |
| JP | 2012088934 | | 5/2012 |
| JP | 2012098785 | | 5/2012 |
| JP | 2012145699 | | 8/2012 |
| JP | 2012242928 | | 12/2012 |
| JP | 2013152639 | | 8/2013 |
| JP | 2013-218313 | * | 10/2013 |
| JP | 2014123340 | | 7/2014 |
| JP | 2014146283 | | 8/2014 |
| WO | 2011111748 | | 9/2011 |
| WO | WO 2013/031434 A1 | * | 3/2012 |
| WO | 2013031753 | | 3/2013 |
| WO | 2013047553 | | 4/2013 |
| WO | 2013137226 | | 9/2013 |

OTHER PUBLICATIONS

Computer-generated translation of JP 2013-218313 (Oct. 2013).*
Computer-generated translation of CN 1026211811 (Aug. 2012).*
Computer-generated translation of JP 2008-065319 (Mar. 2008).*
International Search Report for International Application No. PCT/JP2014/069221 mailed Oct. 7, 2014.

* cited by examiner

NEGATIVE-TYPE PHOTOSENSITIVE WHITE COMPOSITION FOR TOUCH PANEL, TOUCH PANEL AND TOUCH PANEL PRODUCTION METHOD

CROSS REFERENCE TO RELATED APPLICATIONS

This is the U.S. National Phase application of PCT/JP2014/069221, filed Jul. 18, 2014, which claims priority to Japanese Patent Application No. 2013-154333, filed Jul. 25, 2013, the disclosures of each of these applications being incorporated herein by reference in their entireties for all purposes.

TECHNICAL FIELD OF THE INVENTION

The present invention relates to a negative-type photosensitive white composition, a touch panel and a method for producing a touch panel.

BACKGROUND OF THE INVENTION

In recent years, mobile equipment, such as smartphones and tablet PCs, in which a projection capacitance type touch panel is used, rapidly come into widespread use. In the projection capacitance type touch panel, it is common that a pattern of ITO (indium tin oxide) film is formed in a screen area and a metal wire portion made of molybdenum is formed at the periphery of the screen area. In order to blind the metal wire portion, a black or white light-shielding pattern is often formed on an inner surface of a cover glass of the projection capacitance type touch panel.

A system of a touch panel is broadly divided into an out-cell type in which a touch panel layer is formed between a cover glass and a liquid crystal panel, an on-cell type in which a touch panel layer is formed on a liquid crystal panel, an in-cell type in which a touch panel layer is formed within a liquid crystal panel, and an OGS (one glass solution) type in which a touch panel layer is directly formed on a cover glass, and development of a touch panel of OGS type is increasing since it can be low-profile and its weight can be reduced than conventional out-cell type.

As a terminal equipped with a touch panel is diversified into various kinds, a light-shielding pattern with higher-definition than ever is demanded. A lithography method in which processing with higher resolution is capable is dominating a touch panel production process in place of a conventional printing method.

It is also demanded that a light-shielding pattern is formed in a touch panel of an OGS type by the lithography method (Patent Document 1). For example, a black light-shielding pattern using a photosensitive black light-shielding material (Patent Document 2) is put to practical use.

PATENT DOCUMENTS

Patent Document 1: Japanese Patent Laid-open Publication No. 2012-242928
Patent Document 2: Japanese Patent Laid-open Publication No. 2012-145699

SUMMARY OF THE INVENTION

However, although there are demands not for a black light-shielding pattern, but for a white light-shielding pattern, a photosensitive white composition for a touch panel has not been developed. The reason for this is that since a white pigment contained in the photosensitive white composition is lower in light-shielding properties than a black pigment, thick film processing is required, and therefore the photosensitive white composition is thought to be unsuitable for a normal touch panel process. From such circumstances, a photosensitive white composition for a touch panel, which makes it possible to form, with use of lithography, a light-shielding pattern that has a white color, is a thick film, and has high resolution, high reflectivity and light-shielding properties, and which hardly suffers from defects such as yellowing, peeling, or disconnection in a touch panel production process such as a heat treatment, a chemical treatment or wiring, is demanded.

In order to solve the above-mentioned problem, the present inventors made earnest investigations, and consequently they found out that a negative-type photosensitive white composition for a touch panel comprising (A) a white pigment; (B) an alkali-soluble resin; (C) a polyfunctional monomer; and (D) a photopolymerization initiator is extremely useful for formation of a white light-shielding pattern for a touch panel.

According to the negative-type photosensitive white composition for a touch panel of the present invention, it is possible to form a light-shielding pattern having a higher resolution than that of a conventional printing method on glass even in the case of forming a thick film of 10 μm or more. Further, it is possible to form a white light-shielding pattern of a touch panel in which intensity of reflected light is high and its discoloration is low. Moreover, it is possible to attain a white light-shielding cured film pattern which has an excellent adhesive force, does not cause peeling after chemical treatment at a subsequent step, and is low in coloring due to heating treatment.

DETAILED DESCRIPTION OF EMBODIMENTS OF THE INVENTION

Figure 1:
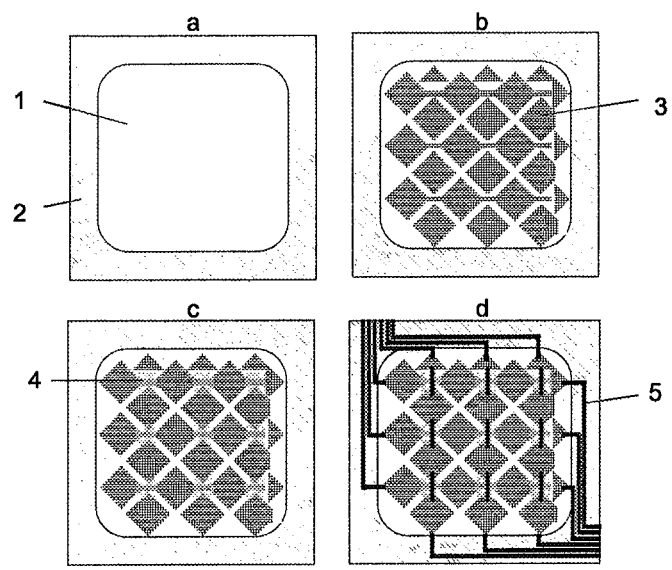
FIG. 1 is a schematic view showing a preparation process of a touch panel substrate prepared in Example 1.

The negative-type photosensitive white composition for a touch panel according to an embodiment of the present invention includes (A) a white pigment; (B) an alkali-soluble resin; (C) a polyfunctional monomer; and (D) a photopolymerization initiator.

The negative-type photosensitive white composition for a touch panel according to an embodiment of the present invention contains (A) a white pigment. Herein, (A) the white pigment refers to an opaque pigment which does not have a specific absorption in a visible region and has a large refractive index. Examples of (A) the white pigment include titanium dioxide, magnesium oxide, barium sulfate, zirconium oxide, zinc oxide and white lead. Titanium dioxide which is excellent in a shielding property and is easily industrially used, is preferred. Titanium dioxide which is surface treated for the purpose of improving dispersibility and suppressing photocatalyst activity, is more preferred.

Examples of a crystal structure of the titanium dioxide include an anatase type, a rutile type and a brookite type. Among these types, the rutile type titanium oxide is preferred since it does not have photocatalyst activity. Moreover, more preferred is titanium dioxide in which the surface of a particle is treated in order to improve dispersibility in the negative-type photosensitive coloring composition and lightfastness and heat resistance of the cured film.

As a surface treating agent, metal oxides and/or hydrates of metal oxides are preferred, and $Al_2O_3$, $SiO_2$ and/or $ZrO_2$ are/is more preferred. In particular, it is preferred to contain $SiO_2$ from the viewpoint of lightfastness and heat resistance. A mass ratio of the surface treating agent in the titanium oxide particles surface treated is preferably 10% by mass or less from the viewpoint of a shielding property. In order to improve color characteristics of a cured film, an average primary particle diameter of the titanium oxide described above is preferably 0.1 to 0.5 μm. The average primary particle diameter is more preferably 0.2 to 0.3 μm. When the average primary particle diameter is less than 0.1 μm, there is a possibility that the shielding property is deteriorated. On the other hand, when the average primary particle diameter is more than 0.5 μm, there is a possibility that a white cured film bears yellow.

An average particle diameter of titanium dioxide being (A) the white pigment is preferably 100 to 500 nm for improving a shielding property. The average particle diameter is more preferably 170 to 310 nm for enhancing a reflection coefficient. The average particle diameter is moreover preferably 350 to 500 nm for enhancing light-shielding properties. Herein, the average particle diameter refers to a median diameter of particle size distribution of measured by a laser diffraction method.

The addition amount of (A) the white pigment is preferably 10 to 80% by mass in a solid content. The addition amount is more preferably 20 to 70% by mass. The addition amount is moreover preferably 30 to 60% by mass. When the amount of (A) the white pigment is less than 10% by mass, a shielding property cannot be adequately achieved depending on a film thickness. On the other hand, when the percentage of the white pigment is more than 80% by mass, a problem that the chemical resistance or patternability of the resulting cured film is deteriorated can arise.

A thickness of the cured film of the negative-type photosensitive white composition for a touch panel of the present invention is preferably 10 μm or more for achieving light-shielding properties. The thickness is more preferably 15 μm or more. The thickness is moreover preferably 20 μm or more. In this case, the crack resistance of the resulting cured film becomes very important. The thickness of the cured film can be measured by a stylus type step profiler such as SURFCOM 1400D (manufactured by TOKYO SEIMITSU CO., LTD.).

The negative-type photosensitive white composition for a touch panel of the present invention may contain a pigment dispersant in order to improve the dispersibility of (A) the white pigment. The pigment dispersant may be appropriately selected depending on a type and surface conditions of the white pigment to be used. The pigment dispersant preferably contains an acid group and/or a basic group. Examples of commercially available pigment dispersants include "Disperbyk-106", "Disperbyk-108", "Disperbyk-110", "Disperbyk-180", "Disperbyk-190", "Disperbyk-2001", "Disperbyk-2155", "Disperbyk-140" and "Disperbyk-145" (all manufactured by BYK Japan KK); and "SN-DISPERSANT 9228" and "SN Sperse 2190" (both, Sanyo Chemical Industries, Ltd.).

The negative-type photosensitive white composition for a touch panel according to an embodiment of the present invention contains (B) an alkali-soluble resin. As (B) the alkali-soluble resin, (b-1) a siloxane resin and/or (b-2) an acrylic resin are/is preferred. When the alkali-soluble resin is (b-1) a siloxane resin and/or (b-2) an acrylic resin, it is possible to attain a white light-shielding cured film which has excellent patternability, high reflection intensity and less discoloration. (b-1) the siloxane resin is preferred from the viewpoint of heat resistance. (b-2) the acrylic resin is preferred from the viewpoint of processability and crack resistance.

As (b-1) the siloxane resin, siloxane resins having a carboxyl group and/or a radical polymerizable group are preferred from the viewpoint of a developing property. Siloxane resins and/or disubstituted siloxane resins having an aromatic ring are preferred from the viewpoint of cracking resistance. Siloxane resins having an oxirane ring are preferred from the viewpoint of chemical resistance. Siloxane resins having a fluorine group are preferred from the viewpoint of reflection intensity.

As a synthesizing method of the siloxane resin, a hydrolytic condensation reaction of an alkoxysilane compound having various functional groups is common.

Examples of the alkoxysilane compound used for synthesizing the siloxane resin having a carboxyl group include 3-trimethoxysilyl propionic acid, 3-triethoxysilyl propionic acid, 3-dimethylmethoxysilyl propionic acid, 3-dimethylethoxysilyl propionic acid, 4-trimethoxysilyl butyric acid, 4-triethoxysilyl butyric acid, 4-dimethylmethoxysilyl butyric acid, 4-dimethylethoxysilyl butyric acid, 5-trimethoxysilyl valeric acid, 5-triethoxysilyl valeric acid, 5-dimethylmethoxysilyl valeric acid, 5-dimethylethoxysilyl valeric acid, 3-trimethoxysilylpropylsuccinic anhydride, 3-triethoxysilylpropylsuccinic anhydride, 3-dimethylmethoxysilylpropylsuccinic anhydride, 3-dimethylethoxysilylpropylsuccinic anhydride, 3-trimethoxysilylpropylcyclohexyl dicarboxylic anhydride, 3-triethoxysilylpropylcyclohexyl dicarboxylic anhydride, 3-dimethylmethoxysilylpropylcyclohexyl dicarboxylic anhydride, 3-dimethylethoxysilylpropylcyclohexyl dicarboxylic anhydride, 3-trimethoxysilylpropylphthalic anhydride, 3-triethoxysilylpropylphthalic anhydride, 3-dimethylmethoxysilylpropylphthalic anhydride, and 3-dimethylethoxysilylpropylphthalic anhydride.

A carboxylic acid equivalent of the siloxane resin having a carboxyl group is preferably 200 to 1400 g/mol in order to have a balance between a film loss and development peeling. Herein, the carboxylic acid equivalent represents a mass of a resin required for obtaining an amount of 1 mole of a carboxyl group, and its unit is g/mol.

Examples of the alkoxysilane compound used for synthesizing the siloxane resin having a radical polymerizable group include vinyltrimethoxysilane, vinyltriethoxysilane, vinylmethyldimethoxysilane, vinylmethyldiethoxysilane, allyltrimethoxysilane, allyltriethoxysilane, allylmethyldimethoxysilane, allylmethyldiethoxysilane, styryltrimethoxysilane, styryltriethoxysilane, styrylmethyldimethoxysilane, styrylmethyldiethoxysilane, γ-acryloylpropyltrimethoxysilane, γ-acryloylpropyltriethoxysilane, γ-methacryloylpropyltrimethoxysilane, γ-methacryloylpropyltriethoxysilane, γ-methacryloylpropylmethyldimethoxysilane, γ-methacryloylpropylmethyldiethoxysilane, γ-acryloylpropylmethyldimethoxysilane and γ-acryloylpropylmethyldiethoxysilane.

A double bond equivalent of the siloxane resin having a radical polymerizable group is preferably 150 to 10000 in order to have a balance between hardness and resolution. Herein, the double bond equivalent represents a mass of a resin required for obtaining an amount of 1 mole of a double bond group, and its unit is g/mol.

Examples of the alkoxysilane compound used for synthesizing the siloxane resin having an aromatic ring include phenyltrimethoxysilane, phenyltriethoxysilane, diphenyldimethoxysilane, diphenyldiethoxysilane, 1-naphthyltrimethoxysilane, 2-naphthyltrimethoxysilane, 2-naphthyltrimethoxysilane, 2-naphthyltrimethoxysilane, tolyltrimethoxysilane, tolyltriethoxysilane, 1-phenylethyltrimethoxysilane, 1-phenylethyltriethoxysilane, 2-phenylethyltrimethoxysilane, 2-phenylethyltriethoxysilane, 3-trimethoxysilylpropylphthalic anhydride, 3-triethoxysilylpropylphthalic anhydride, 3-dimethylmethoxysilylpropylphthalic anhydride, 3-dimethylethoxysilylpropylphthalic anhydride, styryltrimethoxysilane, styryltriethoxysilane, styrylmethyldimethoxysilane, styrylmethyldiethoxysilane and diphenyl silane diol.

Examples of the alkoxysilane compound used for synthesizing the disubstituted siloxane resin include dimethyldimethoxysilane, dimethyldiethoxysilane, ethylmethyldimethoxysilane, ethylmethyldimethoxysilane, methylpropyldimethoxysilane, methylpropyldiethoxysilane, diphenyldimethoxysilane, diphenyldiethoxysilane, cyclohexylmethyldimethoxysilane, cyclohexylmethyldiethoxysilane, 3-dimethylmethoxysilyl propionic acid, 3-dimethylethoxysilyl propionic acid, 4-dimethylmethoxysilyl butyric acid, 4-dimethylethoxysilyl butyric acid, 5-dimethylmethoxysilyl valeric acid, 5-dimethylethoxysilyl valeric acid, 3-dimethylmethoxysilylpropylsuccinic anhydride, 3-dimethylethoxysilylpropylsuccinic anhydride, 3-dimethylmethoxysilylpropylcyclohexyl dicarboxylic anhydride, 3-dimethylethoxysilylpropylcyclohexyl dicarboxylic anhydride, 3-dimethylmethoxysilylpropylphthalic anhydride, 3-dimethylethoxysilylpropylphthalic anhydride, vinylmethyldimethoxysilane, vinylmethyldiethoxysilane, allylmethyldimethoxysilane, allylmethyldiethoxysilane, styrylmethyldimethoxysilane, styrylmethyldiethoxysilane, γ-methacryloylpropylmethyldimethoxysilane, γ-methacryloylpropylmethyldiethoxysilane, γ-acryloylpropylmethyldimethoxysilane, γ-acryloylpropylmethyldiethoxysilane, 3-glycidoxypropylmethyldimethoxysilane, 3-glycidoxypropylmethyldiethoxysilane, 2-(3,4-epoxycyclohexyl)ethylmethyldimethoxysilane, 2-(3,4-epoxycyclohexyl)ethylethyldimethoxysilane and diphenyl silane diol.

Examples of the alkoxysilane compound used for synthesizing the siloxane resin having an oxirane ring include 3-glycidoxypropyltrimethoxysilane, 3-glycidoxypropyltriethoxysilane, 3-glycidoxypropylmethyldimethoxysilane, 3-glycidoxypropylmethyldiethoxysilane, 2-(3,4-epoxycyclohexyl)ethyltrimethoxysilane, 2-(3,4-epoxycyclohexyl)ethyltriethoxysilane, 2-(3,4-epoxycyclohexyl)ethylmethyldimethoxysilane, 2-(3,4-epoxycyclohexyl)ethylethyldimethoxysilane, 3-ethyl-3-{[3-(trimethoxysilyl)propoxy]methyl}oxetane and 3-ethyl-3-{[3-(triethoxysilyl)propoxy]methyl}oxetane.

Examples of the alkoxysilane compound used for synthesizing the siloxane resin having a fluorine group include trifluoropropyltrimethoxysilane, trifluoropropyltriethoxysilane, perfluoropropyltrimethoxysilane, perfluoropropyltriethoxysilane, perfluoropentyltrimethoxysilane, perfluoropentyltriethoxysilane, tridecafluorooctyltrimethoxysilane, tridecafluorooctyltriethoxysilane, tridecafluorooctyltripropoxysilane, tridecafluorooctyltriisopropoxysilane, heptadecafluorodecyltrimethoxysilane, heptadecafluorodecyltriethoxysilane, bis(trifluoromethyl)dimethoxysilane, bis(trifluoropropyl)dimethoxysilane, bis(trifluoropropyl)diethoxysilane, trifluoropropylmethyldimethoxysilane, trifluoropropylmethyldiethoxysilane, trifluoropropylethyldimethoxysilane, trifluoropropylethyldiethoxysilane, and heptadecafluorodecylmethyldimethoxysilane.

Examples of other alkoxysilane compounds used for synthesis of (b-1) the siloxane resin composition include methyltrimethoxysilane, methyltriethoxysilane, ethyltrimethoxysilane, ethyltriethoxysilane, propyltrimethoxysilane, propyltriethoxysilane, isobutyltrimethoxysilane, isobutyltriethoxysilane, cyclohexyltrimethoxysilane, cyclohexyltriethoxysilane, 3-isocyanatepropyltrimethoxysilane, 3-isocyanatepropyltriethoxysilane, 3-aminopropyltrimethoxysilane, 3-aminopropyltriethoxysilane, 3-ureidopropyltrimethoxysilane, 3-ureidopropyltriethoxysilane, tetramethoxysilane, tetraethoxysilane, and silicate 51 (tetraethoxysilane oligomer)trimethylmethoxysilane or triphenylmethoxysilane.

A method of hydrolysis and a condensation reaction of the alkoxysilane compound used for synthesizing (b-1) the siloxane resin will be described below. With respect to conditions of the hydrolysis reaction, for example, it is preferred that an acid catalyst and water were added to an alkoxysilane compound in a solvent over 1 to 180 minutes, and then the resulting mixture is reacted at a temperature of room temperature to 110° C. for 1 to 180 minutes. When the hydrolysis reaction is performed in such conditions, a rapid reaction can be suppressed. A reaction temperature is more preferably 30 to 105° C. The hydrolysis reaction is preferably performed in the presence of the acid catalyst. As the acid catalyst, an acidic aqueous solution containing formic acid, acetic acid or phosphoric acid is preferred. The contents of these acid catalysts are preferably 0.1 to 5 parts by mass with respect to 100 parts by mass of all alkoxysilane compounds to be used during the hydrolysis reaction in order to allow the reaction to adequately proceed. With respect to conditions of the condensation reaction, for example, it is preferred that after a silanol compound is obtained by the hydrolysis reaction of the alkoxysilane compound, a reaction liquid is heated for 1 to 100 hours at a temperature of 50° C. to a boiling point of the solvent or lower as it is. Further, in order to increase a polymerization degree of (b-1) the siloxane resin, the reaction liquid may be reheated or a basic catalyst may be added. Further, after the hydrolysis, produced alcohol is distilled off by heating under a reduced pressure, and then a suitable solvent may be added.

A weight average molecular weight (hereinafter, referred to as "Mw") of (b-1) the siloxane resin is preferably 2000 to 200000 on the polystyrene equivalent basis measured by a GPC in order to make coating properties and solubility in a developer in forming a pattern better, and in order to decrease the viscosity of the negative-type photosensitive white composition to make uniformity of application better, the Mw of (b-1) the siloxane resin is more preferably 4000 to 20000, and moreover preferably 6000 to 10000.

(b-2) the acrylic resin is preferably the acrylic resin containing an aromatic ring from the viewpoint of heat resistance and chemical resistance, and from the viewpoint of patternability and crack resistance, an acrylic resin having a radical polymerizable group in a side chain or an acrylic resin having a branched structure in a main chain is preferred. Herein, the acrylic resin refers to a polymer prepared by polymerizing methacrylic acid, a derivative thereof, acrylic acid or a derivative thereof.

As the acrylic resin having a radical polymerizable group in a side chain, in order to make the patternability better, an acrylic resin which is obtained by subjecting a polymer obtained by copolymerizing (meth)acrylic monomers having a monobasic acid in the presence of a polymerization catalyst (hereinafter, referred to as "base polymer") to an addition reaction with a compound having a radical polymerizable group and an epoxy group in a molecule in the presence of an addition catalyst, is preferred. Herein, the (meth)acrylic monomer refers to methacrylic acid, a derivative thereof, acrylic acid or a derivative thereof.

Examples of the (meth)acrylic monomer containing a monobasic acid used for the synthesis of the base polymer include (meth)acrylic compounds having a carboxyl group and/or an acid anhydride group. Examples of the polymerization catalyst include a radical polymerization initiator. With respect to conditions of the radical polymerization, for example, it is preferred that in a solvent, (meth)acrylic monomers having a monobasic acid, other polymerizable polymers and a radical polymerization catalyst are added, and after the inside of a reaction container is adequately replaced with nitrogen through bubbling or evacuation, the resulting mixture is reacted at 60 to 110° C. for 30 to 300 minutes. Further, a chain transfer agent such as a thiol compound may be used as required.

Examples of the (meth)acrylic monomer containing a monobasic acid used for the synthesis of the base polymer include (meth)acrylic acid, (meth)acrylic anhydride, itaconic acid, itaconic anhydride, mono(2-acryloyloxyethyl) succinate, mono(2-acryloyloxyethyl) phthalate and mono(2-acryloyloxyethyl)tetrahydrophthalate, and (meth)acrylic acid is preferred from the viewpoint of a developing property.

Examples of other polymerizable monomers include methyl(meth)acrylate, ethyl(meth)acrylate, propyl(meth)acrylate, cyclopropyl(meth)acrylate, cyclopentyl(meth)acrylate, cyclohexyl(meth)acrylate, cyclohexenyl(meth)acrylate, 4-methoxycyclohexyl(meth)acrylate, 2-cyclopropyloxycarbonylethyl(meth)acrylate, 2-cyclopentyloxycarbonylethyl(meth)acrylate, 2-cyclohexyloxycarbonylethyl(meth)acrylate, 2-cyclohexenyloxycarbonylethyl(meth)acrylate, 2-(4-methoxycyclohexyl)oxycarbonylethyl(meth)acrylate, norbornyl(meth)acrylate, isobonyl(meth)acrylate, tricyclodecanyl(meth)acrylate, tetracyclodecanyl(meth)acrylate, dicyclopentenyl(meth)acrylate, adamantyl(meth)acrylate, adamantylmethyl(meth)acrylate, 1-methyladamantyl(meth)acrylate, glycidyl(meth)acrylate, α-ethylglycidyl(meth)acrylate, α-n-propylglycidyl(meth)acrylate, α-n-butylglycidyl(meth)acrylate, 3,4-epoxybutyl(meth)acrylate, 3,4-epoxyheptyl(meth)acrylate, α-ethyl-6,7-epoxyheptyl(meth)acrylate and benzyl methacrylate, styrene, p-methylstyrene, o-methylstyrene, m-methylstyrene, α-methylstyrene, p-hydroxystyrene, maleic anhydride, norbornene, norbornene dicarboxylic acid, norbornene dicarboxylic anhydride, cyclohexene, butyl vinyl ether, butyl allyl ether, 2-hydroxyethyl vinyl ether, 2-hydroxyethyl allyl ether, cyclohexane vinyl ether, cyclohexane allyl ether, 4-hydroxybutyl vinyl ether, 4-hydroxybutyl allyl ether, allyl glycidyl ether, vinyl glycidyl ether, o-vinylbenzyl glycidyl ether, m-vinylbenzyl glycidyl ether, p-vinylbenzyl glycidyl ether, α-methyl-o-vinylbenzyl glycidyl ether, α-methyl-m-vinylbenzyl glycidyl ether, α-methyl-p-vinylbenzyl glycidyl ether, 2,3-diglycidyloxymethyl styrene, 2,4-diglycidyloxymethyl styrene, 2,5-diglycidyloxymethyl styrene, 2,6-diglycidyloxymethyl styrene, 2,3,4-triglycidyloxymethyl styrene, 2,3,5-triglycidyloxymethyl styrene, 2,3,6-triglycidyloxymethyl styrene, 3,4,5-triglycidyloxymethyl styrene and 2,4,6-triglycidyloxymethyl styrene.

Isobonyl(meth)acrylate, tricyclodecanyl(meth)acrylate and dicyclopentenyl(meth)acrylate, and styrene are preferred from the viewpoint of heat resistance. Styrene is preferred from the viewpoint of chemical resistance. Methacrylic acid derivatives and styrene derivatives are preferred from the viewpoint of polymerization controllability.

As the radical polymerization initiator, for example, azo compounds such as azobisisobutyronitrile or organic peroxides such as benzoyl peroxide are commonly used.

The acrylic resin having a radical polymerizable group in a side chain is obtained by subjecting the base polymer to an addition reaction with a compound having a radical polymerizable group and an epoxy group in a molecule. With respect to the addition reaction, it is preferred that, for example, a base polymer, a compound having a radical polymerizable group and an epoxy group in a molecule, a radical polymerization catalyst and a polymerization inhibitor are added, and the resulting mixture is reacted at 80 to 130° C. for 30 to 300 minutes in a solvent.

Examples of the addition catalyst to be used for an addition reaction include amino-based catalysts such as dimethylaniline, 2,4,6-tris(dimethylaminomethyl)phenol and dimethylbenzylamine; tin-based catalysts such as tin(II) 2-ethylhexanoate and dibutyltin laurate; titanium-based catalysts such as titanium (IV) 2-ethylhexanoate; phosphorus-based catalysts such as triphenylphosphine; lithium-based catalysts such as lithium naphthenate; zirconium-based catalysts such as zirconium naphthenate; and chromium-based catalysts such as chromium naphthenate, chromium acetylacetonate and chromium chloride. Lithium-based catalysts, zirconium-based catalysts, chromium-based catalysts and phosphorus-based catalysts are preferred for suppressing yellowing of the cured film.

Examples of the compound having a radical polymerizable group and an epoxy group in a molecule include glycidyl(meth)acrylate, α-ethylglycidyl(meth)acrylate, α-n-propylglycidyl(meth)acrylate, α-n-butylglycidyl(meth)acrylate, 3,4-epoxybutyl(meth)acrylate, 3,4-epoxyheptyl(meth)acrylate, α-ethyl-6,7-epoxyheptyl(meth)acrylate, allyl glycidyl ether, vinyl glycidyl ether, o-vinylbenzyl glycidyl ether, m-vinylbenzyl glycidyl ether, p-vinylbenzyl glycidyl ether, α-methyl-o-vinylbenzyl glycidyl ether, α-methyl-m-vinylbenzyl glycidyl ether, α-methyl-p-vinylbenzyl glycidyl ether, 2,3-diglycidyloxymethyl styrene, 2,4-diglycidyloxymethyl styrene, 2,5-diglycidyloxymethyl styrene, 2,6-diglycidyloxymethyl styrene, 2,3,4-triglycidyloxymethyl styrene, 2,3,5-triglycidyloxymethyl styrene, 2,3,6-triglycidyloxymethyl styrene, 3,4,5-triglycidyloxymethyl styrene and 2,4,6-triglycidyloxymethyl styrene. Glycidyl(meth)acrylate, α-ethylglycidyl(meth)acrylate, α-n-propylglycidyl(meth)acrylate and α-n-butylglycidyl(meth)acrylate are preferred from the viewpoint of reactivity with the carboxyl group and from the viewpoint of a developing property of the resulting polymer.

Examples of a method of introducing a branched structure into a main chain of the acrylic resin include a method in which a compound having a plurality of ethylenic unsaturated double bond groups and/or a plurality of thiol groups is used and polymerized. Examples of the compound having a plurality of ethylenic unsaturated double bond groups include glycerol diacrylate, glycerol dimethacrylate, glycerol acrylate methacrylate, glycerol triacrylate, glycerol trimethacrylate, glycerol diacrylate methacrylate, glycerol acrylate dimethacrylate, divinylbenzene, trivinylbenzene, diethylene glycol diacrylate, triethylene glycol diacrylate, trimethylolpropane diacrylate and trimethylolpropane triacrylate.

Examples of the compound having a plurality of thiol groups include pentaerythritol tetrakis(3-mercaptobutyrate), trimethylolethanetris(3-mercaptobutyrate), 1,4-bis(3-mercaptobutylyloxy)butane and 1,3,5-tris(3-melcaptobutyloxethyl)-1,3,5-triazine-2,4,6 (1H,3H, 5H)-trione. An unreacted thiol compound remaining in a solution after completion of polymerization may be removed in a refining step, or when the thiol compound is not removed, it may be used as (E) the thiol compound described later. The remained amount of the thiol compound can be calculated from $^1$H-NMR.

Mw of (b-2) the acrylic resin is preferably 2000 to 200000 on the polystyrene equivalent basis measured by a GPC in order to make coating properties and solubility in a developer in forming a pattern better. In order to decrease the viscosity of the negative-type photosensitive white composition to make uniformity of application better, the Mw of (b-2) the acrylic resin is more preferably 4000 to 20000. The Mw is moreover preferably 6000 to 10000.

Examples of other (B) alkali-soluble resins include cycloolefin polymers, polyimide precursors and polyester resins.

Examples of the cycloolefin polymer include products obtained by subjecting cyclohexene or norbornene or derivatives thereof to addition polymerization or ring-opening metathesis polymerization.

As the polyimide precursor, a resin using an aliphatic carboxylic dianhydride and/or aliphatic diamine as a monomer, is preferred from the viewpoint of transparency.

As the polyester resin, a compound which is obtained by a polyaddition reaction of a polyfunctional epoxy compound and a polycarboxylic acid compound or a polyaddition reaction of a polyol compound and a diacid anhydride, is preferred since its synthesis is easy and a side reaction is less. As the polyol compound, a compound obtained by a reaction of a polyfunctional epoxy compound and a monobasic acid compound having a radical polymerizable group, is preferred since the radical polymerizable group and an aromatic ring are easily introduced.

The negative-type photosensitive white composition for a touch panel according to an embodiment of the present invention contains (C) a polyfunctional monomer. Since (C) the polyfunctional monomer is cured during exposure, solubility in alkali of the exposed portion is lowered and patterning becomes possible. By appropriately selecting (C) the polyfunctional monomer, it is possible to impart various functions. Particularly, it is preferred to contain (C) the polyfunctional monomer having a unit represented by the following general formula (1) and/or the following general formula (2). When the polyfunctional monomer has such a structure, it is possible to develop the pattern with a wide-range concentration of an alkali developer even in the case of forming a thick film of 10 wn or more, and possible to exert excellent cracking resistance. Herein, examples of the alkali developer include a 2.38% by mass aqueous solution of tetramethylammonium hydroxide (TMAH) and a 4% by mass choline aqueous solution which are a high-concentration developer industrially used, and a 0.4% by mass TMAH aqueous solution, a 0.2% by mass TMAH aqueous solution, a 0.045% by mass potassium hydroxide aqueous solution, a 1% by mass sodium hydrogen carbonate aqueous solution, a 0.2% by mass sodium hydrogen carbonate aqueous solution and a 0.1% by mass sodium hydroxide aqueous solution which are a low-concentration developer.

[Chemical Formula 1]

(1)

In the above formula, R$^1$s each independently represent hydrogen, a methyl group, an ethyl group, a propyl group or a phenyl group, and n represents an integer of 1 to 30.

[Chemical Formula 2]

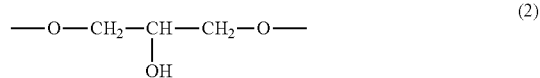

(2)

R$^1$ in the general formula (1) is preferably a hydrogen atom or a methyl group from the viewpoint of solubility in an alkaline developer. A double bond equivalent of (C) the polyfunctional monomer is preferably 800 g/mol or less, more preferably 500 g/mol or less, and moreover preferably 300 g/mol or less from the viewpoint of a curing property during light irradiation.

Examples of the synthesizing method of (C) the polyfunctional monomer having a structure represented by the general formula (1) include a method of reacting a polyol compound, obtained by the reaction of a compound having a plurality of active hydrogens or a halide thereof with various alkylene oxides, with (meth)acrylic acid. Examples of the compound having a plurality of active hydrogens include alcohol compounds such as ethylene glycol, propylene glycol, butylene glycol, glycerin, trimethylolpropane, pentaerythritol, dipentaerythritol, tripentaerythritol and hexanediol; phenolic compounds such as bisphenol A, bisphenol E, bisphenol F, bisphenol S and 9,9-(4-hydroxyphenyl)fluorene; amide compounds such as isocyanuric acid; and thiol compounds such as pentaerythritol tetrakis(3-mercaptobutyrate), trimethylolpropanetris(3-mercaptobutyrate), tris(3-mercaptobutyrate)ethoxyisocyanurate, 1,2-ethanediol and 1,2-propanediol. From the viewpoint of a developing property, aliphatic compounds such as ethylene glycol, propylene glycol, glycerin and trimethylolpropane are preferred. From the viewpoint of cracking resistance, isocyanuric acid is preferred. Examples of the alkylene oxide include ethylene oxide, propylene oxide, and butylene oxide.

Examples of the synthesizing method of (C) the polyfunctional monomer having a structure represented by the general formula (2) include a method of reacting a compound having a plurality of glycidyl ether groups, or a compound having a glycidyl ether group and a radical polymerizable group with (meth)acrylic acid. Examples of the compound having a plurality of glycidyl ether groups include ethylene glycol diglycidyl ether, propylene glycol diglycidyl ether, diethylene glycol diglycidyl ether, dipropylene glycol diglycidyl ether, triethylene glycol diglycidyl ether, tripropylene glycol diglycidyl ether, tetraethylene glycol diglycidyl ether, tetrapropylene glycol diglycidyl ether, polyethylene glycol 200-diglycidyl ether, polyethylene glycol 300-diglycidyl ether, polyethylene glycol 400-diglycidyl ether, bisphenol A diglycidyl ether, bisphenol F diglycidyl ether and bisphenol E diglycidyl ether, and from the viewpoint of a developing property, aliphatic compounds such as ethylene glycol diglycidyl ether, propylene glycol diglycidyl ether, diethylene glycol diglycidyl ether, dipropylene glycol diglycidyl ether, triethylene glycol diglycidyl ether, tripropylene glycol diglycidyl ether, tetraethylene glycol diglycidyl ether and tetrapropylene glycol diglycidyl ether, are preferred. Examples of the compound having a glycidyl ether group and a radical polymerizable group include glycidyl(meth)acrylate, α-ethylglycidyl(meth)acrylate, α-n-propylglycidyl(meth)acrylate, α-n-butylglycidyl (meth)acrylate, vinyl glycidyl ether, o-vinylbenzyl glycidyl ether, m-vinylbenzyl glycidyl ether, p-vinylbenzyl glycidyl ether, α-methyl-o-vinylbenzyl glycidyl ether, α-methyl-m-vinylbenzyl glycidyl ether, α-methyl-p-vinylbenzyl glycidyl ether, 2,3-diglycidyloxymethylstyrene, 2,4-diglycidyloxymethylstyrene, 2,5-diglycidyloxymethylstyrene, 2,6-diglycidyloxymethylstyrene, 2,3,4-triglycidyloxymethylstyrene, 2,3,5-triglycidyloxymethylstyrene, 2,3,6-triglycidyloxymethylstyrene, 3,4,5-triglycidyloxymethylstyrene and 2,4,6-triglycidyloxymethylstyrene.

Examples of (C) the polyfunctional monomer having a structure represented by the general formula (1) and/or (C) the polyfunctional monomer having a structure represented by the general formula (2) include ethylene glycol diglycidyl ether(meth)acrylate, propylene glycol diglycidyl ether (meth)acrylate, diethylene glycol diglycidyl ether(meth) acrylate, dipropylene glycol diglycidyl ether(meth)acrylate, triethylene glycol diglycidyl ether(meth)acrylate, tripropylene glycol diglycidyl ether(meth)acrylate, tetraethylene glycol diglycidyl ether(meth)acrylate, tetrapropylene glycol diglycidyl ether(meth)acrylate, polyethylene glycol 200-diglycidyl ether(meth)acrylate, polyethylene glycol 300-diglycidyl ether(meth)acrylate, polyethylene glycol 400-diglycidyl ether(meth)acrylate, bisphenol A diglycidyl ether (meth)acrylate, ethylene glycol di(meth)acrylate, diethylene glycol di(meth)acrylate, propylene glycol di(meth)acrylate, dipropylene glycol di(meth)acrylate, polyethylene glycol 200-di(meth)acrylate, polyethylene glycol 300-di(meth) acrylate, polyethylene glycol 400-di(meth)acrylate, polyethylene glycol 500-di(meth)acrylate, polyethylene glycol 600-di(meth)acrylate, polyethylene glycol 700-di(meth)acrylate, polyethylene glycol 800-di(meth)acrylate, polyethylene glycol 900-di(meth)acrylate, polyethylene glycol 1000-di (meth)acrylate, trimethylolpropane-EQ-modified tri(meth) acrylate (average number of EO units=3, EO is ethylene oxide), trimethylolpropane-EO-modified tri(meth)acrylate (average number of EQ units=6), trimethylolpropane-EO-modified tri(meth)acrylate (average number of EO units=9), trimethylolpropane-PO-modified tri(meth)acrylate (average number of PO units=3, PO is propylene oxide), trimethylolpropane-PO-modified tri(meth)acrylate (average number of PO units=6), trimethylolpropane-PO-modified tri(meth) acrylate (average number of PO units=9), glycerin-EO-modified tri(meth)acrylate (average number of EO units=3), glycerin-EO-modified tri(meth)acrylate (average number of EO units=6), glycerin-EO-modified tri(meth)acrylate (average number of EO units=9), glycerin-PO-modified tri(meth) acrylate (average number of PO units=3), glycerin-PO-modified tri(meth)acrylate (average number of PO units=6), glycerin-PO-modified tri(meth)acrylate (average number of PO units=9), bisphenol A-EO-modified tri(meth)acrylate (average number of EO units=4), bisphenol A-EO-modified tri(meth)acrylate (average number of EO units=10), bisphenol A-EO-modified tri(meth)acrylate (average number of EO units=30), bisphenol A-PO-modified tri(meth)acrylate (average number of PO units=4), bisphenol A-PO-modified tri(meth)acrylate (average number of PO units=10), bisphenol A-PO-modified tri(meth)acrylate (average number of PO units=30), isocyanuric acid-EO-modified tri(meth)acrylate (average number of EO units=3), isocyanuric acid-EO-modified di(meth)acrylate (average number of EO units=3), isocyanuric acid-PO-modified tri(meth)acrylate (average number of PO units=3), isocyanuric acid-PO-modified di(meth)acrylate (average number of PO units=3), 1,2-ethanedithiol-EO-modified di(meth)acrylate (average number of EO units=4), 1,2-propanedithiol-EO-modified di(meth) acrylate (average number of EO units=4), phthalic anhydride propylene oxide (meth)acrylate, and trimellitic acid diethylene glycol (meth)acrylate.

From the viewpoint of achieving a developing property and photocurability simultaneously, (meth)acrylic acid adducts of ethylene glycol diglycidyl ether, (meth)acrylic acid adducts of propylene glycol diglycidyl ether, (meth) acrylic acid adducts of diethylene glycol diglycidyl ether, (meth)acrylic acid adducts of dipropylene glycol diglycidyl ether, ethylene glycol di(meth)acrylate, diethylene glycol di(meth)acrylate, propylene glycol di(meth)acrylate, polyethylene glycol 200-di(meth)acrylate, polyethylene glycol 300-di(meth)acrylate, polyethylene glycol 400-di(meth) acrylate, trimethylolpropane-EO-modified tri(meth)acrylate (average number of EO units=3) and trimethylolpropane-PO-modified tri(meth)acrylate (average number of PO units=3), are preferred.

From the viewpoint of crack resistance, isocyanuric acid-EO-modified tri(meth)acrylate (average number of EO units=3) and isocyanuric acid-EO-modified di(meth)acrylate (average number of EO units=3) are preferred.

Examples of other (C) polyfunctional monomer include 1,4-butanediol di(meth)acrylate, 1,5-pentanediol di(meth) acrylate, 1,6-hexanediol di(meth)acrylate, 1,9-nonanediol di(meth)acrylate, tricylododecane di(meth)acrylate, pentaerythritol tetra(meth)acrylate, dipentaerythritol hexa(meth)acrylate, dipentaerythritol penta(meth)acrylate, tripentaerythritol hepta(meth)acrylate, tripentaerythritol octa (meth)acrylate, a succinic acid adduct of pentaerythritol tri(meth)acrylate and a succinic acid adduct of dipentaerythritol penta(meth)acrylate.

The content of (C) the polyfunctional monomer is not particularly limited; however, it is preferably 20 to 70% by mass in the solid content from the viewpoint of a developing property, photocurability and heat resistance. When the content is less than 20% by mass, there is a possibility that a crosslinking reaction during exposure does not adequately proceed, and when the content is more than 70% by mass, there is a possibility that film strength after coating (before exposure) is decreased, resulting in a failure on a process.

The negative-type photosensitive white composition for a touch panel according to an embodiment of the present invention contains (D) a photopolymerization initiator. Herein, (D) the photopolymerization initiator refers to a substance which is decomposed and/or reacted by light (including ultraviolet light and electron beams) to produce radicals.

Examples of (D) the photopolymerization initiator include 2-methyl-1-(4-methylthiophenyl)-2-morpholinopropan-1-one, 2-benzyl-2-(dimethylamino)-1-(4-morpholinophenyl)-butan-1-one, 2-(dimethylamino)-2-[(4-methylphenyl)methyl]-1-[4-(4-morpholinophenyl)-1-butan-1-one, 2,4,6-trimethyl benzoyl phenyl phosphine oxide, bis(2,4,6-trimethylbenzoyl)-phenyl phosphine oxide, bis(2,6-dimethoxybenzoyl)-(2,4,4-trimethylpentyl)-phosphine oxide, 1,2-octanedione, 1-[4-(phenylthio)-2-(O-benzoyloxime)], ethanone, 1-[9-ethyl-6-(2-methylbenzoyl)-9H-carbazol-3-yl]-,1-(0-acetyloxime), 2,2-dimethoxy-1,2-diphenylethan-1-one and 1-hydroxy-cyclohexyl-phenyl-ketone.

In order to suppress coloring by the photosensitive agent, acylphosphine oxide-based photopolymerization initiators, such as 2,4,6-trimethylbenzoylphenylphosphine oxide, bis (2,4,6-trimethylbenzoyl)-phenylphosphine oxide and bis(2,6-dimethoxybenzoyl)-(2,4,4-trimethylpentyl)-phosphine oxide, are preferred.

The negative-type photosensitive white composition for a touch panel of the present invention preferably contains (E) a thiol compound. Containing (E) the thiol compound makes a taper shape of a pattern edge mild. Further, adhesion to glass is improved and development peeling can be suppressed. Moreover, resistance to chemical treatment at a subsequent step can be improved. The addition amount of (E) the thiol compound is preferably 0.3 to 20 parts by mass, more preferably 0.5 to 15 parts by mass, more preferably 1 to 10 parts by mass, and moreover 2 to 8 parts by mass with respect to 100 parts by mass of a total of (B) the alkali-soluble resin and (C) the polyfunctional monomer. When the addition amount of (E) the thiol compound is less than 0.3 parts by mass, there is a fear that control of development peeling and a pattern edge shape is difficult. When the addition amount is more than 20 parts by mass, there are fears that defective development at the time of patterning easily occurs, odor peculiar to the thiol compound becomes strong during exposure to light, and the cured film turns yellow.

As (E) the thiol compound, a polyfunctional thiol is preferred from the viewpoint of suppressing development peeling. In the case of a monofunctional thiol, it is preferred to contain a reactive functional group in a molecule. The monofunctional thiol containing a reactive functional group in a molecule can function substantially as a polyfunctional thiol by reacting the reactive functional group during a pre-baking step because of having the reactive functional group. Examples of the reactive functional group include an isocyanate group, an alkoxysilyl group, a methylol group, a (meth)acryloyl group, an epoxy group, an oxetanyl group, a furyl group and a vinyl group. The number of the functional groups in a molecule of the polyfunctional thiol compound is preferably 2 to 8, and more preferably 3 to 6.

As (E) the thiol compound, an ester compound formed between a polyhydric alcohol compound and a carboxylic acid compound containing a secondary or tertiary mercapto group is preferred from the viewpoint of storage stability of the composition. The resulting compounds are all polyfunctional thiols.

Examples of the polyhydric alcohol compound include alkylene glycol (the number of carbon atoms of the alkylene group is 2 to 10 and the alkylene group may be branched), diethylene glycol, dipropylene glycol, glycerin, trimethylolpropane, tris(2-hydroxyethyl)isocyanurate, pentaerythritol and dipentaerythritol. Examples of the carboxylic acid compound containing a secondary or tertiary mercapto group include 2-mercaptopropionic acid, 3-mercaptobutanoic acid, 2-mercaptoisobutanoic acid, 4-mercaptopentanoic acid and 3-mercaptopentanoic acid.

Examples of these polyfunctional thiols include pentaerythritol tetrakis(2-mercaptopropionate), trimethylolpropanetris(2-mercaptopropionate), trimethylolethanetris(2-mercaptopropionate), glycerintris(2-mercaptopropionate), tris(2-mercaptopropyryloxyethyl)isocyanurate, ethyleneglycol bis(2-mercaptopropionate), 1,2-propyleneglycol (2-mercaptopropionate), 1,4-butyleneglycol (2-mercaptopropionate), diethylene glycol bis(2-mercaptopropionate), dipropylene glycol bis(2-mercaptopropionate), pentaerythritol tetrakis(3-mercaptobutyrate), trimethylolpropanetris(3-mercaptobutyrate), trimethylolethanetris(3-mercaptobutyrate), glycerintris(3-mercaptobutyrate), tris(3-mercaptobutyryoxyethyl)isocyanurate, ethyleneglycol bis(3-mercaptobutyrate), 1,2-propyleneglycol (3-mercaptobutyrate), 1,4-butyleneglycol (3-mercaptobutyrate), diethylene glycol bis(3-mercaptobutyrate), dipropylene glycol bis(3-mercaptobutyrate), pentaerythritol tetrakis (2-mercaptoisobutyrate), trimethylolpropanetris(2-mercaptoisobutyrate), trimethylolethanetris(2-mercaptoisobutyrate), glycerin tris(2-mercaptoisobutyrate), tris(2-mercaptoisobutyryloxyethyl)isocyanurate, ethyleneglycol bis(2-mercaptoisobutyrate), 1,2-propyleneglycol bis(2-mercaptoisobutyrate), trimethylolpropanetris(2-mercaptoisobutyrate), 1,2-propyleneglycol (2-mercaptoisobutyrate), 1,4-butyleneglycol (2-mercaptoisobutyrate), diethylene glycol bis(2-mercaptoisobutyrate) and dipropylene glycol bis(2-mercaptoisobutyrate).

Because of an excellent balance among odor, storage stability and reactivity, pentaerythritol tetrakis(3-mercaptobutyrate), trimethylolpropanetris(3-mercaptobutyrate), trimethylolethanetris(3-mercaptobutyrate), glycerintris(3-mercaptobutyrate), and tris(3-mercaptobutyryloxyethyl) isocyanurate are preferred.

Examples of other thiol compounds include polyfunctional thiol compounds such as 1,4-butanedithiol, 1,5-pentanedithiol, 1,6-hexanedithiol, 1,9-nonanedithiol, pentaerythritol tetrakis(3-mercaptopropionate), trimethylolpropanetris(3-mercaptopropionate), trimethylolethanetris(3-mercaptopropionate), glycerintris(3-mercaptopropionate), tris(3-mercaptopropionate)ethoxy isocyanurate, ethyleneglycol bis(3-mercaptopropionate), 1,2-propylene glycol (3-mercaptopropionate), 1,4-butylene glycol (3-mercaptopropionate), diethylene glycol bis(3-mercaptopropionate) and dipropylene glycol bis(3-mercaptopropionate); and monofunctional thiol compounds containing a reactive functional group such as 3-mercaptopropionic acid and 3-mercaptopropyl trimethoxysilane.

The negative-type photosensitive white composition for a touch panel of the present invention may contain (F) an antioxidant. When (F) the antioxidant is contained, yellowing after heating treatment being a subsequent step is inhibited. As the antioxidant, a hindered phenol-based antioxidant or a hindered amine-based antioxidant which has a Mw of 300 or more is preferred because of its excellent effect of suppressing discoloration of the cured film. When these antioxidants have the Mw of less than 300, sometimes, these antioxidants are sublimated during thermal curing and do not achieve an adequate antioxidant effect. Further, the number of phenol groups or amino groups in a molecule is preferably 2 or more, and more preferably 4 or more since they easily achieve the antioxidant effect.

Examples of the hindered phenol-based antioxidant include octadecyl 3-(3,5-di-t-butyl-4-hydroxyphenyl)propionate, hexamethylenebis[3(3,5-di-t-butyl-4-hydroxyphenyl propionate, thiodiethylenebis[3(3,5-di-t-butyl-4-hydroxyphenyl propionate, ethylenebis(oxyethylene)bis(3-(5-t-butyl-4-hydroxy-m-tolyl)propionate, tris-(3,5-di-t-butyl-4-hydroxybenzyl)isocyanurate, 1,3,5-trimethyl-2,4,6-tris(3,5-di-t-butyl-4-hydroxybenzyl)benz ene, pentaerythritol tetrakis (3-(3,5-di-t-butyl-4-hydroxyphenyl)propionate, 2-t-butyl-6-(3-t-butyl-2-hydroxy-5-methylbenzyl)-4-methylphenyl acrylate, 2-[1-(2-hydroxy 3,5-di-t-pentylphenyl)ethyl]-4,6-di-t-pentylphenyl acrylate, 2,2'-methylenebis(6-t-butyl-4-methylphenol and 4,4'-butylidenebis(6-t-butyl-3-methylphenol).

Examples of the hindered amine compound include bis (1,2,2,6,6-pentamethyl-4-piperidyl) [[3,5-bis(1,1-dimethylethyl)-4-hydroxyphenyl]methyl]butylmalonate, bis(1,2,2,6,6-pentamethyl-4-piperidyl) sebacate, methyl-1,2,2,6,6-pentamethyl-4-piperidyl sebacate, 1,2,2,6,6-pentamethyl-4-piperidyl methacrylate, 2,2,6,6-tetramethyl-4-piperidyl methacrylate, reaction products between bis-(2,2,6,6-tetramethyl-1-(octyloxy)-4-piperidinyl) sebacate, 1,1-dimethylethyl hydroperoxide and octane, tetrakis(1,2,2,6,6-pentamethyl-4-pyridyl)butane-1,2,3,4-tetracarboxylate and tetrakis(2,2,6,6-tetramethyl-4-pyridyl)butane-1,2,3,4-tetracarboxylate.

The addition amount of (F) the antioxidant is preferably 0.2 to 4.0 parts by mass, and more preferably 0.3 to 2.0 parts by mass with respect to 100 parts by mass of a total of (B) the alkali-soluble resin and (C) the polyfunctional monomer. When the addition amount of (F) the antioxidant is less than 0.3 parts by mass, the effect of suppressing discoloration is hardly achieved, and when the addition amount is more than 4.0 parts by mass, there is a fear that curing of an exposed portion is interfered to fail in patterning.

The negative-type photosensitive white composition for a touch panel of the present invention may contain (G) the silane coupling agent represented by the general formula (3).

[Chemical Formula 3]

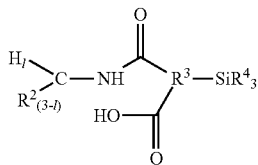

(3)

(in which R²s each independently represent an alkyl group having 1 to 6 carbon atoms or a substituted group thereof, l represents 0 or 1, R³ represents a trivalent organic group having 3 to 30 carbon atoms, and R⁴s each independently represent an alkyl group having 1 to 6 carbon atoms, an alkoxy group having 1 to 6 carbon atoms, a phenyl group or a phenoxy group, or substituted groups thereof.)

When the negative-type photosensitive white composition according to an embodiment of the present invention contains (G) the silane coupling agent represented by the general formula (3), adhesiveness of the cured film with the substrate and chemical resistance to alkali or acid to which the cured film is subjected at a subsequent step are further improved. R² in the general formula (3) is preferably a methyl group, an ethyl group or a butyl group, and more preferably a methyl group or an ethyl group from the viewpoint of raw material availability. R³ in the general formula (3) is preferably an alkyl group, and more preferably an alkyl group having 3 to 10 carbon atoms from the viewpoint of solubility in an organic solvent.

Examples of (G) the silane coupling agent represented by the general formula (3) include 3-(tert-butylcarbamoyl)-6-(trimethoxysilyl)hexanoic acid, 2-(2-(tert-butylamino)-2-oxoethyl)-5-(trimethoxysilyl)pentanoic acid, 3-(isopropylcarbamoyl)-6-(trimethoxysilyl)hexanoic acid, 2-[2-(isopropylamino)-2-oxoethyl]-5-(trimethoxysilyl)pentanoic acid, 3-(isobutylcarbamoyl)-6-(trimethoxysilyl)hexanoic acid, 3-(tert-pentylcarbamoyl)-6-(trimethoxysilyl)hexanoic acid, 2-(2-(tert-pentylamino)-2-oxoethyl)-5-(trimethoxysilyl)pentanoic acid, 3-(tert-butylcarbamoyl)-6-(triethoxysilyl)hexanoic acid, 2-(2-(tert-butylamino)-2-oxoethyl)-5-(triethoxysilyl)pentanoic acid, 6-(dimethoxy(methyl)silyl)-3-(tert-butylcarbamoyl)hexanoic acid, 5-(dimethoxy(methyl)silyl)-2-(2-(tert-butylamino)-2-oxoethyl]pentanoic acid, 3-(tert-butylcarbamoyl)-6-(trimethoxysilyl)pentanoic acid, 2-[2-(tert-butylamino)-2-oxoethyl]-5-(trimethoxysilyl)butanoic acid, 2-(tert-butylcarbamoyl)-4-(2-(trimethoxysilyl)ethyl)cyclohexane hexane carboxylic acid, and 2-(tert-butylcarbamoyl)-5-(2-(trimethoxysilyl)ethyl)cyclohexane hexane carboxylic acid.

Because of improvement of adhesion to glass and chemical resistance, preferred are 3-(tert-butylcarbamoyl)-6-(trimethoxysilyl)hexanoic acid, 2-(2-(tert-butylamino)-2-oxoethyl)-5-(trimethoxysilyl)pentanoic acid, 3-(isopropylcarbamoyl)-6-(trimethoxysilyl)hexanoic acid, 3-(tert-pentylcarbamoyl)-6-(trimethoxysilyl)hexanoic acid, 2-(2-(tert-pentylamino)-2-oxoethyl)-5-(trimethoxysilyl) pentanoic acid, 3-(tert-butylcarbamoyl)-6-(triethoxysilyl) hexanoic acid, 2-(2-(tert-butylamino)-2-oxoethyl)-5-(triethoxysilyl)pentanoic acid, 6-(dimethoxy(methyl)silyl)-3-(tert-butylcarbamoyl)hexanoic acid, 5-(dimethoxy(methyl)silyl-2-(2-(tert-butylamino)-2-oxoethyl)pentanoic acid, 3-(tert-butylcarbamoyl)-6-(trimethoxysilyl)pentanoic acid, 2-(2-(tert-butylamino)-2-oxoethyl)-5-(trimethoxysilyl)butanoic acid, 2-(tert-butylcarbamoyl)-4-(2-(trimethoxysilyl) ethyl)cyclohexane hexanecarboxylic acid, and 2-(tert-butylcarbamoyl)-5-(2-(trimethoxysilyl)ethyl)cyclohexane hexanecarboxylic acid.

The negative-type photosensitive white composition for a touch panel of the present invention may contain (H) a ultraviolet absorber. When the negative-type photosensitive white composition according to an embodiment of the present invention contains (H) the ultraviolet absorber, resolution is improved and lightfastness of the resulting cured film is improved. (H) the ultraviolet absorber is preferably a benzotriazole-based compound, a benzophenone-based compound and a triazine-based compound from the viewpoint of transparency and non-stainability.

Examples of the benzotriazole-based compound include 2-(2H-benzotriazol-2-yl)phenol, 2-(2H-benzotriazol-2-yl)-4,6-tert-pentylphenol, 2-(2H-benzotriazol-2-yl)-4-(1,1,3,3-tetramethylbutyl)phenol, 2(2H-benzotriazol-2-yl)-6-dodecyl-4-methylphenol and 2-(2'-hydroxy-5'-methacryloxyethylphenyl)-2H-benzotriazole. Examples of the ultraviolet absorber made of a benzophenone-based compound include 2-hydroxy-4-methoxybenzophenone. Examples of the ultraviolet absorber made of a triazine-based compound include 2-(4,6-diphenyl-1,3,5-triazin-2-yl)-5-[(hexyl)oxy]-phenol.

The negative-type photosensitive white composition for a touch panel of the present invention may contain (I) a coloring agent to such an extent that whiteness is not impaired. By containing (I) the coloring agent, a white cured film showing various hues such as yellow hue, red hue and blue hue can be achieved. To the contrary, it becomes possible to shift a white cured film tinging to a white point. Examples of (I) the coloring agent include dyes, organic pigments and inorganic pigments. Particularly, inorganic pigments are preferred from the viewpoint of heat resistance.

Examples of the organic pigment include yellow organic pigments such as Pigment Yellow-12, 13, 17, 20, 24, 83, 86, 93, 95, 109, 110, 117, 125, 129, 137, 138, 139, 147, 148, 150, 153, 154, 166, 168 and 185; orange organic pigments such as Pigment Orange-13, 36, 38, 43, 51, 55, 59, 61, 64, 65 and 71; red organic pigments such as Pigment Red-9, 48, 97, 122, 123, 144, 149, 166, 168, 177, 179, 180, 192, 209, 215, 216, 217, 220, 223, 224, 226, 227, 228, 240 and 254; violet organic pigments such as Pigment Violet-19, 23, 29, 30, 32, 37, 40 and 50; blue organic pigments such as Pigment Blue-15, 15:3, 15:4, 15:6, 22, 60 and 64; green organic pigments such as Pigment Green-7, 10 and 36; and black organic pigments such as carbon black, perylene black and aniline black (the numerical values each indicate a color index (CI) number).

Pigment Blue 15:3, Pigment Blue 15:4, Pigment Blue 15:6, Pigment Green 7, Pigment Green 36 and carbon black are preferred from the viewpoint of general versatility and heat resistance. These organic pigments may be subjected to surface treatment such as rosin treatment, acid group treatment or basic treatment, as required. The addition amount of the organic pigment is preferably 50 to 5000 ppm from the viewpoint of whiteness.

Examples of the inorganic pigment include metal fine particles, metal oxides, composite oxides, metal sulfides, metal nitrides and metal acid nitride, such as iron oxide, cadmium sulfide, titanium nickel antimony, titanium nickel barium, strontium chromate, viridian, chromium oxide, cobalt (II) aluminate and titanium nitride. These inorganic pigments may be surface treated with another inorganic component or organic component. The inorganic pigments are preferably surface treated with another inorganic component from the viewpoint of heat resistance. The addition amount of the inorganic pigment is preferably 50 to 5000 ppm (mass ratio) with respect to a solid content from the viewpoint of whiteness.

Examples of the dye include red dyes, blue dyes, yellow dyes and green dyes which are obtained from anthraquinone-based, perynone-based, perylene-based, disazo-based, quinoline-based, methine-based, monoazo-based, xanthene-based or phthalocyanine-based compounds. Examples of the red dyes include Solvent RED 8, 52, 111, 135, 168, 179, 207, 218 and 246 (the numerical values each indicate a color index (CI) number; the same hereinafter). Solvent RED 179 and Solvent RED 218 are preferred from the viewpoint of heat resistance. Examples of the blue dyes include Solvent BLUE 35, 36, 44, 63, 78, 94 and 97. Examples of the yellow dyes include Solvent YELLOW 16, 33, 88 and 93. Examples of the green dyes include Solvent GREEN 3 and 20. The addition amount of the dye is preferably 5 to 500 ppm (mass ratio) with respect to a solid content from the viewpoint of whiteness.

The negative-type photosensitive white composition for a touch panel of the present invention may contain an organic solvent. The organic solvent is preferably an alcoholic compound, an ester-based compound or an ether-based compound in order to dissolve the respective components of the composition uniformly. The ester-based compounds and the ether-based compounds are more preferred from the viewpoint of dispersibility of a pigment. Further, compounds having a boiling point of 110 to 250° C. under atmospheric pressure are preferred. Since the negative-type photosensitive white composition for a touch panel of the present invention is thought to be applied by a printing method such as spin coating, slit coating, screen printing, ink-jet printing, gravure printing or bar coating, when the composition has a boiling point lower than 110° C., a drying speed of the organic solvent is fast and defective uniformity of application easily occurs. On the other hand, when the boiling point is higher than 250° C., the organic solvent remains in the resulting cured film, resulting in deterioration of heat resistance of the cured film.

Examples of the organic solvent include propylene glycol monomethyl ether, propylene glycol monomethyl ether acetate, diacetone alcohol, tetrahydrofurfuryl alcohol, ethylene glycol mono-n-butyl ether, 2-ethoxyethyl acetate, 1-methoxypropyl-2-acetate, 3-methoxy-3-methylbutanol, 3-methoxy-3-methylbutanol acetate, 3-methoxybutyl acetate, 1,3-butylene glycol diacetate, ethylene glycol monobutyl ether acetate, diethylene glycol monobutyl ether acetate, ethyl lactate, butyl lactate, ethyl acetoacetate and γ-butyrolactone.

A concentration of a solid content of the negative-type photosensitive white composition for a touch panel of the present invention is preferably 40% by mass or more, and more preferably 50% by mass or more, because of ease of processing of a film thickness. Further, the concentration is preferably 75% by mass or less, and more preferably 65% by mass or less from the viewpoint of viscosity control.

The viscosity of the negative-type photosensitive white composition for a touch panel of the present invention is preferably 15 cP or less, and more preferably 10 cP or less since it is easy to control applying of the negative-type photosensitive white composition with a slit coater. Examples of a measurement method of viscosity include a capillary rheometer, a falling ball viscometer and a rotary viscometer, and the rotary viscometer which is capable of measuring with high accuracy is preferred. Examples of the rotary viscometer include a single cylinder type rotary (B type) viscometer and a cone-plate type (E type) viscometer, and the cone-plate type viscometer which is capable of measuring with high accuracy at low viscosity is preferred. Examples of a technique of adjusting the viscosity to 15 cP or less in the concentration of a solid content of 40 to 75% by mass include a method in which an addition amount of (B) the alkali-soluble resin is set to 20% by mass or less of the solid content. Further, even when an addition amount of (B) the alkali-soluble resin is more than 20% by mass of the solid content, it is possible to achieve adjustment of the viscosity to 15 cP or less by setting Mw of (B) the alkali-soluble resin to 20000 or less.

The negative-type photosensitive white composition for a touch panel of the present invention may contain a surfactant in order to improve coating properties of the white composition. Examples of the surfactant include fluorochemical surfactants, silicone-based surfactants, polyalkylene oxide-based surfactants and poly(meth)acrylate-based surfactants.

An embodiment of a method for producing the negative-type photosensitive white composition for a touch panel according to an embodiment of the present invention will be described below. First, a mixed solution of (A) a white pigment, (B) an alkali-soluble resin and an organic solvent is dispersed with use of a mill-type disperser loaded with zirconia beads to obtain a pigment dispersion. On the other hand, (B) an alkali-soluble resin, (C) a polyfunctional monomer, (D) a photopolymerization initiator, an organic solvent and other additives are dissolved by stirring to prepare a diluting liquid. Then, the dispersion and the diluting liquid are mixed and stirred, and the resulting mixture is filtrated to obtain a negative-type photosensitive white composition.

A method of forming a cured film obtained by curing the negative-type photosensitive white composition for a touch panel of the present invention will be described with reference to examples.

First, the negative-type photosensitive white composition for a touch panel is applied onto an underlying substrate by spin coating, slit coating, screen printing, ink-jet printing, bar coating or the like, and the substrate is pre-baked at a temperature of 60 to 150° C. for 30 seconds to 3 minutes with use of a heating device such as a hot plate, an oven or the like. A film thickness after pre-baking is preferably 10 to 30 μm.

After pre-baking the film, the film is irradiated with light having exposure intensity of about 10 to 4000 J/m² (converted to an exposure amount at a wavelength of 365 nm) through or not through a desired mask to be exposed to the light using an exposure machine such as a stepper, a mirror projection mask aligner (MPA), or a parallel light mask aligner (hereinafter, referred to as "PLA"). Examples of an exposure light source include ultraviolet light such as i-ray, g-ray or h-ray, KrF (wavelength: 248 nm) laser and ArF (wavelength: 193 nm) laser or the like.

A negative-type pattern can be obtained by dissolving an exposed portion by development after the exposure. As a development method, a method, in which the exposed photosensitive composition is immersed in a developer for 5 seconds to 10 minutes by a method such as showering, dipping or paddling, is preferred. Examples of the developer include aqueous solutions of inorganic alkalis such as hydroxides, carbonates, phosphates, silicates and borates of alkali metals; amines such as 2-diethylaminoethanol, monoethanolamine and diethanolamine; and quaternary ammonium salts such as tetramethylammonium hydroxide (TMAH) and choline. After the development, the developed film is preferably rinsed with water, and subsequently may be dry-baked at a temperature of 50 to 140° C.

The developed film is heated at a temperature of 120 to 250° C. for 15 minutes to 2 hours with use of a heating device such as a hot plate, an oven or the like, and thereby, a white light-shielding cured film is prepared.

A cured film formed by curing the negative-type photosensitive white composition for a touch panel of the present invention is suitably used as a light-shielding pattern of a touch panel of an OGS type. An OD (optical density) value of the light-shielding pattern is preferably 0.6 or more, and more preferably 0.7 or more. With respect to total reflection (incident angle: 8°, light source: D-65 (field of view 2°)) of the light-shielding pattern, in a CIE 1976 (L*, a*, b*) color space, it is preferred to satisfy 70≤L*≤99, −5≤b*≤5, and −5≤a*≤5, and it is more preferred to satisfy 80≤L*≤99, −2≤b*≤2, and −2≤a*≤2. A film thickness of the cured film is not particularly limited, however, it is preferably 10 μm or more in order to satisfy the above-mentioned characteristics.

A touch panel including a white light-shielding cured film can be produced by undergoing a step of forming a white light-shielding cured film pattern by using the negative-type photosensitive white composition for a touch panel of the present invention. As the production method of the touch panel, a method in which after formation of the white light-shielding cured film pattern, a transparent electrode, an insulating film and a metal wire are formed, is common, and a protective film may be formed as required.

Examples of a method of forming the transparent electrode include a method in which a film of ITO is deposited by a sputtering method, and then the ITO film undergoes a photoresist step, an etching step and a peeling step, and is subjected to a patterning process.

Examples of a method of forming the metal wire include a method in which a film of copper or MAM (molybdenum-aluminum-molybdenum laminated film) is formed by being vapor-deposited or deposited by a sputtering method, and then the resulting film undergoes a photoresist step, an etching step and a peeling step, and is subjected to a patterning process. Further, examples of the method of forming a metal wire also include a method of forming a metal wire by printing a silver paste or by a lithography method.

As the insulating film and the protective film, a material which is excellent in transparency and insulating properties is preferred. Examples of such a material include a transparent inorganic film or a transparent resin film. Examples of a method of forming the transparent inorganic film include a method of forming a thin film composed of silicon oxide or silicon nitride by a CVD (chemical vapor deposition) method. Examples of a method of forming the transparent resin film include a method according to lithography method using a negative-type or positive-type photosensitive transparent resin composition.

Examples of the negative-type photosensitive transparent resin composition include a composition containing an alkali-soluble resin, a polyfunctional monomer and a photopolymerization initiator. An additive may be added as required.

Examples of the positive-type photosensitive transparent resin composition include a composition containing an alkali-soluble resin and a quinone diazide compound. An additive may be added as required. As the quinone diazide compound, a compound having a phenolic hydroxyl group bonded to naphthoquinonediazidesulfonic acid through ester linkage is preferred. The compound having a phenolic hydroxyl group bonded to naphthoquinonediazidesulfonic acid through ester linkage can be prepared by initiating an esterification reaction between a compound having a phenolic hydroxyl group and naphthoquinonediazidesulfonic acid chloride by a publicly known method.

Examples of the compound having a phenolic hydroxyl group include the following compounds (trade name, manufactured by Honshu Chemical Industry Co., Ltd).

[Chemical Formula 4]

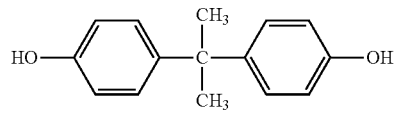

Bisphenol A

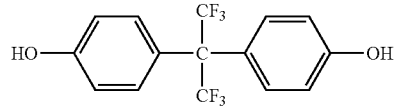

BisP-AF

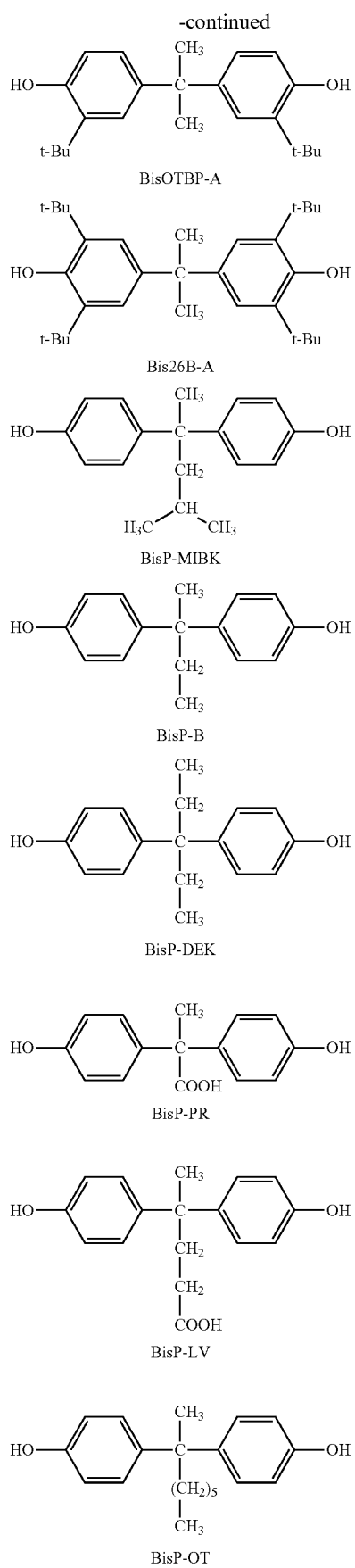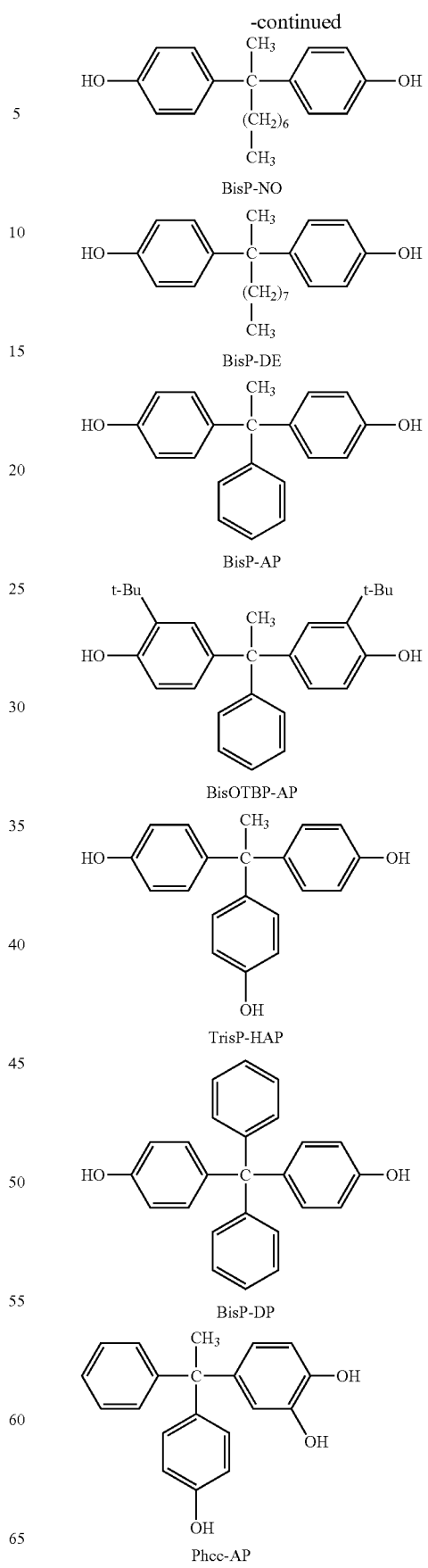

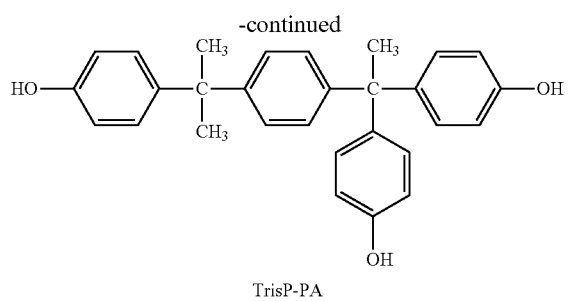

TrisP-PA

Examples of the naphthoquinonediazidesulfonic acid include 4-naphthoquinonediazidesulfonic acid and 5-naphthoquinonediazidesulfonic acid. The 4-naphthoquinonediazidesulfonic acid ester compound is suitable for i-line exposure since it has absorption in the i-line (wavelength: 365 nm) region. Further, the 5-naphthoquinonediazidesulfonic acid ester compound is suitable for exposure in a wide-range wavelength since it has absorption in the wide-range wavelength region. It is preferred to select either one of the 4-naphthoquinonediazidesulfonic acid ester compound or the 5-naphthoquinonediazidesulfonic acid ester compound according to a wavelength of exposure light. In addition, a mixture of the 4-naphthoquinonediazidesulfonic acid ester compound and the 5-naphthoquinonediazidesulfonic acid ester compound may be used.

A molecular weight of the naphthoquinonediazide compound is preferably 300 to 1500, and more preferably 350 to 1200. When the molecular weight of the naphthoquinonediazide compound is more than 1500, there is a possibility that a pattern cannot be formed by an addition amount of 4 to 10% by mass. On the other hand, when the molecular weight is less than 300, there is a possibility that a colorless and transparent property is deteriorated.

The step of forming a white light-shielding cured film by using the negative-type photosensitive white composition for a touch panel of the present invention may be repeated multiple times. When a cured film having a thickness smaller than a target thickness is laminated to form a light-shielding cured film, it is possible to achieve high resolution and a low taper simultaneously at a high level. A pattern line width and a film thickness are not particularly limited, however, it is preferred because of ease of control of a taper shape that when the step of forming a white light-shielding cured film pattern is repeated n times, an nth layer (n is an integer of 2 or more) has a wider line width and a smaller thickness than those of a (n−1)th layer.

The step of forming a white light-shielding cured film by using the negative-type photosensitive white composition for a touch panel of the present invention can also be combined with a printing step of using a non-photosensitive white ink composition. Particularly, it is preferred to use a non-photosensitive white ink composition which uses a siloxane resin and has high heat resistance. In addition to the above-mentioned preferred siloxane resins, examples of siloxane resins as a commercially available product include silicone resins such as "804 RESIN", "805 RESIN", "806 RESIN", "806A RESIN", "840 RESIN" and "SR-2400" (all manufactured by Dow Corning Toray Co., Ltd.), and "KR-282", "KR-311" and "KR-211" (manufactured by Shin-Etsu Chemical Co., Ltd.). Examples of a constitution of the combination with the printing step include a constitution in which the negative-type photosensitive white composition for a touch panel of the present invention is used and formed into a thin film on a required area and then a pattern slightly smaller than the area is thickly formed on a top face of the area by printing. Also, examples of a constitution of the combination include a constitution in which patterns are formed around a screen area and a fine pattern area using the negative-type photosensitive white composition, and then other required areas are processed. This makes it possible to achieve excellent patternability (high resolution, high linearity, and the like) and whiteness simultaneously.

A black light-shielding cured film may be formed above the white light-shielding cured film formed by using the negative-type photosensitive white composition for a touch panel of the present invention. By forming the black light-shielding cured film, the OD value is improved, and further visibility of a metal wire to be formed thereon can be decreased. As a method of forming a black light-shielding cured film, for example, a lithography method using a photosensitive black resin composition is preferred from the viewpoint of resolution.

Examples of the photosensitive black resin composition include a composition containing a black pigment, an alkali-soluble resin, a polyfunctional monomer and a photopolymerization initiator. An additive may be added as required. Examples of the black pigment include carbon black and titanium nitride.

A transparent film may be formed above the white light-shielding cured film formed by using the negative-type photosensitive white composition for a touch panel of the present invention. By forming the transparent film, resistance of the light-shielding pattern to heat treatment and chemical treatment at a subsequent step, and a good-quality rate of the resulting touch panel are improved. The transparent film may be formed on the entire substrate, or may be formed only above the light-shielding pattern. In addition, the above-mentioned black light-shielding cured film may be further formed above the transparent film. The transparent film can be formed, for example, by the same material and processing method as in those of the above-mentioned insulating film and protective film.

A color adjustment layer may be formed above and/or below the white light-shielding cured film formed by using the negative-type photosensitive white composition for a touch panel of the present invention. By forming the color adjustment layer, it is possible to impart various hues such as yellow hue, red hue and blue hue to the appearance from a backside of the white pattern. When the color adjustment layer is formed below the white light-shielding cured film, in the CIE 1976 (L*, a*, b*) color space of transmitted light (light source: D-65 (field of view 2°) of the color adjustment layer, it is preferred to satisfy 70≤L*≤99, −5≤b*≤5, and −5≤a*≤5, respectively. When the color adjustment layer is formed above the white light-shielding cured film, with respect to total reflection (incident angle: 8°, light source: D-65 (field of view 2°) of the color adjustment layer, it is preferred to satisfy 10≤L*≤70, −50≤b*≤50, and −50≤a*≤50, respectively. When the black light-shielding cured film is formed, it is preferred to dispose the color adjustment layer below the black light-shielding cured film. When the color adjustment layer is formed above the black light-shielding cured film, there is a possibility that a color adjusting function is deteriorated. As a method of forming a color adjustment color adjustment layer, for example, a lithography method using a photosensitive coloring resin composition is preferred from the viewpoint of resolution.

Examples of the photosensitive coloring resin composition include a composition containing a coloring agent, an alkali-soluble resin, a polyfunctional monomer and a photopolymerization initiator, and an additive may be added as required. Examples of the coloring agent include dyes described above, organic pigments and inorganic pigments. The content of the coloring agent is preferably 5% by mass to 40% by mass of the whole solid portion in the case of forming a color adjustment layer above the white light-shielding cured film and preferably 0.0005 to 1% by mass of the whole solid portion in the case of forming a color adjustment layer beneath the white light-shielding cured film since the above-mentioned optical characteristics are easily satisfied.

EXAMPLES

Hereinafter, embodiments of the present invention will be described in more detail with reference to synthesis examples, preparation examples, examples and comparative examples.

Synthesis Example 1 Synthesis of Siloxane Resin Solution (B1)

Into a 500 mL three-necked flask, 47.7 g (0.35 mol) of methyltrimethoxysilane (hereinafter, abbreviated as "MTMS"), 99.2 g (0.5 mol) of phenyltrimethoxysilane (hereinafter, abbreviated as "PTMS"), 39.4 g (0.15 mol) of 3-trimethoxysilylpropylsuccinic acid (hereinafter, abbreviated as "SuTMS") and 152.3 g of propylene glycol methyl ether acetate (hereinafter, abbreviated as "PGMEA") were charged, the flask was immersed in an oil bath of 40° C., and an aqueous phosphoric acid solution having 0.372 g (0.2% by mass with respect to the amount of charged monomers) of phosphoric acid dissolved in 56.7 g of water was added over 10 minutes by use of a dropping funnel while stirring the solution. The resulting mixture was stirred at 40° C. for 1 hour, and then stirred for 1 hour with an oil bath temperature set at 70° C., and furthermore the oil bath temperature was risen to 115° C. over 30 minutes. An internal temperature of the solution reached 100° C. after a lapse of one hour from the start of temperature rising, and then the solution was heated and stirred for 2 hour (internal temperature was 100 to 110° C.). Methanol being a byproduct and water were distilled off with use of a Liebig condenser during the reaction. To the resulting PGMEA solution of polysiloxane, PGMEA was added so that a concentration of a polymer is 40% by mass to prepare a siloxane resin solution (B1). In addition, Mw of the resulting polymer was measured by GPC, and consequently the Mw was 6000 (on the polystyrene equivalent basis).

Synthesis Examples 2 to 7

Alkoxysilane compounds were charged in proportions of monomer ratios shown in Table 1 to prepare siloxane resin solutions (B2) to (B7). When a monomer unit structure in the polymer main chain is taken as a unit, the monomer ratio becomes a unit ratio directly.

TABLE 1

| | Siloxane Resin Solution | Monomer (mole ratio) | | | | | | | | |
|---|---|---|---|---|---|---|---|---|---|---|
| | | MTMS | PTMS | SuTMS | AcTMS | EpTMS | DMDMS | DPDMS | FTMS | Mw |
| Synthesis Example 1 | B1 | 35 | 50 | 15 | — | — | — | — | — | 6000 |
| Synthesis Example 2 | B2 | 35 | 30 | 10 | 35 | — | — | — | — | 4000 |
| Synthesis Example 3 | B3 | 35 | — | 15 | 40 | — | — | — | — | 4500 |
| Synthesis Example 4 | B4 | — | — | 10 | 35 | — | 35 | 20 | — | 2000 |
| Synthesis Example 5 | B5 | — | — | 10 | 35 | 5 | 30 | 20 | — | 2000 |
| Synthesis Example 6 | B6 | — | — | 15 | 40 | — | — | — | 35 | 4000 |
| Synthesis Example 7 | B7 | 20 | 40 | — | 40 | — | — | — | — | 5000 |

The respective components are as follows.
 AcTMS: Acryloyloxypropyltrimethoxysilane
 EpTMS: 2,3-epoxycyclohexylethyltrimethoxysilane
 DMDMS: Dimethyldimethoxysilane
 DPDMS: Diphenyldimethoxysilane
 FTMS: Trifluoropropyltrimethoxysilane

Synthesis Example 8 Synthesis of Acrylic Resin Solution (B-8)

Into a 500 mL flask, 2 g of 2,2'-azobis(isobutyronitrile) (hereinafter, abbreviated as "AIBN") and 50 g of PGMEA were charged. Thereafter, 26.5 g (0.31 mol) of methacrylic acid ("MA" in Table), 21.3 g (0.21 mol) of styrene ("St" in Table) and 37.7 g (0.15 mol) of tricyclo[5.2.1.0$^{2,6}$]decane-8-yl methacrylate (hereinafter, abbreviated as "TCDMA") were charged, the resulting mixture was stirred at room temperature for some time, and the inside of the flask was adequately replaced with nitrogen by nitrogen bubbling, and then the mixture was heated and stirred at 70° C. for 5 hours. Next, to the resulting solution, 14.6 g (0.09 mol) of glycidyl methacrylate (hereinafter, abbreviated as "GMA"), 1 g of chromium (III) acetylacetonate (hereinafter, abbreviated as "Cr(AcAc)$_3$"), 0.2 g of p-methoxyphenol and 100 g of PGMEA were added, and the resulting mixture was heated and stirred at 90° C. for 4 hours. After completion of the reaction, to the resulting solution, PGMEA was added so that a concentration of a solid content is 40% by mass to prepare an acrylic resin solution (B8) (Mw is 15000 (on the polystyrene equivalent basis)).

In order to leave the methacrylic group derived from the GMA in the side chain of a polymer, first, a polymer including a MA unit was polymerized, and then the epoxy group of the GMA was reacted with the carboxylic acid derived from the MA unit. A unit formed by reacting the MA unit with the GMA is denoted by "MA-GMA" in Table.

Synthesis Example 9 Synthesis of Acrylic Resin Solution (B9)

An acrylic resin solution (B9) was prepared in the same manner as in Synthesis Example 1 except for using dimethylbenzylamine as the catalyst to be used for an addition reaction (Mw is 15000 (on the polystyrene equivalent basis)).

Synthesis Example 10 Synthesis of Acrylic Resin Solution (B10)

An acrylic resin solution (B10) was prepared in the same manner as in Synthesis Example 1 except for changing the addition amount of AIBN to 1 g (Mw is 30000 (on the polystyrene equivalent basis)).

Synthesis Example 11 Synthesis of Acrylic Resin Solution (B11)

An acrylic resin solution (B11) was prepared in the same manner as in Synthesis Example 1 except for changing the addition amount of AIBN to 4 g (Mw is 8000 (on the polystyrene equivalent basis)).

Synthesis Example 12 Synthesis of Acrylic Resin Solution (B12)

Into a 500 mL flask, 2 g of AIBN and 50 g of PGMEA were charged. Thereafter, 23.1 g (0.27 mol) of methacrylic acid ("MA" in Table), 31.5 g (0.18 mol) of benzylmethacrylate ("BzMA" in Table) and 32.8 g (0.15 mol) of TCDMA were charged, the resulting mixture was stirred at room temperature for some time, and the inside of the flask was adequately replaced with nitrogen by nitrogen bubbling, and then the mixture was heated and stirred at 70° C. for 5 hours. Next, to the resulting solution, 12.7 g (0.09 mol) of GMA, 1 g of Cr(AcAc)$_3$, 0.2 g of p-methoxyphenol and 100 g of PGMEA were added, and the resulting mixture was heated and stirred at 90° C. for 4 hours. After completion of the reaction, to the resulting solution, PGMEA was added so that a concentration of a solid content is 40% by mass to prepare an acrylic resin solution (B11) (Mw is 15000 (on the polystyrene equivalent basis))

Synthesis Example 13 Synthesis of Acrylic Resin Solution (B13)

Into a 500 mL flask, 2 g of AIBN and 50 g of PGMEA were charged. Thereafter, 29.4 g (0.3 mol) of methacrylic acid ("MA" in Table), 26.7 g (0.26 mol) of styrene ("St" in Table) and 25.7 g (0.26 mol) of methyl methacrylate ("MMA" in Table) were charged, the resulting mixture was stirred at room temperature for some time, and the inside of the flask was adequately replaced with nitrogen by nitrogen bubbling, and then the mixture was heated and stirred at 70° C. for 5 hours. Next, to the resulting solution, 18.2 g (0.13 mol) of GMA, 1 g of Cr(AcAc)$_3$, 0.2 g of p-methoxyphenol and 100 g of PGMEA were added, and the resulting mixture was heated and stirred at 90° C. for 4 hours. After completion of the reaction, to the resulting solution, PGMEA was added so that a concentration of a solid content is 40% by mass to prepare an acrylic resin solution (B13) (Mw is 15000 (on the polystyrene equivalent basis)).

Synthesis Example 14 Synthesis of Acrylic Resin Solution (B14)

Into a 500 mL flask, 4 g of AIBN and 150 g of PGMEA were charged. Thereafter, 44.1 g (0.51 mol) of methacrylic acid ("MA" in Table) and 34.2 g (0.85 mol) of methyl methacrylate ("MMA" in Table) were charged, the resulting mixture was stirred at room temperature for some time, and the inside of the flask was adequately replaced with nitrogen by nitrogen bubbling, and then the mixture was heated and stirred at 70° C. for 5 hours. Next, to the resulting solution, 36.4 g (0.26 mol) of GMA, 2 g of Cr(AcAc)$_3$, 0.2 g of p-methoxyphenol and 100 g of PGMEA were added, and the resulting mixture was heated and stirred at 90° C. for 4 hours. After completion of the reaction, to the resulting solution, PGMEA was added so that a concentration of a solid content is 40% by mass to prepare an acrylic resin solution (B14) (Mw is 20000 (on the polystyrene equivalent basis)).

Synthesis Example 15 Synthesis of Acrylic Resin Solution (B15)

Into a 500 mL flask, 2 g of AIBN and 150 g of PGMEA were charged. Thereafter, 17.6 g (0.21 mol) of methacrylic acid ("MA" in Table), 21.3 g (0.21 mol) of styrene ("St" in Table) and 37.7 g (0.17 mol) of TCDMA, and 23.4 g (0.10 mol) of glycerol dimethacrylate (hereinafter, abbreviated as "GCDMA") were charged, the resulting mixture was stirred at room temperature for some time, and the inside of the flask was adequately replaced with nitrogen by nitrogen bubbling, and then the mixture was heated and stirred at 70°

C. for 5 hours. After completion of the reaction, to the resulting solution, PGMEA was added so that a concentration of a solid content is 40% by mass to prepare an acrylic resin solution (B15) (Mw is 9000 (on the polystyrene equivalent basis)).

Synthesis Example 16 Synthesis of Acrylic Resin Solution (B16)

Into a 500 mL flask, 4 g of AIBN and 150 g of PGMEA were charged. Thereafter, 16.9 g (0.20 mol) of methacrylic acid ("MA" in Table), 28.5 g (0.27 mol) of styrene ("St" in Table) and 26.8 g (0.12 mol) of GCDMA, and 27.8 g (0.20 mol) of GMA were charged, the resulting mixture was stirred at room temperature for some time, and the inside of the flask was adequately replaced with nitrogen by nitrogen bubbling, and then the mixture was heated and stirred at 70° C. for 5 hours. After completion of the reaction, to the resulting solution, PGMEA was added so that a concentration of a solid content is 40% by mass to prepare an acrylic resin solution (B16) (Mw is 9000 (on the polystyrene equivalent basis)). Since the addition catalyst for the epoxy group and carboxylic acid was not added, the epoxy group of GMA did not react with carboxylic acid derived from the MA unit and GMA unit was produced.

Unit ratios or the like of the resulting acrylic resin solutions (B8) to (B16) are shown in Table 2.

formic acid aqueous solution in order to remove the addition catalyst, and the separated reaction solution was dried with magnesium sulfate and condensed by a rotary evaporator so that a concentration of a solid content is 40% by mass to obtain a polyester resin (B17) (Mw is 5000).

Synthesis Example 18 Synthesis of Silane Coupling Agent (G1)

To 200 g of PGMEA, 41.97 g (160 mmol) of 3-trimethoxysilylpropylsuccinic anhydride and 11.70 g (160 mmol) of t-butylamine were added, the resulting mixture was stirred at room temperature for some time and then stirred at 40° C. for 2 hours. Thereafter, the mixture was heated up to 80° C. and reacted for 6 hours. The resulting solution was diluted with PGMEA so that its solid content concentration is 20% by mass to obtain a mixed solution (G1) of 3-(tert-butylcarbamoyl)-6-(trimethoxysilyl)hexanoic acid and 2-(2-(tert-butylamino)-2-oxoethyl)-5-(trimethoxysilyl)pentanoic acid.

Preparation Example 1 Preparation of Negative-Type Photosensitive White Composition (W-1)

After 21.00 g of white pigment, namely, a titanium dioxide pigment (CR-97; manufactured by ISHIHARA SANGYO KAISHA, LTD.), 13.13 g of the siloxane resin

TABLE 2

| | Acrylic Resin Solution | BzMA | St | MA | MA-GMA | TCDMA | MMA | GCDMA | GMA | Addition Catalyst | Mw |
|---|---|---|---|---|---|---|---|---|---|---|---|
| Synthesis Example 8 | B8 | — | 30 | 30 | 15 | 25 | — | — | — | Cr(AcAc)$_3$ | 15000 |
| Synthesis Example 9 | B9 | — | 30 | 30 | 15 | 25 | — | — | — | dimethyl benzyl amine | 15000 |
| Synthesis Example 10 | B10 | — | 30 | 30 | 15 | 25 | — | — | — | Cr(AcAc)$_3$ | 30000 |
| Synthesis Example 11 | B11 | — | 30 | 30 | 15 | 25 | — | — | — | Cr(AcAc)$_3$ | 8000 |
| Synthesis Example 12 | B12 | 30 | — | 30 | 15 | 25 | — | — | — | Cr(AcAc)$_3$ | 15000 |
| Synthesis Example 13 | B13 | — | 30 | 25 | 15 | — | 30 | — | — | Cr(AcAc)$_3$ | 15000 |
| Synthesis Example 14 | B14 | — | — | 30 | 30 | — | 40 | — | — | Cr(AcAc)$_3$ | 20000 |
| Synthesis Example 15 | B15 | — | 30 | 30 | — | 25 | 15 | — | — | | 9000 |
| Synthesis Example 16 | B16 | — | 35 | 25 | — | — | — | 15 | 25 | — | 9000 |

Synthesis Example 17 Synthesis of Acrylic Resin Solution (B17)

148 g of 1,1-bis(4-(2,3-epoxypropyloxy)phenyl)-3-phenylindan, 47 g of acrylic acid, 1 g of tetrabutylammonium acetate (hereinafter, abbreviated as "TBAA"), 2.0 g of tert-butylcatechol and 244 g of PGMEA were charged, and the resulting mixture was stirred at 120° C. for 5 hours. After the mixture was cooled to room temperature, 71 g of biphenyltetracarboxylic dianhydride and 1 g of TBAA were added, and the resulting mixture was stirred at 110° C. for 3 hours. After the mixture was cooled to room temperature, 9 g of tetrahydrophthalic anhydride was added, and the resulting mixture was stirred at 120° C. for 5 hours. After completion of the reaction, 500 g of PGMEA was added, the reaction solution was separated by extraction with a 1N solution (B1) and 0.87 g of PGMEA were mixed, the resulting mixture was dispersed with use of a mill-type disperser loaded with zirconia beads to obtain a pigment dispersion (MW-1). A median diameter of the obtained mill base was measured by a laser diffraction method, and consequently the median diameter was 260 nm.

Then, 12.25 g of the pigment dispersion (MW-1), 4.60 g of the acrylic resin solution (B1), 3.23 g of dipentaerythritol hexaacrylate ("DPHA" in Table), 0.29 g of bis(2,4,6-trimethylbenzoyl)-phenylphosphine oxide (IRGACURE 819; manufactured by BASF CORPORATION) ("IC-819" in Table), and 9.18 g of PGMEA were stirred and mixed to form a negative-type photosensitive white composition (W-1). Using this composition, patternability, a pattern shape, color characteristics, adhesiveness and chemical resistance were evaluated.

Preparation Examples 2 to 102 Preparation of Negative-Type Photosensitive White Composition (W-2) to (W-102)

Negative-type photosensitive white compositions were prepared in the same manner as in Preparation Example 1 in ratios shown in Table 3, Table 4, Table 5 and Table 6.

TABLE 3

| | Negative-Type Photosensitive White Composition | (A) Name | Parts by Mass | (B) Name | Parts by Mass | (C) Name | Parts by Mass | (D) Name | Parts by Mass | (E) Name | Parts by Mass |
|---|---|---|---|---|---|---|---|---|---|---|---|
| Preparation Example 1 | W-1 | CR-97 | 50 | B1 | 25 | IC-819 | 3 | DPHA | 25 | — | — |
| Preparation Example 2 | W-2 | CR-97 | 50 | B2 | 25 | IC-819 | 3 | DPHA | 25 | — | — |
| Preparation Example 3 | W-3 | CR-97 | 50 | B3 | 25 | IC-819 | 3 | DPHA | 25 | — | — |
| Preparation Example 4 | W-4 | CR-97 | 50 | B4 | 25 | IC-819 | 3 | DPHA | 25 | — | — |
| Preparation Example 5 | W-5 | CR-97 | 50 | B5 | 25 | IC-819 | 3 | DPHA | 25 | — | — |
| Preparation Example 6 | W-6 | CR-97 | 50 | B6 | 25 | IC-819 | 3 | DPHA | 25 | — | — |
| Preparation Example 7 | W-7 | CR-97 | 50 | B1 B7 | 25 | IC-819 | 3 | DPHA | 25 | — | — |
| Preparation Example 8 | W-8 | CR-97 | 50 | B8 | 25 | IC-819 | 3 | DPHA | 25 | — | — |
| Preparation Example 9 | W-9 | CR-97 | 50 | B9 | 25 | IC-819 | 3 | DPHA | 25 | — | — |
| Preparation Example 10 | W-10 | CR-97 | 50 | B10 | 25 | IC-819 | 3 | DPHA | 25 | — | — |
| Preparation Example 11 | W-11 | CR-97 | 50 | B11 | 25 | IC-819 | 3 | DPHA | 25 | — | — |
| Preparation Example 12 | W-12 | CR-97 | 50 | B12 | 25 | IC-819 | 3 | DPHA | 25 | — | — |
| Preparation Example 13 | W-13 | CR-97 | 50 | B13 | 25 | IC-819 | 3 | DPHA | 25 | — | — |
| Preparation Example 14 | W-14 | CR-97 | 50 | B14 | 25 | IC-819 | 3 | DPHA | 25 | — | — |
| Preparation Example 15 | W-15 | CR-97 | 50 | B15 | 25 | IC-819 | 3 | DPHA | 25 | — | — |
| Preparation Example 16 | W-16 | CR-97 | 50 | B16 | 25 | IC-819 | 3 | DPHA | 25 | — | — |
| Preparation Example 17 | W-17 | CR-97 | 50 | B17 | 25 | IC-819 | 3 | DPHA | 25 | — | — |
| Preparation Example 18 | W-18 | JR-605 | 50 | B2 | 25 | IC-819 | 3 | DPHA | 25 | — | — |
| Preparation Example 19 | W-19 | JR-605 | 50 | B8 | 25 | IC-819 | 3 | DPHA | 25 | — | — |
| Preparation Example 20 | W-20 | R960 | 50 | B2 | 25 | IC-819 | 3 | DPHA | 25 | — | — |
| Preparation Example 21 | W-21 | R960 | 50 | B8 | 25 | IC-819 | 3 | DPHA | 25 | — | — |
| Preparation Example 22 | W-22 | CR-97 | 50 | B1 | 25 | IC-819 | 3 | DPHA | 22 | MT-PE1 | 3 |
| Preparation Example 23 | W-23 | CR-97 | 50 | B2 | 25 | IC-819 | 3 | DPHA | 22 | MT-PE1 | 3 |
| Preparation Example 24 | W-24 | CR-97 | 50 | B3 | 25 | IC-819 | 3 | DPHA | 22 | MT-PE1 | 3 |
| Preparation Example 25 | W-25 | CR-97 | 50 | B4 | 25 | IC-819 | 3 | DPHA | 22 | MT-PE1 | 3 |
| Preparation Example 26 | W-26 | CR-97 | 50 | B5 | 25 | IC-819 | 3 | DPHA | 22 | MT-PE1 | 3 |
| Preparation Example 27 | W-27 | CR-97 | 50 | B6 | 25 | IC-819 | 3 | DPHA | 22 | MT-PE1 | 3 |
| Preparation Example 28 | W-28 | CR-97 | 50 | B1 B7 | 25 | IC-819 | 3 | DPHA | 25 | MT-PE1 | 3 |
| Preparation Example 29 | W-29 | CR-97 | 50 | B8 | 25 | IC-819 | 3 | DPHA | 22 | MT-PE1 | 3 |
| Preparation Example 30 | W-30 | CR-97 | 50 | B8 | 25 | IC-819 | 3 | DPHA | 22 | MT-BD1 | 3 |
| Preparation Example 31 | W-31 | CR-97 | 50 | B8 | 25 | IC-819 | 3 | DPHA | 22 | MT-NR1 | 3 |
| Preparation Example 32 | W-32 | CR-97 | 50 | B8 | 25 | IC-819 | 3 | DPHA | 22 | TPMB | 3 |
| Preparation Example 33 | W-33 | CR-97 | 50 | B8 | 25 | IC-819 | 3 | DPHA | 22 | TEMB | 3 |
| Preparation Example 34 | W-34 | CR-97 | 50 | B8 | 25 | IC-819 | 3 | DPHA | 22 | PEMP | 3 |
| Preparation Example 35 | W-35 | CR-97 | 50 | B9 | 25 | IC-819 | 3 | DPHA | 22 | MT-PE1 | 3 |
| Preparation Example 36 | W-36 | CR-97 | 50 | B10 | 25 | IC-819 | 3 | DPHA | 22 | MT-PE1 | 3 |
| Preparation Example 37 | W-37 | CR-97 | 50 | B11 | 25 | IC-819 | 3 | DPHA | 22 | MT-PE1 | 3 |
| Preparation Example 38 | W-38 | CR-97 | 50 | B12 | 25 | IC-819 | 3 | DPHA | 22 | MT-PE1 | 3 |
| Preparation Example 39 | W-39 | CR-97 | 50 | B13 | 25 | IC-819 | 3 | DPHA | 22 | MT-PE1 | 3 |
| Preparation Example 40 | W-40 | CR-97 | 50 | B14 | 25 | IC-819 | 3 | DPHA | 22 | MT-PE1 | 3 |

TABLE 4

| | Negative-Type Photosensitive White Composition | (A) Name | Parts by Mass | (B) Name | Parts by Mass | (C) Name | Parts by Mass | (D) Name | Parts by Mass | (E) Name | Parts by Mass | (F) Name | Parts by Mass |
|---|---|---|---|---|---|---|---|---|---|---|---|---|---|
| Preparation Example 41 | W-41 | CR-97 | 50 | B15 | 25 | IC-819 | 3 | DPHA | 22 | MT-PE1 | 3 | — | — |
| Preparation Example 42 | W-42 | CR-97 | 50 | B16 | 25 | IC-819 | 3 | DPHA | 22 | MT-PE1 | 3 | — | — |
| Preparation Example 43 | W-43 | CR-97 | 50 | B17 | 25 | IC-819 | 3 | DPHA | 22 | MT-PE1 | 3 | — | — |
| Preparation Example 44 | W-44 | CR-97 | 50 | B8 | 25 | IC-819 | 3 | M-315 | 22 | — | — | — | — |

TABLE 4-continued

| Negative-Type Photosensitive White Composition | (A) Name | Parts by Mass | (B) Name | Parts by Mass | (C) Name | Parts by Mass | (D) Name | Parts by Mass | (E) Name | Parts by Mass | (F) Name | Parts by Mass |
|---|---|---|---|---|---|---|---|---|---|---|---|---|
| Preparation Example 45 | W-45 | CR-97 | 50 | B2 | 25 | IC-819 | 3 | M-315 | 22 | — | — | — | — |
| Preparation Example 46 | W-46 | CR-97 | 50 | B8 | 25 | IC-819 | 3 | M-315 | 22 | MT-PE1 | 3 | — | — |
| Preparation Example 47 | W-47 | CR-97 | 50 | B2 | 25 | IC-819 | 3 | M-315 | 22 | MT-PE1 | 3 | — | — |
| Preparation Example 48 | W-48 | CR-97 | 50 | B8 | 25 | IC-819 | 3 | M-310 | 22 | MT-PE1 | 3 | — | — |
| Preparation Example 49 | W-49 | CR-97 | 50 | B8 | 25 | IC-819 | 3 | M-350 | 22 | MT-PE1 | 3 | — | — |
| Preparation Example 50 | W-50 | CR-97 | 50 | B8 | 25 | IC-819 | 3 | PE-300 | 22 | MT-PE1 | 3 | — | — |
| Preparation Example 51 | W-51 | CR-97 | 50 | B8 | 25 | IC-819 | 3 | 70PA | 22 | MT-PE1 | 3 | — | — |
| Preparation Example 52 | W-52 | CR-97 | 50 | B8 | 25 | IC-819 | 3 | 200PA | 22 | MT-PE1 | 3 | — | — |
| Preparation Example 53 | W-53 | CR-97 | 50 | B8 | 25 | IC-819 | 3 | DPHA PE-300 | 7 15 | — | — | — | — |
| Preparation Example 54 | W-54 | CR-97 | 50 | B2 | 25 | IC-819 | 3 | DPHA PE-300 | 7 15 | — | | — | — |
| Preparation Example 55 | W-55 | CR-97 | 50 | B8 | 25 | IC-819 | 3 | DPHA PE-300 | 7 15 | MT-PE1 | 3 | — | — |
| Preparation Example 56 | W-56 | CR-97 | 50 | B2 | 25 | IC-819 | 3 | DPHA PE-300 | 7 15 | MT-PE1 | 3 | — | — |
| Preparation Example 57 | W-57 | CR-97 | 50 | B8 | 25 | IC-907 | 3 | DPHA PE-300 | 7 15 | MT-PE1 | 3 | — | — |
| Preparation Example 58 | W-58 | CR-97 | 50 | B8 | 25 | IC-369 | 3 | DPHA PE-300 | 7 15 | MT-PE1 | 3 | — | — |
| Preparation Example 59 | W-59 | CR-97 | 50 | B8 | 25 | IC-819 | 3 | DPHA PE-300 | 7 15 | — | — | IRG-1010 | 1 |
| Preparation Example 60 | W-60 | CR-97 | 50 | B2 | 25 | IC-819 | 3 | DPHA PE-300 | 7 15 | — | — | IRG-1010 | 1 |
| Preparation Example 61 | W-61 | CR-97 | 50 | B8 | 25 | IC-819 | 3 | DPHA PE-300 | 7 15 | MT-PE1 | 3 | IRG-1010 | 1 |
| Preparation Example 62 | W-62 | CR-97 | 50 | B2 | 25 | IC-819 | 3 | DPHA PE-300 | 7 15 | MT-PE1 | 3 | IRG-1010 | 1 |
| Preparation Example 63 | W-63 | CR-97 | 50 | B8 | 25 | IC-819 | 3 | DPHA PE-300 | 7 15 | MT-PE1 | 3 | IRG-245 | 1 |
| Preparation Example 64 | W-64 | CR-97 | 50 | B8 | 25 | IC-819 | 3 | DPHA PE-300 | 7 15 | — | — | LA-57 | 1 |
| Preparation Example 65 | W-65 | CR-97 | 50 | B2 | 25 | IC-819 | 3 | DPHA PE-300 | 7 15 | — | — | LA-57 | 1 |
| Preparation Example 66 | W-66 | CR-97 | 50 | B8 | 25 | IC-819 | 3 | DPHA PE-300 | 7 15 | MT-PE1 | 3 | LA-57 | 1 |
| Preparation Example 67 | W-67 | CR-97 | 50 | B2 | 25 | IC-819 | 3 | DPHA PE-300 | 7 15 | MT-PE1 | 3 | LA-57 | 1 |

TABLE 5

| Negative-Type Photosensitive White Composition | (A) Name | Parts by Mass | (B) Name | Parts by Mass | (C) Name | Parts by Mass | (D) Name | Parts by Mass | (E) Name | Parts by Mass |
|---|---|---|---|---|---|---|---|---|---|---|
| Preparation Example 68 | W-68 | CR-97 | 50 | B8 | 25 | IC-819 | 3 | DPHA PE-300 | 7 15 | — | — |
| Preparation Example 69 | W-69 | CR-97 | 50 | B2 | 25 | IC-819 | 3 | DPHA PE-300 | 7 15 | — | — |
| Preparation Example 70 | W-70 | CR-97 | 50 | B8 | 25 | IC-819 | 3 | DPHA PE-300 | 7 15 | MT-PE1 | 3 |
| Preparation Example 71 | W-71 | CR-97 | 50 | B2 | 25 | IC-819 | 3 | DPHA PE-300 | 7 15 | MT-PE1 | 3 |
| Preparation Example 72 | W-72 | CR-97 | 50 | B8 | 25 | IC-819 | 3 | DPHA PE-300 | 7 15 | MT-PE1 | 3 |
| Preparation Example 73 | W-73 | CR-97 | 50 | B2 | 25 | IC-819 | 3 | DPHA PE-300 | 7 15 | MT-PE1 | 3 |
| Preparation Example 74 | W-74 | CR-97 | 50 | B8 | 25 | IC-819 | 3 | DPHA PE-300 | 7 15 | — | — |

TABLE 5-continued

| Preparation Example | Name | (A) Name | Parts by Mass | (B) Name | Parts by Mass | (C) Name | Parts by Mass | (D) Name | Parts by Mass | (E) Name | Parts by Mass |
|---|---|---|---|---|---|---|---|---|---|---|---|
| Preparation Example 75 | W-75 | CR-97 | 50 | B2 | 25 | IC-819 | 3 | DPHA / PE-300 | 7 / 15 | — | — |
| Preparation Example 76 | W-76 | CR-97 | 50 | B8 | 25 | IC-819 | 3 | DPHA / PE-300 | 7 / 15 | MT-PE1 | 3 |
| Preparation Example 77 | W-77 | CR-97 | 50 | B2 | 25 | IC-819 | 3 | DPHA / PE-300 | 7 / 15 | MT-PE1 | 3 |
| Preparation Example 78 | W-78 | CR-97 | 50 | B8 | 25 | IC-819 | 3 | DPHA / PE-300 | 7 / 15 | MT-PE1 | 3 |
| Preparation Example 79 | W-79 | CR-97 | 50 | B2 | 25 | IC-819 | 3 | DPHA / PE-300 | 7 / 15 | MT-PE1 | 3 |
| Preparation Example 80 | W-80 | CR-97 | 50 | B2 / B8 | 5 / 20 | IC-819 | 3 | DPHA / PE-300 | 7 / 15 | MT-PE1 | 3 |
| Preparation Example 81 | W-81 | CR-97 | 50 | B8 | 25 | IC-819 | 3 | DPHA / PE-300 | 7 / 15 | — | — |
| Preparation Example 82 | W-82 | CR-97 | 50 | B2 | 25 | IC-819 | 3 | DPHA / PE-300 | 7 / 15 | — | — |
| Preparation Example 83 | W-83 | CR-97 | 50 | B8 | 25 | IC-819 | 3 | DPHA / PE-300 | 7 / 15 | MT-PE1 | 3 |
| Preparation Example 84 | W-84 | CR-97 | 50 | B2 | 25 | IC-819 | 3 | DPHA / PE-300 | 7 / 15 | MT-PE1 | 3 |
| Preparation Example 85 | W-85 | CR-97 | 50 | B8 | 25 | IC-819 | 3 | DPHA / PE-300 | 7 / 15 | MT-PE1 | 3 |

| | (F) Name | Parts by Mass | (G) Name | Parts by Mass | (H) Name | Parts by Mass | (I) Name | Parts by Mass (coloring agent equivalent basis) |
|---|---|---|---|---|---|---|---|---|
| Preparation Example 68 | — | — | G1 | 0.5 | — | — | — | — |
| Preparation Example 69 | — | — | G1 | 0.5 | — | — | — | — |
| Preparation Example 70 | — | — | G1 | 0.5 | — | — | — | — |
| Preparation Example 71 | — | — | G1 | 0.5 | — | — | — | — |
| Preparation Example 72 | IRG-1010 | 1 | G1 | 0.5 | — | — | — | — |
| Preparation Example 73 | IRG-1010 | 1 | G1 | 0.5 | — | — | — | — |
| Preparation Example 74 | — | — | — | — | RUVA-93 | 2 | — | — |
| Preparation Example 75 | — | — | — | — | RUVA-93 | 2 | — | — |
| Preparation Example 76 | — | — | — | — | RUVA-93 | 2 | — | — |
| Preparation Example 77 | — | — | — | — | RUVA-93 | 2 | — | — |
| Preparation Example 78 | IRG-1010 | 1 | G1 | 0.5 | RUVA-93 | 2 | — | — |
| Preparation Example 79 | IRG-1010 | 1 | G1 | 0.5 | RUVA-93 | 2 | — | — |
| Preparation Example 80 | IRG-1010 | 1 | G1 | 0.5 | RUVA-93 | 2 | — | — |
| Preparation Example 81 | — | — | — | — | — | — | VF PINK 2310N | 20 ppm |
| Preparation Example 82 | — | — | — | — | — | — | VF PINK 2310N | 20 ppm |
| Preparation Example 83 | — | — | — | — | — | — | VF PINK 2310N | 20 ppm |
| Preparation Example 84 | — | — | — | — | — | — | VF PINK 2310N | 20 ppm |
| Preparation Example 85 | — | — | — | — | — | — | VF BLUE 2620 | 20 ppm |

TABLE 6

| | Negative-Type Photosensitive White Composition | (A) Name | Parts by Mass | (B) Name | Parts by Mass | (C) Name | Parts by Mass | (D) Name | Parts by Mass | (E) Name | Parts by Mass |
|---|---|---|---|---|---|---|---|---|---|---|---|
| Preparation Example 86 | W-86 | CR-97 | 50 | B2 | 25 | IC-819 | 3 | DPHA PE-300 | 7 15 | MT-PE1 | 3 |
| Preparation Example 87 | W-87 | CR-97 | 50 | B8 | 25 | IC-819 | 3 | DPHA PE-300 | 7 15 | MT-PE1 | 3 |
| Preparation Example 88 | W-88 | CR-97 | 50 | B2 | 25 | IC-819 | 3 | DPHA PE-300 | 7 15 | MT-PE1 | 3 |
| Preparation Example 89 | W-89 | CR-97 | 50 | B8 | 25 | IC-819 | 3 | DPHA PE-300 | 7 15 | — | — |
| Preparation Example 90 | W-90 | CR-97 | 50 | B2 | 25 | IC-819 | 3 | DPHA PE-300 | 7 15 | — | — |
| Preparation Example 91 | W-91 | CR-97 | 50 | B8 | 25 | IC-819 | 3 | DPHA PE-300 | 7 15 | — | — |
| Preparation Example 92 | W-92 | CR-97 | 50 | B2 | 25 | IC-819 | 3 | DPHA PE-300 | 7 15 | — | — |
| Preparation Example 93 | W-93 | CR-97 | 50 | B8 | 25 | IC-819 | 3 | DPHA PE-300 | 7 15 | — | — |
| Preparation Example 94 | W-94 | CR-97 | 50 | B2 | 25 | IC-819 | 3 | DPHA PE-300 | 7 15 | — | — |
| Preparation Example 95 | W-95 | CR-97 | 50 | B8 | 25 | IC-819 | 3 | DPHA PE-300 | 7 15 | — | — |
| Preparation Example 96 | W-96 | CR-97 | 50 | B2 | 25 | IC-819 | 3 | DPHA PE-300 | 7 15 | — | — |
| Preparation Example 97 | W-97 | CR-97 | 50 | B8 | 25 | IC-819 | 3 | DPHA PE-300 | 7 15 | — | — |
| Preparation Example 98 | W-98 | CR-97 | 50 | B2 | 25 | IC-819 | 3 | DPHA PE-300 | 7 15 | — | — |
| Preparation Example 99 | W-99 | CR-97 | 50 | B8 | 25 | IC-819 | 3 | DPHA PE-300 | 7 15 | — | — |
| Preparation Example 100 | W-100 | CR-97 | 50 | B2 | 25 | IC-819 | 3 | DPHA PE-300 | 7 15 | — | — |
| Preparation Example 101 | W-101 | CR-97 | 50 | B8 | 25 | IC-819 | 3 | DPHA PE-300 | 7 15 | MT-PE1 | 3 |
| Preparation Example 102 | W-102 | CR-97 | 50 | B2 | 25 | IC-819 | 3 | DPHA PE-300 | 7 15 | MT-PE1 | 3 |

| | (F) Name | Parts by Mass | (G) Name | Parts by Mass | (H) Name | Parts by Mass | (I) Name | Parts by Mass (coloring agent equivalent basis) |
|---|---|---|---|---|---|---|---|---|
| Preparation Example 86 | — | — | — | — | — | — | VF BLUE 2620 | 20 ppm |
| Preparation Example 87 | IRG-1010 | 1 | G1 | 0.5 | RUVA-93 | 2 | VF PINK 2310N | 20 ppm |
| Preparation Example 88 | IRG-1010 | 1 | G1 | 0.5 | RUVA-93 | 2 | VF PINK 2310N | 20 ppm |
| Preparation Example 89 | — | — | — | — | — | — | DB-1 | 250 ppm |
| Preparation Example 90 | — | — | — | — | — | — | DB-1 | 250 ppm |
| Preparation Example 91 | — | — | — | — | — | — | DB-2 | 2500 ppm |
| Preparation Example 92 | — | — | — | — | — | — | DB-2 | 2500 ppm |
| Preparation Example 93 | — | — | — | — | — | — | NX-541 | 200 ppm |
| Preparation Example 94 | — | — | — | — | — | — | NX-541 | 200 ppm |
| Preparation Example 95 | — | — | — | — | — | — | DR-1 | 250 ppm |
| Preparation Example 96 | — | — | — | — | — | — | DR-1 | 250 ppm |
| Preparation Example 97 | — | — | — | — | — | — | DV-1 | 250 ppm |
| Preparation Example 98 | — | — | — | — | — | — | DV-1 | 250 ppm |
| Preparation Example 99 | — | — | — | — | — | — | DB-2/ NX-541 | 2500 ppm/ 200 ppm |

TABLE 6-continued

| Preparation Example | | | | | | | | |
|---|---|---|---|---|---|---|---|---|
| Preparation Example 100 | — | — | — | — | — | — | DB-2/NX-541 | 2500 ppm/200 ppm |
| Preparation Example 101 | IRG-1010 | 1 | G1 | 0.5 | RUVA-93 | 2 | DB-2/NX-541 | 2500 ppm/100 ppm |
| Preparation Example 102 | IRG-1010 | 1 | G1 | 0.5 | RUVA-93 | 2 | DB-2/NX-541 | 2500 ppm/100 ppm |

The respective components are as follows.
CR-97: Titanium dioxide pigment (coated with aluminum/zirconia, manufactured by ISHIHARA SANGYO KAISHA, LTD.)
JR-605: Titanium dioxide pigment (coated with aluminum, manufactured by TAYCA CORPORATION)
R960: Titanium dioxide pigment (coated with aluminum/silica, manufactured by Du Pont Co.)
MT-PE1: Pentaerythritol tetrakis(3-mercaptobutyrate) (manufactured by Showa Denko K.K.)
MT-BD1:1,4-Butyleneglycol (3-mercaptobutyrate) (manufactured by Showa Denko K.K.)
MT-NR1: Tris(3-mercaptobutyryloxyethyl)isocyanurate (manufactured by Showa Denko K.K.)
TPMB: Trimethylolpropanetris(3-mercaptobutyrate) (manufactured by Showa Denko K.K.)
TEMB: Trimethylolethanetris(3-mercaptobutyrate) (manufactured by Showa Denko K.K.)
PEMP: Pentaerythritol tetrakis(3-mercaptopropionate)
M-315: Mixture of Isocyanuric acid-EO-modified triacrylate (average number of EO units=3) and isocyanuric acid-EO-modified diacrylate (average number of EO units=3) (manufactured by TOAGOSEI CO., LTD.)
M-310: Trimethylolpropane-PO-modified triacrylate (average number of PO units=3) (manufactured by TOAGOSEI CO., LTD.)
M-350: Trimethylolpropane-EO-modified triacrylate (average number of EO units=3) (manufactured by TOAGOSEI CO., LTD.)
200PA: Tripropylene glycol diglycidyl ether acrylate (manufactured by Kyoeisha Chemical Co., Ltd.)
70PA: Propylene glycol diglycidyl ether acrylate (manufactured by Kyoeisha Chemical Co., Ltd.)
PE-300: Polyethylene glycol 300-diacrylate (manufactured by DKS Co. Ltd.)
IRG-1010: Pentaerythritol tetrakis[3-(3,5-di-t-butyl-4-hydroxyphenyl)propionate (manufactured by BASF Japan Ltd.)
IRG-245: Ethylenebis(oxyethylene)bis(3-(5-t-butyl-4-hydroxy-m-tolyl) propionate (manufactured by BASF Japan Ltd.)
LA-57: Tetrakis(2,2,6,6-tetramethyl-4-pyridyl)butane-1,2,3,4-tetra carboxylate (manufactured by manufactured by ADEKA CORPORATION)
IC-907: 2-Methyl-1-(4-methylthiophenyl)-2-morpholino-propan-1-one (manufactured by BASF Japan Ltd.)
IC-369: 2-Benzyl-2-dimethylamino-1-(4-morpholinophenyl)-butanone-1 (manufactured by BASF Japan Ltd.)
RUVA-93: 2-(2'-Hydroxy-5'-methacryloxyethylphenyl)-2H-benzotriazole (manufactured by Otsuka Chemical Co., Ltd.)
VF BLUE 2620: C.I. Solvent BLUE 44 (manufactured by ORIENT CHEMICAL INDUSTRIES CO., LTD., VF=VALIFAST)
VF PINK 2310N: C.I. Solvent RED 218 (manufactured by ORIENT CHEMICAL INDUSTRIES CO., LTD., VF=VALIFAST)
NX-541: PR101 (iron oxide) dispersion (manufactured by Dainichiseika Color & Chemicals Mfg. Co., Ltd.) (concentration of solid content: 80% by mass, coloring material/resin (mass ratio)=2/1)

Preparation Example 103 Preparation of Non-Photosensitive White Composition (HW-1)

A mixture of 45 g of CR-97 and 10 g of the acrylic resin solution (B7) was kneaded by a three roller to obtain a non-photosensitive white composition (HW-1).

Preparation Example 104 Preparation of Non-Photosensitive White Composition (HW-2)

A mixture of 45 g of CR-97 and 10 g of the silicone-based resin "840 RESIN (manufactured by Dow Corning Toray Co., Ltd.)" was kneaded by a three roller to obtain a non-photosensitive white composition (HW-2)

Preparation Example 105 Preparation of Negative-Type Photosensitive Transparent Composition (Cr-1)

A negative-type photosensitive transparent composition (Cr-1) was prepared by mixing 50 g of the acrylic solution (B1), 16 g of dipentaerythritol pentaacrylate (manufactured by Nippon Kayaku Co., Ltd.), 2 g of 1,2-octanedione, 1-[4-(phenylthio)-, 2-(O-benzoyloxime)] ("IRGACURE" (registered trademark) OXE-01; manufactured by BASF CORPORATION), 31.9 g of diacetone alcohol and 0.1 g of polyether-modified polydimethylsiloxane (BYK-333; manufactured by BYK Japan KK).

Preparation Example 106 Preparation of Coloring Agent Dispersion (DBk-1)

Into a tank, 120 g of a black pigment ("Irgaphor Black S0100CF" manufactured by BASF CORPORATION), 98 g of an acrylic polymer solution (B12), 100 g of Disper-bykLPN-21116 (DP-1; manufactured by BYK Japan KK; 40% by mass solution of PMA) as a polymeric dispersant and 682 g of PMA were charged, and the resulting mixture was stirred for 20 minutes with a HOMO Mixer (manufactured by PRIMIX Corporation) to obtain a preliminary dispersion. Thereafter, the preliminary dispersion was supplied to Ultra Apex Mill (manufactured by Kotobuki Industries Co., Ltd.) equipped with Centri-Separator loaded with 0.05 mm φ zirconia beads (YTZ ball; manufactured by Neturen Co., Ltd.) by 75%, and dispersed at a rotational speed of 8 m/s for 3 hours to obtain a black material dispersion DBk-1 in which a concentration of a solid content was 20% by mass, and coloring material/resin (mass ratio) was 60/40.

Preparation Example 107 Preparation of Pigment Dispersion (DV-1)

A violet material dispersion DV-1 was prepared in the same manner as in the black material dispersion DBk-1 except for using, as a coloring material, a violet organic pigment PV23 (manufactured by Clariant (Japan) K.K.) in place of the black pigment Irgaphor Black S0100CF.

Preparation Example 108 Preparation of Pigment Dispersion (DB-1)

A blue material dispersion DB-1 was prepared in the same manner as in the black material dispersion DBk-1 except for using, as a coloring material, a blue organic pigment PB15:6 (manufactured by Toyo Ink SC Holdings Co., Ltd.) in place of the black pigment Irgaphor Black S0100CF.

Preparation Example 109 Preparation of Pigment Dispersion (DB-2)

A blue material dispersion DB-2 was prepared in the same manner as in the black material dispersion DBk-1 except for using, as a coloring material, a blue inorganic pigment PB28 (manufactured by Dainichiseika Color & Chemicals Mfg. Co., Ltd.) in place of the black pigment Irgaphor Black S0100CF.

Preparation Example 110 Preparation of Pigment Dispersion (DR-1)

A red material dispersion DR-1 was prepared in the same manner as in the black material dispersion DBk-1 except for using, as a coloring material, a red organic pigment PR177 (manufactured by BASF CORPORATION) in place of the black pigment Irgaphor Black S0100CF.

Preparation Example 111 Preparation of Negative-Type Photosensitive Black Composition (Bk-1)

0.5 g of OXE-01 as a photopolymerization initiator was added to 31.52 g of PGMEA, and the resulting mixture was stirred until a solid content was dissolved.

Moreover, 14.03 g of an acrylic polymer (B12), 3.38 g of dipentaerythritol hexaacrylate (manufactured by Nippon Kayaku Co., Ltd.) as a polyfunctional monomer and a PMA 10% by mass solution of 0.24 g of a silicone-based surfactant BYK 333 as a surfactant were added, and the resulting mixture was stirred at room temperature for 1 hour to form a photosensitive resist. To the photosensitive resist, 10.46 g of the black pigment dispersion DBk-1 was added to prepare a photosensitive black resin composition (Bk-1) in which a concentration of a solid content was 20% by mass, and pigment/resin (mass ratio) was 18/82, and a black pigment=100.

Preparation Example 112 Preparation of Negative-Type Photosensitive Coloring Composition (V-1)

A negative-type photosensitive coloring composition (V-1) was prepared in the same manner as in the negative-type photosensitive black composition (Bk-1) except for using a violet material dispersion DV-1 in place of the black material dispersion DBk-1.

Preparation Example 113 Preparation of Negative-Type Photosensitive Coloring Composition (V-2)

A negative-type photosensitive coloring composition (V-2) was prepared by adding the violet material dispersion DV-1 to the negative-type photosensitive transparent composition (Cr-1) so that a pigment concentration was 0.1 parts by mass with respect to a solid content.

Example 1

Properties of the negative-type photosensitive white composition (W-1) obtained in Preparation Example 1 described above were evaluated by the following methods (i) to (vi), and evaluation of the production of a touch panel was made by the following method (vii).

(i) Evaluation of Patternability

The negative-type photosensitive white composition (W-1) was applied onto an alkali glass substrate (10 cm square) (manufactured by Nippon Sheet Glass Co., Ltd., thickness 0.5 mm) at an arbitrary rotating speed with a spin coater, and the substrate was pre-baked at 100° C. for 3 minutes with a hot plate (SCW-636 manufactured by Dainippon Screen Mfg. Co., Ltd.) to form a cured film having a thickness of 15 μm. Next, the formed film was exposed to light from an ultra-high pressure mercury lamp using a PLA (PLA-501F; manufactured by Canon Inc.) at an exposure amount of 200 mJ (i-ray) through a mask having a line & space pattern of 150 μm in width with a mask gap of 150 μm. Thereafter, the exposed film was shower-developed with a 2.38% by mass aqueous solution of TMAH (ELM-D; manufactured by MITSUBISHI GAS CHEMICAL CO., INC.) or a 0.045% by mass KOH aqueous solution for 60 seconds using an automatic developing apparatus (manufactured by Takizawa Sangyo Co., Ltd.; AD-2000), and then rinsed with water for 30 seconds. Two items of a cutting property and development adhesiveness of the developed pattern were evaluated according to the following evaluation criteria.

Cutting Property

S: There is no residue in a linear cut pattern with a line width of 100 μm.

A: There is a residue in a linear cut pattern with a line width of 100 μm, but there is no residue in a linear cut pattern with a line width of 150 μm.

B: There is a residue in a linear cut pattern with a line width of 150 μm, but there is no residue in a linear cut pattern with a line width of 200 μm.

C: There is a residue in a linear cut pattern with a line width of 200 μm.

Development Adhesiveness

S: An exposed portion of a line and space pattern (=L/S) of 50 μm in width or more remains without being peeled from the substrate.

A: An exposed portion of a L/S of 100 μm in width or more remains without being peeled from the substrate, but a L/S of 100 μm in width or less is peeled.

B: An exposed portion of a L/S of 150 μm in width or more remains without being peeled from the substrate, but a L/S of 150 μm in width or less is peeled.

C: An exposed portion of a L/S of 150 μm in width or more is peeled from the substrate.

However, evaluation of the development adhesiveness was carried out when the cutting property was rated as S, A or B.

(ii) Evaluation of Pattern Shape

After a L/S of 150 μm in width was patterned in the same manner as in the above (i), the substrate was cured at 230° C. for 30 minutes in air using an oven (IHPS-222; manufactured by Espec Corp.) to form a cured film. A cross-section of the resulting cured film was cut out and observed with use of a scanning electron microscope, and a pattern shape was evaluated according to the following evaluation criteria. Further, the thickness of the resulting cured film was measured with a stylus type step profiler, and consequently it was 15 µm.

A: Taper angle less than 60°
B: Taper angle 60° or more
C: Undercut shape (iii) Evaluation of Adhesiveness A negative-type photosensitive white composition was applied onto an alkali glass substrate (10 cm square) with a spin coater so as to be 15 µm in film thickness after curing, and a substrate was pre-baked at 100° C. for 3 minutes with use of a hot plate to form a coating with a film thickness of 15 µm. Next, the whole surface of the substrate was exposed to light from an ultra-high pressure mercury lamp using a PLA. Thereafter, the exposed film was shower-developed with a 2.38% by mass TMAH aqueous solution or a 0.045% by mass KOH aqueous solution for 120 seconds using an automatic developing apparatus, and then rinsed with water for 30 seconds. The exposed film was cured at 230° C. for 30 minutes in air using an oven to form a cured film.

Next, adhesiveness of the formed cured film was evaluated according to JIS K 5600-5-6 (Date Established: Apr. 20, 1999). Specifically, two sets, which are perpendicular to each other, of 11 parallel lines spaced 1 mm apart were inscribed in such a way that these lines reached a base of the glass sheet through the cured film on the glass sheet with a cutter to prepare 100 squares having a size of 1 mm×1 mm. A cellophane adhesive tape (width: 18 mm, adhesive force: 3.7 N/10 mm) was stuck to the surface of the cured film inscribed, and the tape was brought into contact with the squares by scrubbing with an eraser (accepted product for JIS S 6050), and then the tape was peeled off momentarily by manually pulling at one end of the tape in the direction perpendicular to the sheet. The number of squares remaining was visually counted. The adhesiveness was rated according to the following criteria of an area of peeled squares, and the rate of 4 or more was considered as accepted.

5: Peeled area is 0%
4: Peeled area is less than 5%
3: Peeled area is 5 to 14%
2: Peeled area is 15 to 34%
1: Peeled area is 35% to 64%
0: Peeled area is 65% to 100%

(iv) Evaluation of Chemical Resistance

Two glass substrates having a cured film formed thereon were prepared in the same manner as in the above (iii), and onto one of them, the negative-type photosensitive transparent composition (Cr-1) obtained in Preparation Example 50 was applied with a spin coater so as to be 2 µm in film thickness after curing, and a substrate was pre-baked at 100° C. for 2 minutes with use of a hot plate to prepare a cured film having a thickness of 2 µm. Next, the whole surface of the formed film was exposed to light from an ultra-high pressure mercury lamp at an exposure amount of 100 mJ (i-ray) using a PLA. Thereafter, the exposed film was shower-developed with a 2.38% by mass TMAH for 60 seconds using an automatic developing apparatus, and then rinsed with water for 30 seconds. Finally, the exposed film was cured at 230° C. for 30 minutes in air using an oven to form a transparent protecting film on the white cured film.

Next, chemical treatment of each white cured film was performed under the following conditions (1) to (3), and then adhesiveness of the white cured film was evaluated in the same manner as in the above (iii). In addition, white cured film was rinsed by pure water shower for 30 seconds between the chemical treatments.

(1) ITO etchant (36% by mass hydrogen chloride aqueous solution/60% by mass nitric acid aqueous solution/water=4/1/5 (mass ratio) mixed solution) (35° C., 2 minutes)
(2) 4% by mass sodium hydroxide aqueous solution (40° C., 2 minutes)
(3) "N-300" manufactured by Nagase ChemteX Corporation (60° C., 3 minutes)

The chemical resistance was rated based on the following evaluation criteria.

The following criteria were used.

S: Rated as 4 to 5 in adhesiveness evaluation after subjecting a white cured film alone to chemical treatments.
A: Rated as 1 to 3 in the adhesiveness evaluation after subjecting a white cured film alone to chemical treatments, and rated as 4 to 5 in the adhesiveness evaluation after subjecting (a white cured film+a transparent protective film) to chemical treatments.
B: Rated as 0 in the adhesiveness evaluation after subjecting a white cured film alone to chemical treatments, and rated as 1 to 3 in the adhesiveness evaluation after subjecting (a white cured film+a transparent protective film) to chemical treatments.
C: A cured film is peeled during subjecting a white cured film alone to chemical treatments.

(v) Evaluation of OD Value

A glass substrates having a cured film formed thereon was prepared in the same manner as in the above (iii), an intensity of each of incident light and transmitted light was measured using X-rite 361T (visual) densitometer, and an OD value was calculated from the following formula (1):

$$OD\ value = \log_{10}(I_0/I) \qquad \text{Formula (1)}$$

$I_0$: Intensity of incident light
I: Intensity of transmitted light (vi) Evaluation of Color Characteristics Two glass substrates having a cured film formed thereon were prepared in the same manner as in the above (iii), and one of them was additionally heated at 240° C. for 120 minutes in air using an oven. With respect to each substrate, a reflection coefficient of total reflection light from a glass substrate side was measured using a spectrophotometer (UV-2450; manufactured by Shimadzu Corporation), measured values were displayed in a CIE 1976 (L*, a*, b*) color space. Using these values, a color difference between before and after the additional heating (hereinafter, abbreviated as "ΔEab") was calculated from the following equation (2).

$$\Delta eab = (X1^2 + X2^2 + X3^2)^{0.5} \qquad \text{EQ (2)}$$

Here,
X1: {L*(0)}−{L*(1)}
X2: {a*(0)}−{a*(1)}
X3: {b*(0)}−{b*(1)}
L*(0), a*(0) and b*(0) indicate values of L*, a* and b* of the cured film for evaluation of film properties, respectively, and L*(1), a*(1) and b*(1) indicate values of L*, a* and b* of the cured film after additional heating, respectively.

(vii) Preparation of Touch Panel Substrate

A touch panel substrate was prepared according to the following procedure.

(1) Preparation of White Light-Shielding Pattern

The negative-type photosensitive white composition (W-1) obtained in Preparation Example 1 was applied onto a tempered glass having a size of 10 cm×10 cm and a thickness of 0.7 mm with a spin coater so as to be 15 µm in film thickness after curing, and a substrate was pre-baked at 100° C. for 3 minutes with use of a hot plate. Next, the formed film was exposed to light from an ultra-high pressure mercury lamp at an exposure amount of 200 mJ (i-ray) through a mask having a light-shielding pattern (line width is 3000 µm) for a touch panel with a mask gap of 150 µm using a PLA. Thereafter, the exposed film was shower-developed with a 2.38% by mass TMAH aqueous solution for 120 seconds using an automatic developing apparatus, and then rinsed with water for 30 seconds. Finally, the substrate was cured at 230° C. for 30 minutes in air using an oven to prepare a glass substrate having a white light-shielding pattern (corresponding to FIG. 1a).

(2) Formation of Patterned ITO

On the glass substrate prepared in the above (1), ITO having a thickness of 150 nm was deposited by performing sputtering at an RF power of 1.4 kW and at a vacuum degree of $6.65 \times 10^{-1}$ Pa for 12.5 minutes using a sputtering system HSR-521A (manufactured by Shimadzu Corporation), and a positive type photoresist ("OFPR-800" manufactured by Tokyo Ohka Kogyo Co., Ltd.) was applied onto the ITO film and pre-baked at 80° C. for 20 minutes to obtain a resist film having a thickness of 1.1 µm. After the obtained film was pattern-exposed to light from an ultra-high pressure mercury lamp through a mask using a PLA, the exposed film was shower-developed with a 2.38% by mass TMAH aqueous solution for 90 seconds using an automatic developing apparatus, and then rinsed with water for 30 seconds. Thereafter, ITO was etched by immersion into a 3.5% by mass aqueous solution of oxalic acid for 150 seconds, and the photoresist was removed by treatment with a stripping solution (4% potassium hydroxide aqueous solution) at 50° C. for 120 seconds, and annealing was applied at 230° C. for 30 minutes to prepare a glass substrate having patterned ITO (symbol 3 in FIG. 1) with a thickness of 150 nm (corresponding to FIG. 1b).

(3) Formation of Transparent Insulating Film

On the glass substrate obtained in the above (2), transparent insulating films (symbol 4 in FIG. 1) were prepared (corresponding to FIG. 1c) in the same manner as in the above (1) except for using the negative-type photosensitive transparent composition (Cr-1) obtained in Preparation Example 50 to form a film thickness of 2 µm and performing exposure through a patterned mask.

(4) Formation of MAM Wire

Figure 2:
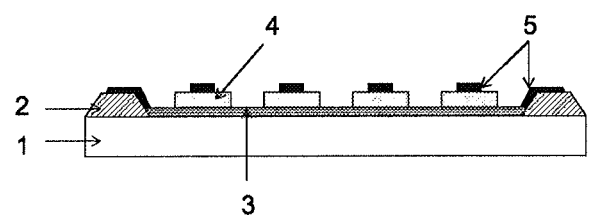
FIG. 2 is a schematic view showing a cross-section of a touch panel substrate prepared in Example 1.

On the glass substrate obtained in the above (3), MAM wires (symbol 5 in FIG. 1) with a thickness of 250 nm were prepared (corresponding to FIG. 1d) in the same manner as in the above (1) except for using molybdenum and aluminum as a target and a mixed solution of $H_3PO_4/HNO_3/CH_3COOH/H_2O$ (in a mass ratio of 65/3/5/27) as an etchant to complete a touch panel substrate (FIG. 1d and FIG. 2).

The continuity test of the resulting touch panel substrate was performed. Further, reflection chromaticity, an OD value and adhesiveness of a white cured film area were evaluated.

(viii) Measurement of Viscosity

Viscosity at 25° C. of a white composition immediately after preparation and a white composition after being left at 40° C. for a week was measured using an E-type viscometer ("VISCOMETER TV-25" manufactured by Toki Sangyo Co., Ltd.).

(ix) Evaluation of Cracking Resistance

The negative-type photosensitive coloring composition was applied onto alkali-free glass substrates (10 cm square) with a spin coater (1H-360S; manufactured by MIKASA CO., LTD.) so that thicknesses of cured films of the composition were respectively 10 µm, 15 µm, 20 µm and 25 µm, and each of the substrates was pre-baked at 100° C. for 2 minutes with a hot plate to form a cured film. Next, the whole surface of the formed film was exposed to light from an ultra-high pressure mercury lamp at an exposure amount of 200 mJ (i-ray) using a PLA. Thereafter, the exposed film was shower-developed with a 2.38% by mass aqueous solution of tetramethylammonium hydroxide for 60 seconds using an automatic developing apparatus, and then rinsed with water for 30 seconds. Finally, the exposed film was cured at 230° C. for 1 hour in air using an oven (IHPS-222; manufactured by Espec Corp.) to form a cured film. The existence or non-existence of the occurrence of cracks of the resulting cured film was visually determined, and it was decided that the cured film did not have crack resistance at that film thickness if there was even one crack. For example, when there was not a crack at the film thickness of 15 µm and there was a crack at the film thickness of 20 µm, a crack-resistant film thickness was considered as ">15 µm". Moreover, a crack-resistant film thickness in the case in which there was not a crack even at the film thickness of 20 µm was considered as ">20 µm", and a crack-resistant film thickness in the case in which there was a crack even at the film thickness of 5 was considered as "<5 µm".

Examples 2 to 102

Using each of the negative-type photosensitive white compositions obtained in Preparation Examples 2 to 102, evaluations of the above (i) to (ix) were performed in the same manner as in Example 1. Evaluation results are shown in Table 7, Table 8, Table 9, Table 10, Table 11 and Table 12.

Example 103

The negative-type photosensitive coloring composition (W-29) was applied onto an alkali glass substrate (10 cm square) (manufactured by Nippon Sheet Glass Co., Ltd., thickness 0.5 mm) at an arbitrary rotating speed with a spin coater to form a coating with a film thickness of 10 µm. Next, the formed film was exposed to light from an ultra-high pressure mercury lamp at an exposure amount of 150 mJ (i-ray) through a mask having a line & space pattern of 190 µm in width with a mask gap of 150 µm using a PLA. Thereafter, the exposed film was shower-developed with a 2.38% by mass TMAH aqueous solution for 120 seconds using an automatic developing apparatus, and then rinsed with water for 30 seconds. The exposed film was cured at 230° C. for 30 minutes in air using an oven to form a cured film. A second cured film was formed in the same manner as in the above procedure except that the composition (W-29) was applied onto the substrate having a cured film formed thereon so as to be 5 µm in thickness and exposed to light through a mask having a line & space pattern of 150 µm in width (alignment was performed so that a pattern center of the second pattern is aligned with that of the first pattern). Two items of a cutting property and development adhesiveness of the resulting pattern were evaluated. Items of the above (ii) to (vi) as other evaluation were carried out after processing the substrate into a structure of two-layered cured film similarly.

Example 104

Preparation and evaluation of a substrate and a pattern were performed in the same manner as in Example 103 except for using the negative-type photosensitive white composition (W-56) in place of the negative-type photosensitive white composition (W-29).

Example 105

Preparation and evaluation of a substrate and a pattern were performed in the same manner as in Example 103 except for switching between the thickness and line width of the first cured film and the thickness and line width of the second cured film.

Example 106

Preparation and evaluation of a substrate and a pattern were performed in the same manner as in Example 105 except for using the negative-type photosensitive white composition (W-56) in place of the negative-type photosensitive white composition (W-29).

Comparative Example 1

An attempt to form a cut pattern with a line width of 200 µm, which is linear in a direction perpendicular to a squeegee, with use of a screen printer so that a film thickness after curing is 15 µm, was made using the non-photosensitive white composition (HW-1) obtained in Preparation Example 103. However, the cut pattern was buried, not leading to formation of a pattern.

Comparative Example 2

An attempt to form a cut pattern with a line width of 200 µm, which is linear in a direction perpendicular to a squeegee, with use of a screen printer so that a film thickness after curing is 15 µm, was made using the non-photosensitive white composition (HW-2) obtained in Preparation Example 104. However, the cut pattern was buried, not leading to formation of a pattern.

TABLE 7

| | Negative-Type Photosensitive White Composition | (i) Patternability | | | | | | (ii) Pattern Shape | (iii) Adhesiveness |
|---|---|---|---|---|---|---|---|---|---|
| | | 2.38% TMAH | | 0.4% KOH | | 0.045% KOH | | | |
| | | Cutting Property | Development Adhesiveness | Cutting Property | Development Adhesiveness | Cutting Property | Development Adhesiveness | | |
| Example 1 | W-1 | B | A | B | A | C | — | B | 4 |
| Example 2 | W-2 | B | A | B | A | C | — | B | 4 |
| Example 3 | W-3 | B | A | B | A | C | — | B | 4 |
| Example 4 | W-4 | B | A | B | A | C | — | B | 4 |
| Example 5 | W-5 | B | A | B | A | C | — | B | 4 |
| Example 6 | W-6 | B | A | B | A | C | — | B | 4 |
| Example 7 | W-7 | B | A | B | A | C | — | B | 4 |
| Example 8 | W-8 | A | A | A | A | C | — | B | 4 |
| Example 9 | W-9 | A | A | A | A | C | — | B | 4 |
| Example 10 | W-10 | A | A | A | A | C | — | B | 4 |
| Example 11 | W-11 | A | A | A | A | C | — | B | 4 |
| Example 12 | W-12 | A | A | A | A | C | — | B | 4 |
| Example 13 | W-13 | A | A | A | A | C | — | B | 4 |
| Example 14 | W-14 | A | A | A | A | C | — | B | 4 |
| Example 15 | W-15 | A | A | A | A | C | — | B | 4 |
| Example 16 | W-16 | A | A | A | A | C | — | B | 4 |
| Example 17 | W-17 | A | A | A | A | C | — | B | 4 |
| Example 18 | W-18 | A | A | A | A | C | — | B | 4 |
| Example 19 | W-19 | B | A | B | A | C | — | B | 4 |
| Example 20 | W-20 | A | A | A | A | C | — | B | 4 |
| Example 21 | W-21 | B | A | B | A | C | — | B | 4 |
| Example 22 | W-22 | A | A | A | A | C | — | B | 4 |
| Example 23 | W-23 | B | S | B | S | C | — | A | 4 |
| Example 24 | W-24 | B | S | B | S | C | — | A | 4 |
| Example 25 | W-25 | B | S | B | S | C | — | A | 4 |
| Example 26 | W-26 | B | S | B | S | C | — | A | 4 |

| | (iv) Chemical Resistance | (v) OD Value | (vi) Color Characteristics | | | | | | (viii) Viscosity | | (ix) Crack Resistance |
|---|---|---|---|---|---|---|---|---|---|---|---|
| | | | After Thermal Curing | | | After Additional Heating 240° C./120 minutes | | | Immediately after Preparation | After a Week at 40° C. | |
| | | | L* | a* | b* | L* | a* | b* | ΔEab | | | |
| Example 1 | B | 1 | 86.37 | −1.63 | 1.05 | 86.22 | −1.66 | 1.85 | 0.81 | 7.5 | 7.5 | 15 |
| Example 2 | B | 1 | 87.01 | −1.55 | 0.89 | 86.86 | −1.58 | 1.59 | 0.72 | 7.5 | 7.5 | 15 |
| Example 3 | B | 1 | 87.56 | −1.73 | 1.01 | 87.51 | −1.75 | 1.97 | 0.96 | 7.5 | 7.5 | 15 |
| Example 4 | B | 1 | 86.93 | −1.63 | 0.98 | 86.98 | −1.67 | 1.73 | 0.75 | 7.5 | 7.5 | 20 |
| Example 5 | B | 1 | 87.45 | −1.34 | 0.95 | 87.60 | −1.31 | 1.75 | 0.81 | 7.5 | 7.5 | 20 |
| Example 6 | B | 1 | 90.20 | −1.34 | 0.92 | 90.20 | −1.32 | 1.92 | 1.00 | 7.5 | 7.5 | 15 |
| Example 7 | B | 1 | 86.80 | −1.50 | 0.85 | 86.53 | −1.55 | 1.62 | 0.82 | 7.5 | 7.5 | 15 |
| Example 8 | B | 1 | 86.91 | −1.62 | 1.45 | 86.81 | −1.72 | 2.55 | 1.11 | 8.5 | 8.5 | 20 |
| Example 9 | B | 1 | 87.52 | −1.59 | 2.10 | 87.32 | −1.79 | 3.60 | 1.53 | 8.5 | 8.5 | 20 |
| Example 10 | B | 1 | 86.56 | −1.21 | 1.03 | 86.76 | −1.36 | 2.03 | 1.03 | 16.0 | 16.0 | 20 |
| Example 11 | B | 1 | 86.21 | −1.25 | 1.09 | 86.31 | −1.35 | 2.29 | 1.21 | 7.5 | 7.5 | 20 |
| Example 12 | B | 1 | 87.52 | −1.55 | 1.15 | 87.42 | −1.75 | 2.25 | 1.12 | 8.5 | 8.5 | 20 |

TABLE 7-continued

| | | | | | | | | | | | |
|---|---|---|---|---|---|---|---|---|---|---|---|
| Example 13 | B | 1 | 87.92 | −1.91 | 1.21 | 87.72 | −2.06 | 2.21 | 1.03 | 8.5 | 8.5 | 20 |
| Example 14 | B | 1 | 87.95 | −1.84 | 1.04 | 88.15 | −1.94 | 2.24 | 1.22 | 12.0 | 12.0 | 20 |
| Example 15 | B | 1 | 86.54 | −1.59 | 0.99 | 86.64 | −1.79 | 2.09 | 1.12 | 7.5 | 7.5 | 20 |
| Example 16 | B | 1 | 86.95 | −1.67 | 1.07 | 86.85 | −1.82 | 2.07 | 1.02 | 7.5 | 7.5 | 20 |
| Example 17 | B | 1 | 72.30 | −1.74 | 5.50 | 72.50 | −1.84 | 7.00 | 1.52 | 12.0 | 12.0 | 20 |
| Example 18 | B | 1 | 87.32 | −1.65 | 1.43 | 87.17 | −1.70 | 2.65 | 1.23 | 8.5 | 8.5 | 20 |
| Example 19 | B | 1 | 87.26 | −1.79 | 1.11 | 87.10 | −1.82 | 1.92 | 0.83 | 7.5 | 7.5 | 15 |
| Example 20 | B | 1 | 87.56 | −1.42 | 1.02 | 87.26 | −1.45 | 2.20 | 1.22 | 8.5 | 8.5 | 20 |
| Example 21 | B | 1 | 86.93 | −1.32 | 0.75 | 86.90 | −1.39 | 1.52 | 0.77 | 7.5 | 7.5 | 15 |
| Example 22 | A | 1 | 86.52 | −1.59 | 1.05 | 86.52 | −1.59 | 1.85 | 0.80 | 7.5 | 7.5 | 15 |
| Example 23 | A | 1 | 87.11 | −1.53 | 0.89 | 87.06 | −1.55 | 1.59 | 0.70 | 7.5 | 7.5 | 15 |
| Example 24 | A | 1 | 87.61 | −1.73 | 1.01 | 87.51 | −1.77 | 1.95 | 0.95 | 7.5 | 7.5 | 15 |
| Example 25 | A | 1 | 86.93 | −1.65 | 0.98 | 86.78 | −1.61 | 1.73 | 0.77 | 7.5 | 7.5 | 20 |
| Example 26 | A | 1 | 87.40 | −1.38 | 0.95 | 87.55 | −1.36 | 1.75 | 0.81 | 7.5 | 7.5 | 20 |

TABLE 8

| | Negative-Type Photosensitive White Composition | (i) Patternability | | | | | | (ii) Pattern Shape | (iii) Adhesiveness |
|---|---|---|---|---|---|---|---|---|---|
| | | 2.38% TMAH | | 0.4% KOH | | 0.045% KOH | | | |
| | | Cutting Property | Development Adhesiveness | Cutting Property | Development Adhesiveness | Cutting Property | Development Adhesiveness | | |
| Example 27 | W-27 | B | S | B | S | C | — | A | 4 |
| Example 28 | W-28 | B | S | B | S | C | — | A | 4 |
| Example 29 | W-29 | A | S | A | S | C | — | A | 4 |
| Example 30 | W-30 | A | S | A | S | C | — | A | 4 |
| Example 31 | W-31 | A | S | A | S | C | — | A | 4 |
| Example 32 | W-32 | A | S | A | S | C | — | A | 4 |
| Example 33 | W-33 | A | S | A | S | C | — | A | 4 |
| Example 34 | W-34 | A | S | A | S | C | — | A | 4 |
| Example 35 | W-35 | A | S | A | S | C | — | A | 4 |
| Example 36 | W-36 | A | S | A | S | C | — | A | 4 |
| Example 37 | W-37 | A | S | A | S | C | — | A | 4 |
| Example 38 | W-38 | A | S | A | S | C | — | A | 4 |
| Example 39 | W-39 | A | S | A | S | C | — | A | 4 |
| Example 40 | W-40 | A | S | A | S | C | — | A | 4 |
| Example 41 | W-41 | A | S | A | S | C | — | A | 4 |
| Example 42 | W-42 | A | S | A | S | C | — | A | 4 |
| Example 43 | W-43 | A | S | A | S | C | — | A | 4 |
| Example 44 | W-44 | A | B | A | B | A | S | B | 4 |
| Example 45 | W-45 | A | B | A | B | C | — | B | 4 |
| Example 46 | W-46 | A | A | A | A | A | S | A | 4 |
| Example 47 | W-47 | A | A | A | A | C | — | A | 4 |
| Example 48 | W-48 | A | A | A | A | A | S | A | 4 |
| Example 49 | W-49 | A | A | A | A | A | S | A | 4 |
| Example 50 | W-50 | A | A | A | A | A | S | A | 4 |
| Example 51 | W-51 | A | A | A | A | A | S | A | 4 |
| Example 52 | W-52 | A | A | A | A | A | S | A | 4 |

| | (iv) Chemical Resistance | (v) OD Value | (vi) Color Characteristics | | | | | | (viii) Viscosity | | (ix) Crack Resistance |
|---|---|---|---|---|---|---|---|---|---|---|---|
| | | | After Thermal Curing | | | After Additional Heating 240° C./120 minutes | | | Immediately after Preparation | After a Week at 40° C. | |
| | | | L* | a* | b* | L* | a* | b* | ΔEab | | | |
| Example 27 | A | 1 | 90.10 | −1.30 | 0.92 | 90.20 | −1.30 | 1.92 | 1.00 | 7.5 | 7.5 | 15 |
| Example 28 | A | 1 | 86.89 | −1.42 | 0.85 | 86.89 | −1.56 | 1.75 | 0.91 | 7.5 | 7.5 | 15 |
| Example 29 | A | 1 | 86.76 | −1.60 | 1.45 | 86.81 | −1.62 | 2.65 | 1.20 | 8.5 | 8.5 | 20 |
| Example 30 | A | 1 | 86.76 | −1.60 | 1.45 | 86.66 | −1.62 | 2.75 | 1.30 | 8.5 | 8.5 | 20 |
| Example 31 | A | 1 | 86.98 | −1.54 | 1.34 | 86.83 | −1.58 | 2.54 | 1.21 | 8.5 | 8.5 | 20 |
| Example 32 | A | 1 | 87.01 | −1.53 | 1.47 | 87.16 | −1.49 | 2.67 | 1.21 | 8.5 | 8.5 | 20 |
| Example 33 | A | 1 | 86.37 | −1.59 | 1.45 | 86.47 | −1.57 | 2.65 | 1.20 | 8.5 | 8.5 | 20 |
| Example 34 | A | 1 | 86.73 | −1.51 | 1.57 | 86.88 | −1.51 | 2.87 | 1.31 | 8.5 | 20.0 | 20 |
| Example 35 | A | 1 | 87.67 | −1.59 | 2.10 | 87.67 | −1.63 | 3.30 | 1.20 | 8.5 | 8.5 | 20 |
| Example 36 | A | 1 | 86.66 | −1.23 | 1.03 | 86.61 | −1.19 | 2.33 | 1.30 | 16.0 | 16.0 | 20 |
| Example 37 | A | 1 | 86.26 | −1.29 | 1.09 | 86.16 | −1.27 | 2.49 | 1.40 | 7.5 | 7.5 | 20 |
| Example 38 | A | 1 | 87.52 | −1.51 | 1.15 | 87.37 | −1.51 | 2.45 | 1.31 | 8.5 | 8.5 | 20 |
| Example 39 | A | 1 | 87.87 | −1.89 | 1.21 | 88.02 | −1.91 | 2.41 | 1.21 | 8.5 | 8.5 | 20 |
| Example 40 | A | 1 | 87.85 | −1.84 | 1.04 | 87.95 | −1.88 | 2.24 | 1.20 | 12.0 | 12.0 | 20 |
| Example 41 | A | 1 | 86.39 | −1.61 | 0.99 | 86.44 | −1.57 | 2.19 | 1.20 | 7.5 | 7.5 | 20 |
| Example 42 | A | 1 | 87.10 | −1.71 | 1.07 | 87.10 | −1.69 | 2.37 | 1.30 | 7.5 | 7.5 | 20 |

TABLE 8-continued

| | | | L* | a* | b* | L* | a* | b* | ΔEab | | | |
|---|---|---|---|---|---|---|---|---|---|---|---|---|
| Example 43 | A | 1 | 72.40 | −1.70 | 5.50 | 72.35 | −1.70 | 6.90 | 1.40 | 12.0 | 12.0 | 20 |
| Example 44 | B | 1 | 86.40 | −1.42 | 1.25 | 86.20 | −1.52 | 2.35 | 1.12 | 8.5 | 8.5 | 25 |
| Example 45 | B | 1 | 87.01 | −1.45 | 0.69 | 86.86 | −1.52 | 1.39 | 0.72 | 7.5 | 7.5 | 20 |
| Example 46 | A | 1 | 86.81 | −1.58 | 1.47 | 86.71 | −1.60 | 2.57 | 1.10 | 8.5 | 8.5 | 25 |
| Example 47 | A | 1 | 86.66 | −1.55 | 0.89 | 86.54 | −1.56 | 1.67 | 0.79 | 7.5 | 7.5 | 20 |
| Example 48 | A | 1 | 87.67 | −1.59 | 1.26 | 87.52 | −1.63 | 2.46 | 1.21 | 8.5 | 8.5 | 25 |
| Example 49 | A | 1 | 86.61 | −1.25 | 1.01 | 86.76 | −1.21 | 2.25 | 1.25 | 8.5 | 8.5 | 25 |
| Example 50 | A | 1 | 86.16 | −1.33 | 1.25 | 86.26 | −1.31 | 2.75 | 1.50 | 8.5 | 8.5 | 25 |
| Example 51 | A | 1 | 87.37 | −1.51 | 1.19 | 87.52 | −1.51 | 2.49 | 1.31 | 8.5 | 8.5 | 25 |
| Example 52 | A | 1 | 88.02 | −1.91 | 1.23 | 88.12 | −1.93 | 2.63 | 1.40 | 8.5 | 8.5 | 25 |

TABLE 9

| | Negative-Type Photosensitive White Composition | (i) Patternability | | | | | | (ii) Pattern Shape | (iii) Adhesiveness |
|---|---|---|---|---|---|---|---|---|---|
| | | 2.38% TMAH | | 0.4% KOH | | 0.045% KOH | | | |
| | | Cutting Property | Development Adhesiveness | Cutting Property | Development Adhesiveness | Cutting Property | Development Adhesiveness | | |
| Example 53 | W-53 | A | B | A | B | A | S | B | 4 |
| Example 54 | W-54 | A | B | A | B | C | — | B | 4 |
| Example 55 | W-55 | A | A | A | A | A | S | A | 4 |
| Example 56 | W-56 | A | A | A | A | C | — | A | 4 |
| Example 57 | W-57 | A | A | A | A | A | S | A | 4 |
| Example 58 | W-58 | A | A | A | A | A | S | A | 4 |
| Example 59 | W-59 | A | B | A | B | A | S | B | 4 |
| Example 60 | W-60 | A | B | A | B | C | — | B | 4 |
| Example 61 | W-61 | A | A | A | A | A | S | A | 4 |
| Example 62 | W-62 | A | A | A | A | C | — | A | 4 |
| Example 63 | W-63 | A | A | A | A | A | S | A | 4 |
| Example 64 | W-64 | A | B | A | B | A | S | B | 4 |
| Example 65 | W-65 | A | B | A | B | C | — | B | 4 |
| Example 66 | W-66 | A | A | A | A | A | S | A | 4 |
| Example 67 | W-67 | A | A | A | A | C | — | A | 4 |
| Example 68 | W-68 | A | B | A | B | A | S | B | 5 |
| Example 69 | W-69 | A | B | A | B | C | — | B | 5 |
| Example 70 | W-70 | A | A | A | A | A | S | A | 5 |
| Example 71 | W-71 | A | A | A | A | A | S | A | 5 |
| Example 72 | W-72 | A | A | A | A | A | S | A | 5 |
| Example 73 | W-73 | A | A | A | A | A | S | A | 5 |
| Example 74 | W-74 | S | B | S | B | A | S | B | 4 |
| Example 75 | W-75 | S | B | S | B | C | — | B | 4 |
| Example 76 | W-76 | S | A | S | A | A | S | A | 4 |
| Example 77 | W-77 | S | A | S | A | C | — | A | 4 |
| Example 78 | W-78 | S | A | S | A | A | S | A | 5 |
| Example 79 | W-79 | S | A | S | A | C | — | A | 5 |

| | (iv) Chemical Resistance | (v) OD Value | (vi) Color Characteristics | | | | | | (viii) Viscosity | | (ix) Crack Resistance |
|---|---|---|---|---|---|---|---|---|---|---|---|
| | | | After Thermal Curing | | | After Additional Heating 240° C./120 minutes | | | | Immediately after Preparation | After a Week at 40° C. | |
| | | | L* | a* | b* | L* | a* | b* | ΔEab | | | |
| Example 53 | B | 0.7 | 86.82 | −1.53 | 1.45 | 86.81 | −1.65 | 2.85 | 1.41 | 8.5 | 8.5 | 25 |
| Example 54 | B | 0.7 | 87.45 | −1.55 | 1.00 | 86.96 | −1.59 | 1.54 | 0.73 | 7.5 | 7.5 | 20 |
| Example 55 | A | 0.7 | 87.95 | −1.88 | 1.04 | 88.00 | −1.92 | 2.34 | 1.30 | 8.5 | 8.5 | 25 |
| Example 56 | A | 0.7 | 87.23 | −1.57 | 0.95 | 87.56 | −1.55 | 1.77 | 0.88 | 7.5 | 7.5 | 20 |
| Example 57 | A | 0.7 | 86.44 | −1.57 | 2.30 | 86.44 | −1.53 | 4.50 | 2.20 | 8.5 | 8.5 | 25 |
| Example 58 | A | 0.7 | 87.10 | −1.69 | 2.54 | 87.05 | −1.67 | 4.64 | 2.10 | 8.5 | 8.5 | 25 |
| Example 59 | B | 0.7 | 86.62 | −1.44 | 1.40 | 86.45 | −1.65 | 2.45 | 1.08 | 8.5 | 8.5 | 25 |
| Example 60 | B | 0.7 | 87.40 | −1.40 | 0.96 | 87.20 | −1.60 | 1.60 | 0.70 | 7.5 | 7.5 | 20 |
| Example 61 | A | 0.7 | 88.10 | −1.70 | 1.24 | 88.00 | −1.66 | 2.24 | 1.01 | 8.5 | 8.5 | 25 |
| Example 62 | A | 0.7 | 87.47 | −1.47 | 0.95 | 87.20 | −1.57 | 1.55 | 0.67 | 7.5 | 7.5 | 20 |
| Example 63 | A | 0.7 | 86.71 | −1.60 | 1.47 | 86.56 | −1.58 | 2.44 | 0.98 | 8.5 | 8.5 | 25 |
| Example 64 | B | 0.7 | 87.02 | −1.45 | 1.35 | 86.96 | −1.59 | 2.45 | 1.11 | 8.5 | 8.5 | 25 |
| Example 65 | B | 0.7 | 87.25 | −1.32 | 0.87 | 87.02 | −1.45 | 1.45 | 0.64 | 7.5 | 7.5 | 20 |
| Example 66 | A | 0.7 | 87.56 | −1.54 | 1.34 | 88.00 | −1.66 | 2.24 | 1.01 | 8.5 | 8.5 | 25 |
| Example 67 | A | 0.7 | 87.66 | −1.44 | 1.00 | 87.22 | −1.57 | 1.65 | 0.80 | 7.5 | 7.5 | 20 |
| Example 68 | A | 0.7 | 87.20 | −1.50 | 1.35 | 86.91 | −1.60 | 2.75 | 1.43 | 8.5 | 8.5 | 25 |
| Example 69 | A | 0.7 | 87.45 | −1.45 | 1.01 | 87.25 | −1.65 | 1.64 | 0.69 | 7.5 | 7.5 | 20 |
| Example 70 | S | 0.7 | 87.52 | −1.63 | 1.26 | 87.67 | −1.63 | 2.56 | 1.31 | 8.5 | 8.5 | 25 |
| Example 71 | S | 0.7 | 87.42 | −1.49 | 1.01 | 87.19 | −1.57 | 1.72 | 0.75 | 7.5 | 7.5 | 20 |

TABLE 9-continued

|  |  |  |  |  |  |  |  |  |  |  |  |
|---|---|---|---|---|---|---|---|---|---|---|---|
| Example 72 | S | 0.7 | 86.76 | −1.21 | 1.01 | 86.86 | −1.23 | 1.86 | 0.86 | 8.5 | 8.5 | 25 |
| Example 73 | S | 0.7 | 87.56 | −1.48 | 0.99 | 87.20 | −1.58 | 1.56 | 0.68 | 7.5 | 7.5 | 20 |
| Example 74 | B | 0.7 | 86.77 | −1.55 | 1.44 | 86.67 | −1.59 | 2.95 | 1.51 | 8.5 | 8.5 | 25 |
| Example 75 | B | 0.7 | 87.25 | −1.45 | 1.05 | 87.04 | −1.50 | 1.75 | 0.73 | 7.5 | 7.5 | 20 |
| Example 76 | A | 0.7 | 86.26 | −1.31 | 1.05 | 86.31 | −1.35 | 2.15 | 1.10 | 8.5 | 8.5 | 25 |
| Example 77 | A | 0.7 | 87.23 | −1.57 | 0.95 | 87.56 | −1.55 | 1.67 | 0.79 | 7.5 | 7.5 | 20 |
| Example 78 | S | 0.7 | 87.42 | −1.51 | 1.19 | 87.42 | −1.47 | 1.99 | 0.80 | 8.5 | 8.5 | 25 |
| Example 79 | S | 0.7 | 87.55 | −1.52 | 0.95 | 87.35 | −1.56 | 1.55 | 0.63 | 7.5 | 7.5 | 20 |

TABLE 10

|  | Negative-Type Photosensitive White Composition | (i) Patternability | | | | | | (ii) Pattern Shape | (iii) Adhesiveness |
|---|---|---|---|---|---|---|---|---|---|
|  |  | 2.38% TMAH | | 0.4% KOH | | 0.045% KOH | | | |
|  |  | Cutting Property | Development Adhesiveness | Cutting Property | Development Adhesiveness | Cutting Property | Development Adhesiveness | | |
| Example 80 | W-80 | S | A | S | A | A | S | A | 5 |
| Example 81 | W-81 | A | B | A | B | A | S | B | 4 |
| Example 82 | W-82 | A | B | A | B | C | — | B | 4 |
| Example 83 | W-83 | A | A | A | A | A | S | A | 4 |
| Example 84 | W-84 | A | A | A | A | A | S | A | 4 |
| Example 85 | W-85 | A | A | A | A | A | S | A | 4 |
| Example 86 | W-86 | A | A | A | A | A | S | A | 4 |
| Example 87 | W-87 | S | A | S | A | A | S | A | 5 |
| Example 88 | W-88 | S | A | S | A | A | S | A | 5 |
| Example 89 | W-89 | A | B | A | B | A | S | B | 4 |
| Example 90 | W-90 | A | B | A | B | A | S | B | 4 |
| Example 91 | W-91 | A | B | A | B | A | S | B | 4 |
| Example 92 | W-92 | A | B | A | B | A | S | B | 4 |
| Example 93 | W-93 | A | B | A | B | A | S | B | 4 |
| Example 94 | W-94 | A | B | A | B | A | S | B | 4 |
| Example 95 | W-95 | A | B | A | B | A | S | B | 4 |
| Example 96 | W-96 | A | B | A | B | A | S | B | 4 |
| Example 97 | W-97 | A | B | A | B | A | S | B | 4 |
| Example 98 | W-98 | A | B | A | B | A | S | B | 4 |
| Example 99 | W-99 | A | B | A | B | A | S | B | 4 |
| Example 100 | W-100 | A | B | A | B | A | S | B | 4 |
| Example 101 | W-101 | S | A | S | A | A | S | A | 5 |
| Example 102 | W-102 | S | A | S | A | A | S | A | 5 |
| Example 103 | W-29 | A | S | A | S | — | — | A | 4 |
| Example 104 | W-56 | S | A | S | A | — | — | A | 4 |
| Example 105 | W-29 | A | S | A | S | — | — | B | 4 |
| Example 106 | W-56 | S | A | S | A | — | — | B | 4 |

|  | (iv) Chemical Resistance | (v) OD Value | (vi) Color Characteristics | | | | | | (viii) Viscosity | | (ix) Crack Resistance |
|---|---|---|---|---|---|---|---|---|---|---|---|
|  |  |  | After Thermal Curing | | | After Additional Heating 240° C./120 minutes | | | Immediately after Preparation | After a Week at 40° C. |  |
|  |  |  | L* | a* | b* | L* | a* | b* | ΔEab | | | |
| Example 80 | S | 0.7 | 88.02 | −1.93 | 1.23 | 87.97 | −1.91 | 1.98 | 0.75 | 8.0 | 8.0 | 25 |
| Example 81 | B | 0.7 | 85.55 | −0.53 | 0.91 | 85.23 | −0.71 | 2.31 | 1.45 | 8.5 | 8.5 | 25 |
| Example 82 | B | 0.7 | 86.18 | −0.55 | 0.46 | 85.38 | −0.65 | 1.00 | 0.97 | 7.5 | 7.5 | 20 |
| Example 83 | A | 0.7 | 86.68 | −0.88 | 0.50 | 86.42 | −0.98 | 1.80 | 1.33 | 8.5 | 8.5 | 25 |
| Example 84 | A | 0.7 | 87.31 | −0.90 | 0.05 | 86.57 | −0.92 | 0.76 | 1.03 | 7.5 | 7.5 | 20 |
| Example 85 | A | 0.7 | 87.20 | −2.02 | −0.50 | 86.95 | −2.03 | 0.80 | 1.32 | 8.5 | 8.5 | 25 |
| Example 86 | A | 0.7 | 87.83 | −2.04 | −0.95 | 87.10 | −1.97 | −0.24 | 1.02 | 8.5 | 8.5 | 25 |
| Example 87 | S | 0.7 | 87.45 | −0.76 | 0.45 | 87.52 | −0.75 | 1.22 | 0.87 | 8.5 | 8.5 | 25 |
| Example 88 | S | 0.7 | 87.87 | −0.85 | 0.54 | 87.66 | −0.88 | 1.05 | 0.55 | 7.5 | 7.5 | 20 |
| Example 89 | B | 0.7 | 84.51 | −4.5 | −4.48 | 84.13 | −4.57 | −3.16 | 1.38 | 8.5 | 8.5 | 25 |
| Example 90 | B | 0.7 | 84.28 | −5.17 | −3.98 | 83.67 | −5.18 | −3.42 | 0.83 | 7.5 | 7.5 | 20 |
| Example 91 | B | 0.7 | 86.74 | −1.54 | −1.25 | 86.17 | −1.64 | −0.01 | 1.37 | 8.5 | 8.5 | 25 |
| Example 92 | B | 0.7 | 86.2 | −2.21 | −0.81 | 85.71 | −2.25 | −0.27 | 0.73 | 7.5 | 7.5 | 20 |
| Example 93 | B | 0.7 | 86.48 | 0.68 | 1.35 | 86.47 | 0.66 | 2.55 | 1.20 | 8.5 | 8.5 | 25 |
| Example 94 | B | 0.7 | 86.25 | 0.01 | 1.85 | 86.01 | 0.05 | 2.29 | 0.50 | 7.5 | 7.5 | 20 |
| Example 95 | B | 0.7 | 86.18 | 0.99 | 1.71 | 86.2 | 1.07 | 3.07 | 1.46 | 8.5 | 8.5 | 25 |
| Example 96 | B | 0.7 | 86.23 | −0.11 | 2.27 | 85.74 | −0.15 | 2.81 | 0.73 | 7.5 | 7.5 | 20 |
| Example 97 | B | 0.7 | 82.27 | 4.96 | −6.44 | 82.25 | 4.63 | −4.66 | 1.81 | 8.5 | 8.5 | 25 |
| Example 98 | B | 0.7 | 82.04 | 4.29 | −5.94 | 81.79 | 4.02 | −4.92 | 1.08 | 7.5 | 7.5 | 20 |
| Example 99 | B | 0.7 | 85.54 | 0.02 | −0.4 | 85.22 | 0 | 0.74 | 1.18 | 8.5 | 8.5 | 25 |
| Example 100 | B | 0.7 | 85.31 | −0.65 | 0.1 | 84.76 | −0.61 | 0.48 | 0.67 | 7.5 | 7.5 | 20 |

TABLE 10-continued

|  |  |  |  |  |  |  |  |  |  |  |  |
|---|---|---|---|---|---|---|---|---|---|---|---|
| Example 101 | S | 0.7 | 85.31 | 0.14 | −0.45 | 85.32 | 0.23 | 0.16 | 0.62 | 8.5 | 8.5 | 25 |
| Example 102 | S | 0.7 | 85.73 | 0.05 | −0.36 | 85.46 | 0.1 | −0.01 | 0.44 | 7.5 | 7.5 | 20 |
| Example 103 | A | 0.7 | 86.76 | −1.60 | 1.45 | 86.81 | −1.62 | 2.75 | 1.30 | — | — | — |
| Example 104 | A | 0.7 | 87.03 | −1.57 | 0.97 | 86.95 | −1.55 | 1.89 | 0.92 | — | — | — |
| Example 105 | A | 0.7 | 86.76 | −1.60 | 1.45 | 86.81 | −1.62 | 2.75 | 1.30 | — | — | — |
| Example 106 | A | 0.7 | 87.03 | −1.57 | 0.97 | 86.95 | −1.55 | 1.89 | 0.92 | — | — | — |

TABLE 11

|  | Negative-Type Photosensitive White Composition | Continuity Test | OD Value | Color Characteristics L* | a* | b* | Adhesiveness |
|---|---|---|---|---|---|---|---|
| Example 1 | W-1 | good | 0.7 | 86.37 | −1.63 | 1.70 | 3 |
| Example 2 | W-2 | good | 0.7 | 86.96 | −1.57 | 1.34 | 3 |
| Example 3 | W-3 | good | 0.7 | 87.46 | −1.77 | 1.61 | 3 |
| Example 4 | W-4 | good | 0.7 | 86.78 | −1.59 | 1.38 | 3 |
| Example 5 | W-5 | good | 0.7 | 87.60 | −1.32 | 1.50 | 3 |
| Example 6 | W-6 | good | 0.75 | 90.30 | −1.34 | 1.52 | 3 |
| Example 7 | W-7 | good | −0.3 | 86.43 | −1.65 | 1.12 | 3 |
| Example 8 | W-8 | good | 0.7 | 86.96 | −1.64 | 1.85 | 3 |
| Example 9 | W-9 | good | 0.7 | 87.52 | −1.63 | 2.65 | 3 |
| Example 10 | W-10 | good | 0.7 | 86.51 | −1.17 | 1.68 | 3 |
| Example 11 | W-11 | good | 0.7 | 86.11 | −1.23 | 1.54 | 3 |
| Example 12 | W-12 | good | 0.7 | 87.37 | −1.55 | 1.75 | 3 |
| Example 13 | W-13 | good | 0.7 | 88.07 | −1.93 | 1.61 | 3 |
| Example 14 | W-14 | good | 0.7 | 88.05 | −1.88 | 1.59 | 3 |
| Example 15 | W-15 | good | 0.7 | 86.59 | −1.55 | 1.59 | 3 |
| Example 16 | W-16 | good | 0.55 | 86.95 | −1.65 | 1.47 | 3 |
| Example 17 | W-17 | good | 0.7 | 72.40 | −1.78 | 6.05 | 3 |
| Example 18 | W-18 | good | 1.7 | 87.07 | −1.80 | 2.15 | 3 |
| Example 19 | W-19 | good | 2.7 | 87.00 | −1.92 | 1.42 | 3 |
| Example 20 | W-20 | good | 3.7 | 87.16 | −1.55 | 1.70 | 3 |
| Example 21 | W-21 | good | 4.7 | 86.80 | −1.49 | 1.02 | 3 |
| Example 22 | W-22 | good | 0.7 | 86.42 | −1.55 | 1.70 | 4 |
| Example 23 | W-23 | good | 0.7 | 86.96 | −1.51 | 1.34 | 4 |
| Example 24 | W-24 | good | 0.7 | 87.76 | −1.73 | 1.61 | 4 |
| Example 25 | W-25 | good | 0.7 | 87.03 | −1.67 | 1.38 | 4 |
| Example 26 | W-26 | good | 0.7 | 87.45 | −1.42 | 1.50 | 4 |
| Example 27 | W-27 | good | 0.75 | 90.10 | −1.26 | 1.52 | 4 |
| Example 28 | W-28 | good | −0.3 | 86.79 | −1.66 | 1.25 | 4 |
| Example 29 | W-29 | good | 0.7 | 86.71 | −1.58 | 1.85 | 4 |
| Example 30 | W-30 | good | 0.7 | 86.71 | −1.62 | 1.90 | 4 |
| Example 31 | W-31 | good | 0.7 | 86.88 | −1.58 | 1.94 | 4 |
| Example 32 | W-32 | good | 0.7 | 86.86 | −1.49 | 1.87 | 4 |
| Example 33 | W-33 | good | 0.7 | 86.27 | −1.57 | 1.97 | 4 |
| Example 34 | W-34 | good | 0.7 | 86.58 | −1.47 | 2.02 | 4 |
| Example 35 | W-35 | good | 0.7 | 87.57 | −1.55 | 2.65 | 4 |
| Example 36 | W-36 | good | 0.7 | 86.51 | −1.21 | 1.68 | 4 |
| Example 37 | W-37 | good | 0.7 | 86.16 | −1.29 | 1.54 | 4 |
| Example 38 | W-38 | good | 0.7 | 87.37 | −1.53 | 1.55 | 4 |
| Example 39 | W-39 | good | 0.7 | 88.02 | −1.93 | 1.76 | 4 |
| Example 40 | W-40 | good | 0.7 | 87.95 | −1.80 | 1.69 | 4 |
| Example 41 | W-41 | good | 0.7 | 86.44 | −1.59 | 1.44 | 4 |
| Example 42 | W-42 | good | 0.7 | 87.10 | −1.67 | 1.67 | 4 |
| Example 43 | W-43 | good | 0.55 | 72.35 | −1.68 | 5.90 | 4 |
| Example 44 | W-44 | good | 0.7 | 86.10 | −1.62 | 1.85 | 3 |
| Example 45 | W-45 | good | 0.7 | 86.76 | −1.62 | 0.89 | 3 |
| Example 46 | W-46 | good | 0.7 | 86.71 | −1.58 | 2.02 | 4 |
| Example 47 | W-47 | good | 0.7 | 86.44 | −1.66 | 1.17 | 4 |
| Example 48 | W-48 | good | 0.7 | 87.52 | −1.61 | 1.71 | 4 |
| Example 49 | W-49 | good | 0.7 | 86.51 | −1.29 | 1.61 | 4 |
| Example 50 | W-50 | good | 0.7 | 86.01 | −1.29 | 1.45 | 4 |

TABLE 12

| | Negative-Type Photosensitive White Composition | Continuity Test | OD Value | Color Characteristics L* | a* | b* | Adhesiveness |
|---|---|---|---|---|---|---|---|
| Example 51 | W-51 | good | 0.7 | 87.52 | −1.49 | 1.74 | 4 |
| Example 52 | W-52 | good | 0.7 | 88.12 | −1.87 | 1.83 | 4 |
| Example 53 | W-53 | good | 0.7 | 86.71 | −1.75 | 2.35 | 3 |
| Example 54 | W-54 | good | 0.7 | 86.86 | −1.69 | 1.04 | 3 |
| Example 55 | W-55 | good | 0.7 | 88.00 | −1.86 | 1.44 | 4 |
| Example 56 | W-56 | good | 0.7 | 87.46 | −1.65 | 1.27 | 4 |
| Example 57 | W-57 | good | 0.7 | 86.44 | −1.57 | 2.85 | 4 |
| Example 58 | W-58 | good | 0.7 | 87.05 | −1.71 | 2.99 | 4 |
| Example 59 | W-59 | good | 0.7 | 86.35 | −1.75 | 1.95 | 3 |
| Example 60 | W-60 | good | 0.7 | 87.10 | −1.70 | 1.10 | 3 |
| Example 61 | W-61 | good | 0.7 | 88.00 | −1.74 | 1.84 | 4 |
| Example 62 | W-62 | good | 0.7 | 87.10 | −1.67 | 1.05 | 4 |
| Example 63 | W-63 | good | 0.7 | 86.56 | −1.56 | 1.87 | 4 |
| Example 64 | W-64 | good | 0.7 | 86.86 | −1.69 | 1.95 | 3 |
| Example 65 | W-65 | good | 0.7 | 86.92 | −1.55 | 0.95 | 3 |
| Example 66 | W-66 | good | 0.7 | 87.90 | −1.76 | 1.74 | 4 |
| Example 67 | W-67 | good | 0.7 | 87.12 | −1.67 | 1.15 | 4 |
| Example 68 | W-68 | good | 0.7 | 86.81 | −1.70 | 2.25 | 4 |
| Example 69 | W-69 | good | 0.7 | 87.15 | −1.75 | 1.14 | 4 |
| Example 70 | W-70 | good | 0.7 | 87.42 | −1.61 | 1.81 | 5 |
| Example 71 | W-71 | good | 0.7 | 87.09 | −1.67 | 1.22 | 5 |
| Example 72 | W-72 | good | 0.7 | 86.61 | −1.17 | 1.61 | 5 |
| Example 73 | W-73 | good | 0.7 | 87.10 | −1.68 | 1.06 | 5 |
| Example 74 | W-74 | good | 0.7 | 86.57 | −1.69 | 2.45 | 3 |
| Example 75 | W-75 | good | 0.7 | 86.94 | −1.60 | 1.25 | 3 |
| Example 76 | W-76 | good | 0.7 | 86.41 | −1.29 | 1.45 | 4 |
| Example 77 | W-77 | good | 0.7 | 87.46 | −1.65 | 1.17 | 4 |
| Example 78 | W-78 | good | 0.7 | 87.52 | −1.51 | 1.74 | 5 |
| Example 79 | W-79 | good | 0.7 | 87.25 | −1.66 | 1.05 | 5 |
| Example 80 | W-80 | good | 0.7 | 88.07 | −1.95 | 1.83 | 5 |
| Example 81 | W-81 | good | 0.7 | 85.13 | −0.81 | 1.81 | 3 |
| Example 82 | W-82 | good | 0.7 | 85.28 | −0.75 | 0.50 | 3 |
| Example 83 | W-83 | good | 0.7 | 86.75 | −0.57 | 1.32 | 4 |
| Example 84 | W-84 | good | 0.7 | 86.47 | −1.02 | 0.26 | 4 |
| Example 85 | W-85 | good | 0.7 | 86.93 | −1.88 | 0.10 | 4 |
| Example 86 | W-86 | good | 0.7 | 87.00 | −2.07 | −0.74 | 4 |
| Example 87 | W-87 | good | 0.7 | 87.34 | −0.66 | 1.22 | 5 |
| Example 88 | W-88 | good | 0.7 | 87.94 | −0.80 | 1.01 | 5 |
| Example 89 | W-89 | good | 0.7 | 84.03 | −4.67 | −3.66 | 3 |
| Example 90 | W-90 | good | 0.7 | 83.57 | −5.28 | −3.92 | 3 |
| Example 91 | W-91 | good | 0.7 | 86.07 | −1.74 | −0.51 | 3 |
| Example 92 | W-92 | good | 0.7 | 85.61 | −2.35 | −0.77 | 3 |
| Example 93 | W-93 | good | 0.7 | 86.37 | 0.56 | 2.05 | 3 |
| Example 94 | W-94 | good | 0.7 | 85.91 | −0.05 | 1.79 | 3 |
| Example 95 | W-95 | good | 0.7 | 86.10 | 0.36 | 2.57 | 3 |
| Example 96 | W-96 | good | 0.7 | 85.64 | −0.25 | 2.31 | 3 |
| Example 97 | W-97 | good | 0.7 | 82.15 | 4.53 | −5.16 | 3 |
| Example 98 | W-98 | good | 0.7 | 81.69 | 3.92 | −5.42 | 3 |
| Example 99 | W-99 | good | 0.7 | 85.12 | −0.10 | 0.24 | 3 |
| Example 100 | W-100 | good | 0.7 | 84.66 | −0.71 | −0.02 | 3 |
| Example 101 | W-101 | good | 0.7 | 85.22 | 0.13 | −0.34 | 5 |
| Example 102 | W-102 | good | 0.7 | 85.36 | 0.00 | −0.51 | 5 |

Example 107

A touch panel substrate was prepared according to the following procedure.

(1) Preparation of White Light-Shielding Pattern

A glass substrate having a white light-shielding pattern was prepared in the same manner as in the above (vii) (1) using the negative-type photosensitive white composition (W-29) obtained in Preparation Example 29.

(2) Formation of Transparent Resin Film

A glass substrate having a transparent resin film was prepared in the same manner as in the above (vii) (3) except for using the negative-type photosensitive transparent composition (Cr-1) obtained in Preparation Example 50 on the glass substrate obtained in the above (1) to form a film thickness of 2 μm and performing exposure through a patterned mask larger than the white light-shielding pattern by 400 μm.

(3) Formation of Patterned ITO

A glass substrate having a patterned ITO having a thickness of 150 nm was prepared on the glass substrate obtained in the above (2), in the same manner as in the above (vii) (2).

(4) Formation of Transparent Insulating Film

A glass substrate having a transparent insulating film was prepared on the glass substrate obtained in the above (3) in the same manner as in the above (vii) (3).

(5) Formation of MAM Wire

Figure 3:
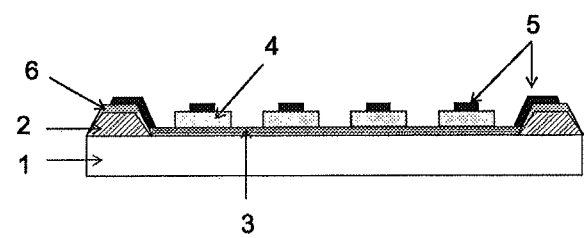
FIG. 3 is a schematic view showing a cross-section of a touch panel substrate prepared in Example 107.

On the glass substrate obtained in the above (4), MAM wires were prepared in the same manner as in the above (vii) (4) to complete a touch panel substrate (FIG. 3).

The continuity test of the resulting touch panel substrate was performed. Further, reflection chromaticity, an OD value and adhesiveness of a white cured film area were evaluated.

Example 108

This example was performed in the same manner as in Example 107 except for using the negative-type photosensitive white composition (W-56) in place of the negative-type photosensitive white composition (W-29).

Example 109

Figure 4:
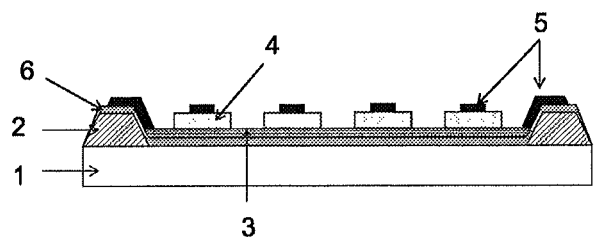
FIG. 4 is a schematic view showing a cross-section of a touch panel substrate prepared in Example 109.

A touch panel substrate was completed in the same manner as in Example 58 except for exposing the transparent composition to light not through a mask in the step of (2) Formation of Transparent Resin Film (FIG. 4).

The continuity test of the resulting touch panel substrate was performed. Further, reflection chromaticity, an OD value and adhesiveness of a white cured film area were evaluated.

Example 110

This example was performed in the same manner as in Example 107 except for using the negative-type photosensitive white composition (W-56) in place of the negative-type photosensitive white composition (W-29).

Example 111

Preparation and evaluation of the touch panel substrate were performed in the same manner as in Example 109 except for using a high-speed plasma CVD deposition apparatus (PD-270STL; manufactured by SAMCO INC.) in place of the step of (2) Formation of Transparent Resin Film and forming a silicon oxide thin film with a thickness of 0.3 µm by using tetraethoxysilane as a raw material.

Example 112

This example was performed in the same manner as in Example 111 except for using the negative-type photosensitive white composition (W-56) in place of the negative-type photosensitive white composition (W-29).

Example 113

(1) Preparation of White Light-Shielding Pattern

A glass substrate having a white light-shielding pattern was prepared in the same manner as in the above (vii) (1) using the negative-type photosensitive white composition (W-29) prepared in Preparation Example 29.

(2) Preparation of Black Light-Shielding Cured Film

On the glass substrate obtained in the above (1), black light-shielding cured films were prepared in the same manner as in the above (vii) (1) except for using the negative-type photosensitive black composition (Bk-1) obtained in Preparation Example 51 to form a film thickness of 2 µm, performing exposure through a patterned mask smaller than the white light-shielding pattern by 400 µm and using a 0.045% by mass KOH aqueous solution as a developer.

(3) Formation of Patterned ITO

A glass substrate having a patterned ITO having a thickness of 150 nm was prepared on the glass substrate obtained in the above (2) in the same manner as in the above (vii) (2).

(4) Formation of Transparent Insulating Film

A glass substrate having a transparent insulating film was prepared on the glass substrate obtained in the above (3) in the same manner as in the above (vii) (3).

(5) Formation of MAM Wire

Figure 5:
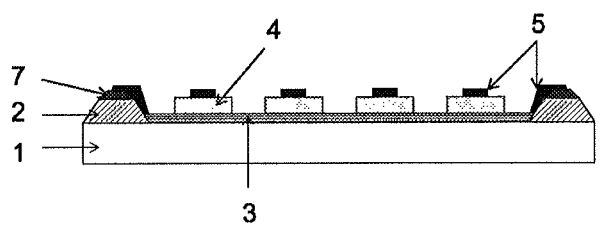
FIG. 5 is a schematic view showing a cross-section of a touch panel substrate prepared in Example 113.

On the glass substrate obtained in the above (4), MAM wires were prepared in the same manner as in the above (vii) (4) to complete a touch panel substrate (FIG. 5).

The continuity test of the resulting touch panel substrate was performed. Further, reflection chromaticity, an OD value and adhesiveness of a white cured film area were evaluated.

Example 114

This example was performed in the same manner as in Example 113 except for using the negative-type photosensitive white composition (W-56) in place of the negative-type photosensitive white composition (W-29).

Example 115

(1) Preparation of White Light-Shielding Pattern

A glass substrate having a white light-shielding pattern was prepared in the same manner as in the above (vii) (1) using the negative-type photosensitive white composition (W-29) obtained in Preparation Example 29.

(2) Preparation of Black Light-Shielding Cured Film

On the glass substrate obtained in the above (1), black light-shielding cured films were prepared in the same manner as in the above (vii) (1) except for using the negative-type photosensitive black composition (Bk-1) obtained in Preparation Example 51 to form a film thickness of 2 performing exposure through a patterned mask smaller than the white light-shielding pattern by 400 µm and using a 0.045% by mass KOH aqueous solution as a developer.

(3) Formation of Transparent Resin Film

A glass substrate having a transparent resin film was prepared in the same manner as in the above (vii) (3) except for using the negative-type photosensitive transparent composition (Cr-1) obtained in Preparation Example 50 on the glass substrate obtained in the above (2) to form a film thickness of 2 µm and performing exposure through a patterned mask larger than the white light-shielding pattern by 400 µm.

(4) Formation of Patterned ITO

A glass substrate having a patterned ITO having a thickness of 150 nm was prepared on the glass substrate obtained in the above (3) in the same manner as in the above (vii) (2).

(5) Formation of Transparent Insulating Film

A glass substrate having a transparent insulating film was prepared on the glass substrate obtained in the above (4), in the same manner as in the above (vii) (3).

(6) Formation of MAM Wire

Figure 6:
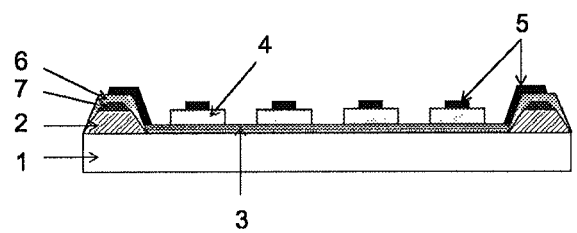
FIG. 6 is a schematic view showing a cross-section of a touch panel substrate prepared in Example 115.

On the glass substrate obtained in the above (5), MAM wires were prepared in the same manner as in the above (vii) (4) to complete a touch panel substrate (FIG. 6).

The continuity test of the resulting touch panel substrate was performed. Further, reflection chromaticity, an OD value and adhesiveness of a white cured film area were evaluated.

Example 116

This example was performed in the same manner as in Example 115 except for using the negative-type photosensitive white composition (W-56) in place of the negative-type photosensitive white composition (W-29).

Example 117

Figure 7:
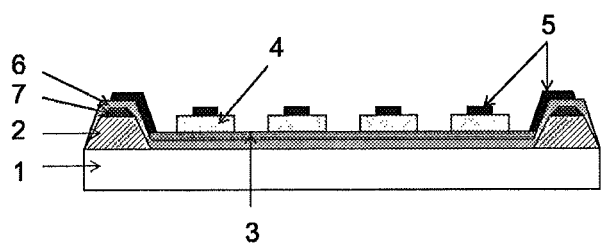
FIG. 7 is a schematic view showing a cross-section of a touch panel substrate prepared in Example 117.

A touch panel was completed in the same manner as in Example 115 except for exposing the transparent composition to light not through a mask in the step of (3) Formation of Transparent Resin Film (FIG. 7).

The continuity test of the resulting touch panel substrate was performed. Further, reflection chromaticity, an OD value and adhesiveness of a white cured film area were evaluated.

Example 118

This example was performed in the same manner as in Example 117 except for using the negative-type photosensitive white composition (W-56) in place of the negative-type photosensitive white composition (W-29).

Example 119

This example was performed in the same manner as in Example 117 except for using a high-speed plasma CVD deposition apparatus (PD-270STL; manufactured by SAMCO INC.) in place of the step of (3) Formation of Transparent Resin Film and forming a silicon oxide thin film with a thickness of 0.3 µm by using tetraethoxysilane as a raw material.

Example 120

This example was performed in the same manner as in Example 119 except for using the negative-type photosensitive white composition (W-56) in place of the negative-type photosensitive white composition (W-29).

Example 121

Figure 8:
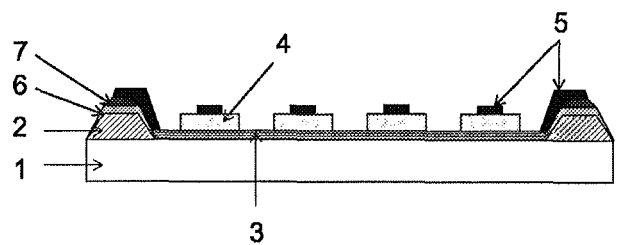
FIG. 8 is a schematic view showing a cross-section of a touch panel substrate prepared in Example 121.

A touch panel substrate was completed in the same manner as in Example 61 except for reversing a sequence of the step of (2) Preparation of Black Light-Shielding Cured Film and the step of (3) Formation of Transparent Resin Film (FIG. 8).

The continuity test of the resulting touch panel substrate was performed. Further, reflection chromaticity, an OD value and adhesiveness of a white cured film area were evaluated.

Example 122

This example was performed in the same manner as in Example 121 except for using the negative-type photosensitive white composition (W-56) in place of the negative-type photosensitive white composition (W-29).

Example 123

Figure 9:
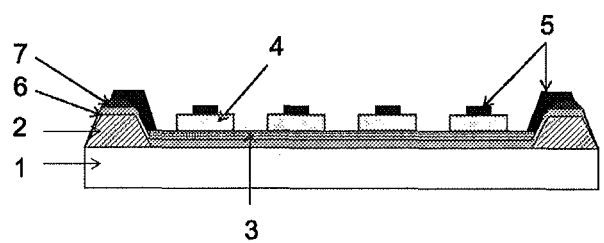
FIG. 9 is a schematic view showing a cross-section of a touch panel substrate prepared in Example 123.

A touch panel substrate was completed in the same manner as in Example 62 except for reversing a sequence of the step of (2) Preparation of Black Light-Shielding Cured Film and the step of (3) Formation of Transparent Resin Film (FIG. 9).

The continuity test of the resulting touch panel substrate was performed. Further, reflection chromaticity, an OD value and adhesiveness of a white cured film area were evaluated.

Example 124

This example was performed in the same manner as in Example 123 except for using the negative-type photosensitive white composition (W-56) in place of the negative-type photosensitive white composition (W-29).

Example 125

(1) Preparation of White Light-Shielding Pattern

A glass substrate having a white light-shielding pattern was prepared in the same manner as in the above (vii) using the negative-type photosensitive white composition (W-29) obtained in Preparation Example 29.

(2) Formation of Transparent Resin Film

A glass substrate having a transparent resin film was prepared following the same procedure as in the above (vii) except for using the negative-type photosensitive transparent composition (Cr-1) obtained in Preparation Example 50 on the glass substrate obtained in the above (1) to form a film thickness of 2 µm and performing exposure not through a mask.

(3) Preparation of Black Light-Shielding Cured Film

On the glass substrate obtained in the above (2), black light-shielding cured films were prepared following the same procedure as in the above (vii) except for using the negative-type photosensitive black composition (Bk-1) obtained in Preparation Example 51 to form a film thickness of 2 µm, performing exposure through a patterned mask smaller than the white light-shielding pattern by 400 µm and using a 0.045% KOH aqueous solution as a developer.

(4) Formation of Transparent Resin Film

A glass substrate having a transparent resin film was prepared following the same procedure as in the above (vii) except for using the negative-type photosensitive transparent composition (Cr-1) obtained in Preparation Example 50 on the glass substrate obtained in the above (3) to form a film thickness of 2 µm and performing exposure through a patterned mask larger than the white light-shielding pattern by 400 µm.

(5) Formation of Patterned ITO

A glass substrate having a patterned ITO having a thickness of 150 nm was prepared on the glass substrate obtained in the above (4), in the same manner as in the above (vii).

(6) Formation of Transparent Insulating Film

A glass substrate having a transparent insulating film was prepared on the glass substrate obtained in the above (5), in the same manner as in the above (vii).

(7) Formation of MAM Wire

Figure 10:
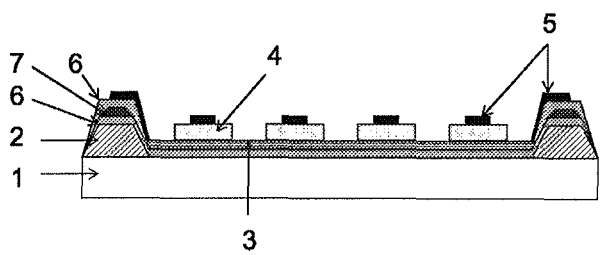
FIG. 10 is a schematic view showing a cross-section of a touch panel substrate prepared in Example 125.

On the glass substrate obtained in the above (6), MAM wires were prepared in the same manner as in the above (vii) to complete a touch panel substrate (FIG. 10).

The continuity test of the resulting touch panel substrate was performed. Further, reflection chromaticity, an OD value and adhesiveness of a white cured film area were evaluated.

Example 126

This example was performed in the same manner as in Example 125 except for using the negative-type photosensitive white composition (W-56) in place of the negative-type photosensitive white composition (W-29).

Example 127

(1) Preparation of White Light-Shielding Pattern 1

Using the negative-type photosensitive white composition (W-29) obtained in Preparation Example 29, a glass substrate having a white light-shielding pattern was prepared so as to be 10 μm in film thickness and 2600 μmin line width in the same manner as in the above (vii).

(2) Preparation of White Light-Shielding Pattern 2

On the glass substrate obtained in the above (1), a glass substrate having a white light-shielding pattern was prepared using the negative-type photosensitive white composition (W-29) obtained in Preparation Example 29 so as to be 5 μm in film thickness and 3000 μm in line width in the same manner as in the above (vii).

(3) Preparation of Black Light-Shielding Cured Film

On the glass substrate obtained in the above (2), black light-shielding cured films were prepared in the same manner as in the above (vii) (1) except for using the negative-type photosensitive black composition (Bk-1) obtained in Preparation Example 51 to form a film thickness of 2 μm, performing exposure through a patterned mask smaller than the white light-shielding pattern by 400 μm and using a 0.045% by mass KOH aqueous solution as a developer.

(4) Formation of Transparent Resin Film

A glass substrate having a transparent resin film was prepared in the same manner as in the above (vii) (3) except for using the negative-type photosensitive transparent composition (Cr-1) obtained in Preparation Example 50 on the glass substrate obtained in the above (3) to form a film thickness of 2 μm and performing exposure through a patterned mask larger than the white light-shielding pattern by 400 μm.

(5) Formation of Patterned ITO

A glass substrate having a patterned ITO having a thickness of 150 nm was prepared in the same manner as in the above (vii) (2) on the glass substrate obtained in the above (4).

(6) Formation of Transparent Insulating Film

A glass substrate having a transparent insulating film was prepared in the same manner as in the above (vii) (3) on the glass substrate obtained in the above (5).

(7) Formation of MAM Wire

Figure 11:
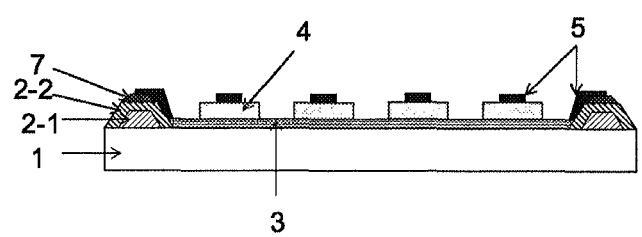
FIG. 11 is a schematic view showing a cross-section of a touch panel substrate prepared in Example 127.

On the glass substrate obtained in the above (6), MAM wires were prepared in the same manner as in the above (vii) (4) to complete a touch panel substrate (FIG. 11).

The continuity test of the resulting touch panel substrate was performed. Further, reflection chromaticity, an OD value and adhesiveness of a white cured film area were evaluated.

Example 128

This example was performed in the same manner as in Example 127 except for using the negative-type photosensitive white composition (W-56) in place of the negative-type photosensitive white composition (W-29).

Example 129

This example was performed in the same manner as in Example 127 except that the non-photosensitive white composition (HW-2) obtained in Preparation Example 104 was used in place of the negative-type photosensitive white composition (W-29) in the preparation of the white light-shielding pattern 1, the HW-2 was applied with use of a screen printer, a substrate was pre-baked at 100° C. for 3 minutes with use of a hot plate, and then the substrate was cured at 230° C. for 30 minutes in air using an oven to prepare a glass substrate.

Example 130

This example was performed in the same manner as in Example 129 except for using the negative-type photosensitive white composition (W-56) in place of the negative-type photosensitive white composition (W-29) in the preparation of the white light-shielding pattern 2.

Example 131

This example was performed in the same manner as in Example 127 except for switching between the preparation conditions of the white light-shielding pattern 1 and the preparation conditions of the white light-shielding pattern 2.

Example 132

This example was performed in the same manner as in Example 131 except for using the negative-type photosensitive white composition (W-56) in place of the negative-type photosensitive white composition (W-29).

Example 133

(1) Preparation of White Light-Shielding Pattern 1

A glass substrate having a white light-shielding pattern was prepared using the negative-type photosensitive white composition (W-29) obtained in Preparation Example 29 so as to be 5 μm in film thickness and 3000 μmin line width in the same manner as in the above (vii).

(2) Preparation of White Light-Shielding Pattern 2

The non-photosensitive white composition (HW-2) obtained in Preparation Example 104 was applied onto the glass substrate obtained in the above (1) so as to be 10 μm in film thickness and 2800 μm in line width (without running but of the white light-shielding pattern 1) with use of a screen printer, and the substrate was pre-baked at 100° C. for 3 minutes with use of a hot plate. Next, the substrate was cured at 230° C. for 30 minutes in air using an oven to prepare a glass substrate having a white light-shielding pattern.

(3) Preparation of Black Light-Shielding Cured Film

On the glass substrate obtained in the above (2), black light-shielding cured films were prepared in the same manner as in the above (vii) (1) except for using the negative-type photosensitive black composition (Bk-1) obtained in Preparation Example 51 to form a film thickness of 2 μm, performing exposure through a patterned mask smaller than the white light-shielding pattern by 400 μm and using a 0.045% by mass KOH aqueous solution as a developer.

(4) Formation of Transparent Resin Film

A glass substrate having a transparent resin film was prepared in the same manner as in the above (vii) (3) except for using the negative-type photosensitive transparent composition (Cr-1) obtained in Preparation Example 50 on the glass substrate obtained in the above (3) to form a film thickness of 2 μm and performing exposure through a patterned mask larger than the white light-shielding pattern by 400 μm.

(5) Formation of Patterned ITO

A glass substrate having a patterned ITO having a thickness of 150 nm was prepared in the same manner as in the above (vii) (2) on the glass substrate obtained in the above (4).

(6) Formation of Transparent Insulating Film

A glass substrate having a transparent insulating film was prepared in the same manner as in the above (vii) (3) on the glass substrate obtained in the above (5).

(7) Formation of MAM Wire

Figure 12:
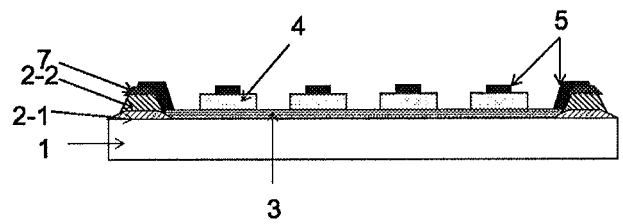
FIG. 12 is a schematic view showing a cross-section of a touch panel substrate prepared in Example 133.

On the glass substrate obtained in the above (6), MAM wires were prepared in the same manner as in the above (vii) (4) to complete a touch panel substrate (FIG. 12).

The continuity test of the resulting touch panel substrate was performed. Further, reflection chromaticity, an OD value and adhesiveness of a white cured film area were evaluated.

Example 134

This example was performed in the same manner as in Example 133 except for using the negative-type photosensitive white composition (W-56) in place of the negative-type photosensitive white composition (W-29).

Example 135

(1) Preparation of White Light-Shielding Pattern 1

A glass substrate having a white light-shielding pattern was prepared using the negative-type photosensitive white composition (W-29) obtained in Preparation Example 29 so as to be 10 μm in film thickness and 300 μm in line width, in the same manner as in the above (vii).

(2) Preparation of White Light-Shielding Pattern 2

The non-photosensitive white composition (HW-2) obtained in Preparation Example 104 was applied onto the glass substrate obtained in the above (1) so as to be 15 μm in film thickness and 2950 μm in line width (its inner end is aligned with a position of a central part of the white light-shielding pattern 1) with use of a screen printer, and the substrate was pre-baked at 100° C. for 3 minutes with use of a hot plate. Next, the substrate was cured at 230° C. for 30 minutes in air using an oven to prepare a glass substrate having a white light-shielding pattern.

(3) Preparation of Black Light-Shielding Cured Film

On the glass substrate obtained in the above (2), black light-shielding cured films were prepared in the same manner as in the above (vii) (1) except for using the negative-type photosensitive black composition (Bk-1) obtained in Preparation Example 51 to form a film thickness of 2 μm, performing exposure through a patterned mask smaller than the white light-shielding pattern by 400 μm and using a 0.045% by mass KOH aqueous solution as a developer.

(4) Formation of Transparent Resin Film

A glass substrate having a transparent resin film was prepared in the same manner as in the above (vii) (3) except for using the negative-type photosensitive transparent composition (Cr-1) obtained in Preparation Example 50 on the glass substrate obtained in the above (3) to form a film thickness of 2 μm and performing exposure through a patterned mask larger than the white light-shielding pattern by 400

(5) Formation of Patterned ITO

A glass substrate having a patterned ITO having a thickness of 150 nm was prepared in the same manner as in the above (vii) (2) on the glass substrate obtained in the above (4).

(6) Formation of Transparent Insulating Film

A glass substrate having a transparent insulating film was prepared in the same manner as in the above (vii) (3) on the glass substrate obtained in the above (5).

(7) Formation of MAM Wire

Figure 13:
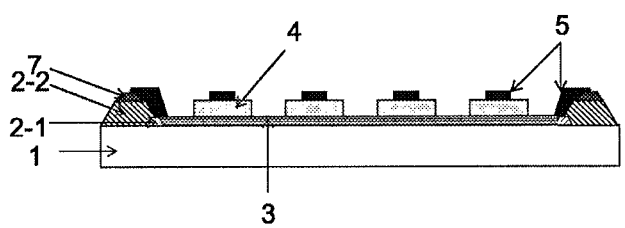
FIG. 13 is a schematic view showing a cross-section of a touch panel substrate prepared in Example 135.

On the glass substrate obtained in the above (6), MAM wires were prepared in the same manner as in the above (vii) (4) to complete a touch panel substrate (FIG. 13).

The continuity test of the resulting touch panel substrate was performed. Further, reflection chromaticity, an OD value and adhesiveness of a white cured film area were evaluated.

Example 136

This example was performed in the same manner as in Example 135 except for using the negative-type photosensitive white composition (W-56) in place of the negative-type photosensitive white composition (W-29).

Example 137

Figure 14:
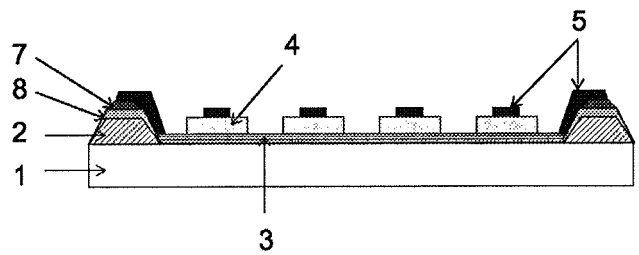
FIG. 14 is a schematic view showing a cross-section of a touch panel substrate prepared in Example 137.

(2) This example was performed in the same manner as in Example 123 except for using the negative-type photosensitive coloring composition (V-1) to form a color adjustment layer in place of the preparation of the transparent resin film (FIG. 14).

Example 138

This example was performed in the same manner as in Example 137 except for using the negative-type photosensitive white composition (W-56) in place of the negative-type photosensitive white composition (W-29).

Example 139

(1) Preparation of Color Adjustment Layer

A glass substrate having a color adjustment layer was prepared in the same manner as in the above (vii) (3) except that the negative-type photosensitive coloring composition (V-2) was used and exposure was performed through a patterned mask equal to the white light-shielding pattern.

(2) Preparation of White Light-Shielding Pattern

A glass substrate having a white light-shielding pattern on the glass substrate obtained in the above (1) was prepared in the same manner as in the above (vii) (1) using the negative-type photosensitive white composition (W-29) obtained in Preparation Example 29.

(3) Preparation of Black Light-Shielding Cured Film

On the glass substrate obtained in the above (2), black light-shielding cured films were prepared in the same manner as in the above (vii) (1) except for using the negative-type photosensitive black composition (Bk-1) obtained in Preparation Example 51 to form a film thickness of 2 μm, performing exposure through a patterned mask smaller than the white light-shielding pattern by 400 μm and using a 0.045% by mass KOH aqueous solution as a developer.

(4) Formation of Patterned ITO

A glass substrate having a patterned ITO having a thickness of 150 nm was prepared in the same manner as in the above (vii) (2) on the glass substrate obtained in the above (3).

(5) Formation of Transparent Insulating Film

A glass substrate having a transparent insulating film was prepared in the same manner as in the above (vii) (3) on the glass substrate obtained in the above (4).

(6) Formation of MAM Wire

Figure 15:
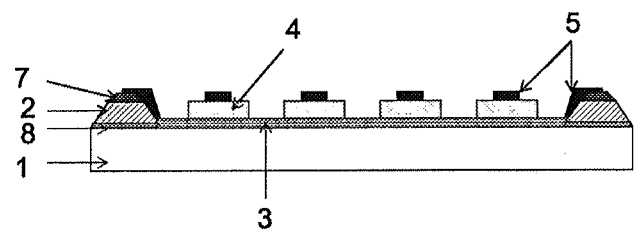
FIG. 15 is a schematic view showing a cross-section of a touch panel substrate prepared in Example 139.

On the glass substrate obtained in the above (5), MAM wires were prepared in the same manner as in the above (vii) (4) to complete a touch panel substrate (FIG. 15).

The continuity test of the resulting touch panel substrate was performed. Further, reflection chromaticity, an OD value and adhesiveness of a white cured film area were evaluated.

Example 140

This example was performed in the same manner as in Example 139 except for using the negative-type photosensitive white composition (W-56) in place of the negative-type photosensitive white composition (W-29).

Evaluation results of Examples 107 to 140 are shown in Table 13.

6: Transparent Film
7: Black light-shielding cured film
8: Color adjustment layer A cured film formed by curing the negative-type photosensitive white composition for a touch panel of the invention is suitably used as a light-shielding pattern of a touch panel or the like.

The invention claimed is:

1. A method for manufacturing a touch panel, comprising a step of forming a white light-shielding cured film pattern by using a negative-type photosensitive white composition for a touch panel comprising (A) a white pigment; (B) an alkali-soluble resin; (C) a polyfunctional monomer; and (D) a photopolymerization initiator, and (E) a thiol compound, wherein (E) the thiol compound is present in an amount ranging from 0.3 to 20 parts by mass with respect to 100

TABLE 13

| | Negative-Type Photosensitive White Composition | Transparent Film | Color Adjustment Layer | Black Composition | Continuity Test | OD Value | Color Characteristics L* | a* | b* | Adhesiveness |
|---|---|---|---|---|---|---|---|---|---|---|
| Example 107 | W-29 | Cr-1 | — | — | good | 0.8 | 86.66 | −1.23 | 1.03 | 5 |
| Example 108 | W-56 | Cr-1 | — | — | good | 0.8 | 86.78 | −1.17 | 0.14 | 5 |
| Example 109 | W-29 | Cr-1 | — | — | good | 0.8 | 86.26 | −1.29 | 1.09 | 5 |
| Example 110 | W-56 | Cr-1 | — | — | good | 0.8 | 86.38 | −1.23 | 0.20 | 5 |
| Example 111 | W-29 | SiO$_2$ | — | — | good | 0.8 | 86.22 | −1.01 | 0.85 | 5 |
| Example 112 | W-56 | SiO$_2$ | — | — | good | 0.8 | 86.34 | −0.95 | −0.14 | 5 |
| Example 113 | W-29 | — | — | Bk-1 | good | 4 | 85.95 | −0.95 | 0.50 | 5 |
| Example 114 | W-56 | — | — | Bk-1 | good | 4 | 86.07 | −0.89 | −0.25 | 5 |
| Example 115 | W-29 | Cr-1 | — | Bk-1 | good | 4 | 85.67 | −1.01 | 0.60 | 5 |
| Example 116 | W-56 | Cr-1 | — | Bk-1 | good | 4 | 85.79 | −0.95 | −0.14 | 5 |
| Example 117 | W-29 | Cr-1 | — | Bk-1 | good | 4 | 85.54 | −0.94 | 0.55 | 5 |
| Example 118 | W-56 | Cr-1 | — | Bk-1 | good | 4 | 85.66 | −0.88 | −0.22 | 5 |
| Example 119 | W-29 | SiO$_2$ | — | Bk-1 | good | 4 | 86.54 | −0.95 | 0.23 | 5 |
| Example 120 | W-56 | SiO$_2$ | — | Bk-1 | good | 4 | 86.66 | −0.89 | −0.76 | 5 |
| Example 121 | W-29 | Cr-1 | — | Bk-1 | good | 4 | 85.94 | −0.88 | 0.58 | 5 |
| Example 122 | W-56 | Cr-1 | — | Bk-1 | good | 4 | 86.06 | −0.82 | −0.41 | 5 |
| Example 123 | W-29 | Cr-1 | — | Bk-1 | good | 4 | 85.45 | −0.82 | 0.52 | 5 |
| Example 124 | W-56 | Cr-1 | — | Bk-1 | good | 4 | 85.57 | −0.76 | −0.47 | 5 |
| Example 125 | W-29 | Cr-1 | — | Bk-1 | good | 4 | 85.96 | −0.89 | 0.54 | 5 |
| Example 126 | W-56 | Cr-1 | — | Bk-1 | good | 4 | 86.08 | −0.83 | −0.45 | 5 |
| Example 127 | W-29/W-29 | — | — | Bk-1 | good | 4 | 86.01 | −1.05 | 0.65 | 5 |
| Example 128 | W-56/W-56 | — | — | Bk-1 | good | 4 | 86.07 | −1.15 | −0.35 | 5 |
| Example 129 | W-29/HW-2 | — | — | Bk-1 | good | 4 | 85.96 | −1.00 | −0.20 | 5 |
| Example 130 | W-56/HW-2 | — | — | Bk-1 | good | 4 | 86.11 | −0.85 | −1.21 | 5 |
| Example 131 | W-29/W-29 | — | — | Bk-1 | good | 4 | 86.24 | −1.09 | 0.62 | 5 |
| Example 132 | W-56/W-56 | — | — | Bk-1 | good | 4 | 86.01 | −0.99 | −0.40 | 5 |
| Example 133 | W-29/HW-2 | — | — | Bk-1 | good | 4 | 85.55 | −0.98 | 0.42 | 5 |
| Example 134 | W-56/HW-2 | — | — | Bk-1 | good | 4 | 85.80 | −0.82 | −0.60 | 5 |
| Example 135 | W-29/HW-2 | — | — | Bk-1 | good | 4 | 86.52 | −0.66 | −1.45 | 5 |
| Example 136 | W-56/HW-2 | — | — | Bk-1 | good | 4 | 86.42 | −0.78 | −1.52 | 5 |
| Example 137 | W-29 | — | V-1 | Bk-1 | good | 4 | 84.42 | 0.63 | −0.56 | 5 |
| Example 138 | W-56 | — | V-1 | Bk-1 | good | 4 | 84.54 | 0.69 | −1.55 | 5 |
| Example 139 | W-29 | — | V-2 | Bk-1 | good | 4 | 83.27 | −0.52 | −0.88 | 5 |
| Example 140 | W-56 | — | V-2 | Bk-1 | good | 4 | 83.39 | −0.46 | −1.87 | 5 |

DESCRIPTION OF REFERENCE SIGNS a: Top view after formation of a white light-shielding cured film
b: Top view after formation of a transparent electrode
c: Top view after formation of an insulating film
d: Top view after formation of a metal wire
1: Glass substrate
2: White light-shielding cured film
2-1: White light-shielding cured film (first layer)
2-2: White light-shielding cured film (second layer)
3: Transparent electrode
4: Transparent insulating film
5: Wire electrode parts by mass of a total of (B) the alkali-soluble resin and (C) the polyfunctional monomer, wherein the step of forming a white light-shielding cured film pattern is repeated n times, and step of forming an nth layer (n is an integer of 2 or more) is a step of forming the nth layer whose line width is wider and thickness is smaller than those of a (n−1)th layer.

2. The method for manufacturing a touch panel according to claim 1, wherein (b-1) a siloxane resin is contained as (B) the alkali-soluble resin.

3. The method for manufacturing a touch panel according to claim 1, wherein (b-2) an acrylic resin is contained as (B) the alkali-soluble resin.

4. The method for manufacturing a touch panel according to claim 1, comprising titanium oxide as (A) the white pigment.

5. The method for manufacturing a touch panel according to claim 1, comprising, as (C) the polyfunctional monomer, a compound having a structure represented by the following general formula (1), and/or a compound having a structure represented by the following general formula (2):

[Chemical Formula 1]

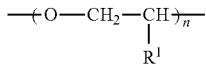

(1)

wherein $R^1$s each independently represent a hydrogen atom, a methyl group, an ethyl group, a propyl group or a phenyl group, and n represents an integer of 1 to 30,

[Chemical Formula 2]

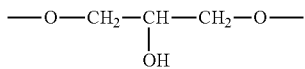

(2)

6. The method for manufacturing a touch panel according to claim 1, comprising an acylphosphine oxide-based photopolymerization initiator as (D) the photopolymerization initiator.

7. The method for manufacturing a touch panel according to claim 1, further comprising (F) an antioxidant.

8. The method for manufacturing a touch panel according to claim 1, further comprising (G) a silane coupling agent represented by the following general formula (3):

[Chemical Formula 3]

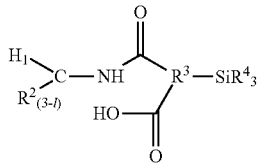

(3)

wherein $R^2$s each independently represent an alkyl group having 1 to 6 carbon atoms or a substituted group thereof, I represents 0 or 1, $R^3$ represents a trivalent organic group having 3 to 30 carbon atoms, and $R^4$s each independently represent an alkyl group having 1 to 6 carbon atoms, an alkoxy group having 1 to 6 carbon atoms, a phenyl group or a phenoxy group, or substituted groups thereof.

9. The method for manufacturing a touch panel according to claim 1, further comprising (H) a ultraviolet absorber.

10. The method for manufacturing a touch panel according to claim 1, further comprising (I) a coloring agent.

11. The method for manufacturing a touch panel according to claim 1, comprising at least one step of forming the white light-shielding cured film pattern, and at least one step of forming a cured film by pattern-printing a non-photosensitive white composition.

12. The method for manufacturing a touch panel according to claim 1, further comprising a step of forming a black light-shielding cured film above the white light-shielding cured film pattern.

13. The method for manufacturing a touch panel according to claim 1, further comprising a step of forming a transparent film above the white light-shielding cured film pattern.

14. The method for manufacturing a touch panel according to claim 1, further comprising a step of forming a color adjustment layer above the white light-shielding cured film pattern.

15. The method for manufacturing a touch panel according to claim 1, further comprising a step of forming a color adjustment layer below the white light-shielding cured film pattern.

16. The method for manufacturing a touch panel according to claim 1, wherein (E) the thiol compound is a polyfunctional thiol.

* * * * *